United States Patent
Yamazaki et al.

(10) Patent No.: US 7,166,863 B2
(45) Date of Patent: Jan. 23, 2007

(54) SEMICONDUCTOR ELEMENT, SEMICONDUCTOR DEVICE, ELECTRONIC DEVICE, TV SET AND DIGITAL CAMERA

(75) Inventors: Shunpei Yamazaki, Setagaya (JP); Kiyoshi Kato, Sagamihara (JP); Atsuo Isobe, Atsugi (JP); Hidekazu Miyairi, Atsugi (JP); Hideomi Suzawa, Atsugi (JP); Yutaka Shionoiri, Isehara (JP); Hiroyuki Miyake, Atsugi (JP)

(73) Assignee: Semiconductor Energy Laboratory Co. Ltd., Kanagawa-ken (JP)

( * ) Notice: Subject to any disclaimer, the term of this patent is extended or adjusted under 35 U.S.C. 154(b) by 0 days.

(21) Appl. No.: 10/941,823

(22) Filed: Sep. 16, 2004

(65) Prior Publication Data

US 2005/0029519 A1 Feb. 10, 2005

Related U.S. Application Data

(62) Division of application No. 10/387,410, filed on Mar. 14, 2003, now Pat. No. 6,847,050.

(30) Foreign Application Priority Data

Mar. 15, 2002 (JP) .............................. 2002-071664
Mar. 22, 2002 (JP) .............................. 2002-080391

(51) Int. Cl.
*H01L 29/04* (2006.01)
*H01L 31/036* (2006.01)
(52) U.S. Cl. ..................... 257/72; 257/59; 257/E27.133
(58) Field of Classification Search ................... 257/59, 257/72, 67
See application file for complete search history.

(56) References Cited

U.S. PATENT DOCUMENTS 4,330,363 A 5/1982 Biegesen et al.

(Continued)

FOREIGN PATENT DOCUMENTS

EP 1 049 144 11/2000

(Continued)

OTHER PUBLICATIONS

H.W. Lam et al., *Characteristics of MOSFETS Fabricated in Laser-Recrystallized Polysilicon Islands with a Retaining Wall Structure on an Insulating Substrate*, IEEE Electron Device Letters, vol. EDL-1, No. 10, Oct. 1980, pp. 206-208.

(Continued)

*Primary Examiner*—Tu-Tu Ho
(74) *Attorney, Agent, or Firm*—Eric J. Robinson; Robinson Intellectual Property Law Office, P.C.

(57) ABSTRACT

A semiconductor element which is capable of operating at a high speed, high in an electric current drive capability, and small in fluctuation among a plurality of elements, and a semiconductor device including the semiconductor element are provided. The semiconductor element has a first crystalline semiconductor region including plural crystal orientations without practically having a grain boundary on an insulating surface, the first crystalline semiconductor region being provided to be jointly connected to a conductive region including the first crystalline semiconductor region and a second crystalline semiconductor region, in which the conductive region is provided astride insulating films extending in a linear stripe pattern.

36 Claims, 38 Drawing Sheets
(1 of 38 Drawing Sheet(s) Filed in Color)

U.S. PATENT DOCUMENTS

| | | | |
|---|---|---|---|
| 4,448,632 A | 5/1984 | Akasaka | |
| 4,710,604 A | 12/1987 | Shirasu et al. | |
| 5,097,297 A | 3/1992 | Nakazawa | |
| 5,145,808 A | 9/1992 | Sameshima et al. | |
| 5,163,220 A | 11/1992 | Zeto et al. | |
| 5,578,897 A | 11/1996 | Nomura et al. | |
| 5,589,406 A | 12/1996 | Kato et al. | |
| 5,594,296 A | 1/1997 | Mitsutake et al. | |
| 5,636,042 A | 6/1997 | Nakamura et al. | |
| 5,643,826 A | 7/1997 | Ohtani et al. | |
| 5,659,329 A | 8/1997 | Yamanobe et al. | |
| 5,759,879 A | 6/1998 | Iwasaki | |
| 5,776,803 A | 7/1998 | Young | |
| 5,841,097 A | 11/1998 | Esaka et al. | |
| 5,847,780 A | 12/1998 | Kim et al. | |
| 5,851,862 A | 12/1998 | Ohtani et al. | |
| 5,854,803 A | 12/1998 | Yamazaki et al. | |
| 5,858,823 A | 1/1999 | Yamazaki et al. | |
| 5,932,893 A | 8/1999 | Miyanaga et al. | |
| 5,953,597 A | 9/1999 | Kusumoto et al. | |
| 5,965,915 A | 10/1999 | Yamazaki et al. | |
| 5,970,368 A | 10/1999 | Sasaki et al. | |
| 5,981,974 A | 11/1999 | Makita | |
| 5,986,306 A | 11/1999 | Nakajima et al. | |
| 5,994,174 A | 11/1999 | Carey et al. | |
| 6,127,702 A | 10/2000 | Yamazaki et al. | |
| 6,133,583 A | 10/2000 | Ohtani et al. | |
| 6,162,667 A | 12/2000 | Funai et al. | |
| 6,184,559 B1 | 2/2001 | Hayakawa et al. | |
| 6,210,996 B1 | 4/2001 | Yamazaki et al. | |
| 6,283,813 B1 | 9/2001 | Kaneko et al. | |
| 6,288,414 B1 | 9/2001 | Ahn | |
| 6,291,320 B1 | 9/2001 | Yamazaki et al. | |
| 6,307,214 B1 | 10/2001 | Ohtani et al. | |
| 6,335,940 B1 | 1/2002 | Ma | |
| 6,337,259 B1 | 1/2002 | Ueda et al. | |
| 6,355,940 B1 | 3/2002 | Koga et al. | |
| 6,365,933 B1 | 4/2002 | Yamazaki et al. | |
| 6,372,562 B1 | 4/2002 | Matsumoto | |
| 6,387,779 B1 | 5/2002 | Yi et al. | |
| 6,388,386 B1 | 5/2002 | Kunii et al. | |
| 6,410,368 B1 | 6/2002 | Kawasaki et al. | |
| 6,424,331 B1 | 7/2002 | Ozawa | |
| 6,429,100 B1 | 8/2002 | Yoneda | |
| 6,455,360 B1 | 9/2002 | Miyasaka | |
| 6,472,684 B1 | 10/2002 | Yamazaki et al. | |
| 6,475,840 B1 | 11/2002 | Miyanaga et al. | |
| 6,482,721 B1 | 11/2002 | Lee | |
| 6,528,397 B1* | 3/2003 | Taketomi et al. | 438/487 |
| 6,555,875 B1 | 4/2003 | Kawasaki et al. | |
| 6,566,179 B1 | 5/2003 | Murley et al. | |
| 6,583,440 B1 | 6/2003 | Yasukawa | |
| 6,602,744 B1 | 8/2003 | Ino et al. | |
| 6,602,758 B1 | 8/2003 | Kizilyalli et al. | |
| 6,632,696 B1 | 10/2003 | Kimura et al. | |
| 6,653,212 B1 | 11/2003 | Yamanaka et al. | |
| 6,667,188 B1 | 12/2003 | Tanabe | |
| 6,674,136 B1 | 1/2004 | Ohtani | |
| 6,700,133 B1 | 3/2004 | Ohtani et al. | |
| 6,727,122 B1 | 4/2004 | Seo et al. | |
| 6,759,628 B1 | 7/2004 | Ino et al. | |
| 6,780,687 B1 | 8/2004 | Nakajima et al. | |
| 6,812,491 B1 | 11/2004 | Kato et al. | |
| 6,841,434 B1 | 1/2005 | Miyairi et al. | |
| 6,841,797 B1 | 1/2005 | Isobe et al. | |
| 6,847,050 B1* | 1/2005 | Yamazaki et al. | 257/59 |
| 6,861,614 B1 | 3/2005 | Tanabe et al. | |
| 6,862,008 B1 | 3/2005 | Yamazaki et al. | |
| 6,875,998 B1* | 4/2005 | Kato et al. | 257/59 |
| 6,884,668 B1 | 4/2005 | Yamazaki et al. | |
| 6,906,343 B1 | 6/2005 | Yamazaki | |
| 6,930,326 B1 | 8/2005 | Kato et al. | |
| 6,933,527 B1 | 8/2005 | Isobe et al. | |
| 2001/0000243 A1 | 4/2001 | Sugano et al. | |
| 2001/0000627 A1 | 5/2001 | Hayakawa et al. | |
| 2001/0015441 A1 | 8/2001 | Kawasaki et al. | |
| 2001/0035526 A1 | 11/2001 | Yamazaki et al. | |
| 2002/0004292 A1 | 1/2002 | Yamazaki et al. | |
| 2002/0008801 A1 | 1/2002 | Fukada et al. | |
| 2002/0047971 A1* | 4/2002 | Kwon et al. | 349/129 |
| 2002/0048864 A1 | 4/2002 | Yamazaki et al. | |
| 2002/0056699 A1* | 5/2002 | Sun et al. | 216/37 |
| 2002/0075208 A1 | 6/2002 | Bae et al. | |
| 2002/0096680 A1 | 7/2002 | Sugano et al. | |
| 2002/0098628 A1 | 7/2002 | Hamada et al. | |
| 2002/0119609 A1 | 8/2002 | Hatano et al. | |
| 2002/0121665 A1 | 9/2002 | Kawasaki et al. | |
| 2002/0134981 A1 | 9/2002 | Nakamura et al. | |
| 2002/0139981 A1* | 10/2002 | Young | 257/72 |
| 2003/0001800 A1 | 1/2003 | Nakajima et al. | |
| 2003/0047732 A1 | 3/2003 | Yamazaki et al. | |
| 2003/0080436 A1 | 5/2003 | Ishikawa | |
| 2003/0128200 A1 | 7/2003 | Yumoto | |
| 2003/0141505 A1 | 7/2003 | Isobe et al. | |
| 2003/0141521 A1 | 7/2003 | Isobe et al. | |
| 2003/0181043 A1 | 9/2003 | Tanada et al. | |
| 2003/0183854 A1 | 10/2003 | Kato et al. | |
| 2003/0183875 A1 | 10/2003 | Isobe et al. | |
| 2003/0186490 A1 | 10/2003 | Kato et al. | |
| 2003/0209710 A1 | 11/2003 | Yamazaki et al. | |
| 2003/0218169 A1 | 11/2003 | Isobe et al. | |
| 2003/0218170 A1 | 11/2003 | Yamazaki et al. | |
| 2003/0218171 A1 | 11/2003 | Isobe et al. | |
| 2003/0218177 A1 | 11/2003 | Yamazaki | |
| 2003/0219935 A1 | 11/2003 | Miyairi et al. | |
| 2003/0230749 A1 | 12/2003 | Isobe et al. | |
| 2003/0230750 A1 | 12/2003 | Koyama et al. | |
| 2004/0016958 A1 | 1/2004 | Kato et al. | |
| 2004/0016967 A1 | 1/2004 | Yamazaki et al. | |
| 2004/0026696 A1 | 2/2004 | Yamazaki et al. | |
| 2004/0063258 A1 | 4/2004 | Kasahara et al. | |
| 2005/0020096 A1 | 1/2005 | Miyairi et al. | |
| 2005/0029518 A1 | 2/2005 | Kato et al. | |
| 2005/0029519 A1 | 2/2005 | Yamazaki et al. | |
| 2005/0098784 A1 | 5/2005 | Isobe et al. | |
| 2005/0136581 A1 | 6/2005 | Kato et al. | |
| 2005/0158936 A1 | 7/2005 | Kato et al. | |
| 2005/0161742 A1 | 7/2005 | Isobe et al. | |
| 2005/0205869 A1 | 9/2005 | Yamazaki et al. | |
| 2005/0227376 A1 | 10/2005 | Yamazaki | |

FOREIGN PATENT DOCUMENTS

| | | |
|---|---|---|
| EP | 1 067 593 | 1/2001 |
| EP | 1 103 946 | 5/2001 |
| JP | 62-104117 | 5/1987 |
| JP | 63-031108 | 2/1988 |
| JP | 06-349735 | 12/1994 |
| JP | 07-130652 | 5/1995 |
| JP | 08-070129 | 3/1996 |
| JP | 08-078329 | 3/1996 |
| JP | 08-195357 | 7/1996 |
| JP | 10-012891 | 1/1998 |
| JP | 10-135468 | 5/1998 |
| JP | 10-135469 | 5/1998 |
| JP | 11-084418 | 3/1999 |
| JP | 11-354442 | 12/1999 |
| JP | 2000-068520 | 3/2000 |
| JP | 2000-349296 | 12/2000 |
| JP | 2001-011085 | 1/2001 |
| JP | 2001-144027 | 5/2001 |
| JP | 2001-196599 | 7/2001 |
| JP | 2001-343933 | 12/2001 |
| JP | 2002-014337 | 1/2002 |

| | | |
|---|---|---|
| JP | 2002-313811 | 10/2002 |
| JP | 2002-324808 | 11/2002 |
| WO | WO 00/63956 | 10/2000 |

OTHER PUBLICATIONS

T. Tsutsui et al., *Electroluminescence in Organic Thin Films*, Photochemical Processes in Organized Molecular Systems, 1991, pp. 437-450.

M.A. Baldo et al., *Highly Efficient Phosphorescent Emission from Organic Electroluminescent Devices*, Letters to Nature, vol. 395, Sep. 10, 1998, pp. 151-154.

M.A. Baldo et al., *Very High-Efficiency Green Organic Light-Emitting Devices Based on Electrophosphorescence*, Applied Physics Letters, vol. 75, No. 1, Jul. 5, 1999, pp. 4-6.

T. Tsutsui et al., *High Quantum Efficiency in Organic Light-Emitting Devices with Iridium-Complex as a Triplet Emissive Center*, Jpn. J. Appl. Phys., vol. 38, Part 2, No. 12B, Dec. 15, 1999, pp. L1502-L1504.

M.W. Geis et al., *Crystalline Silicon on Insulators by Graphoepitaxy*, IEDM 79: Technical Digest of International Electron Devices Meeting, 1979, pp. 210-212.

M.W. Geis et al., *Grapho-Epitaxy of Silicon on Fused Silica Using Surface Micropatterns and Laser Crystallization*, J. Vac. Sci. Technol., vol. 16, No. 6, Nov./Dec. 1979, pp. 1640-1643.

A. Hara et al., *Ultra-High Performance Poly-Si TFTs on a Glass by a Stable Scanning CW Laser Lateral Crystallization*, AM-LCD '01, Digest of Technical Papers, 2001, pp. 227-230.

D.K. Biegelsen et al., *Laser-Induced Crystallization of Silicon Islands on Amorphous Substrates: Multilayer Structures*, Appl. Phys. Lett., vol. 38, No. 3, Feb. 1, 1981, pp. 150-152.

H. Smith et al., *Oriented Crystal Growth on Amorphous Substrates Using Artificial Surface-Relief Gratings*, Appl. Phys. Lett., vol. 32, No. 6, Mar. 15, 1978, pp. 349-350.

M.W. Geis et al., *Crystallographic Orientation of Silicon on an Amorphous Substrate Using an Artificial Surface-Relief Grating and Laser Crystallization*, Appl. Phys. Lett., vol. 35, No. 1, Jul. 1, 1979, pp. 71-74.

M. Kishino et al., *Physics of VLSI Device*, Maruzen Co. Ltd., 1995, pp. 144-146.

Partial European Search Report dated Mar. 8, 2005 for Application No. 02028650.6.

Partial European Search Report dated May 20, 2005 for Application No. 0208650.6.

* cited by examiner

F I G. 4
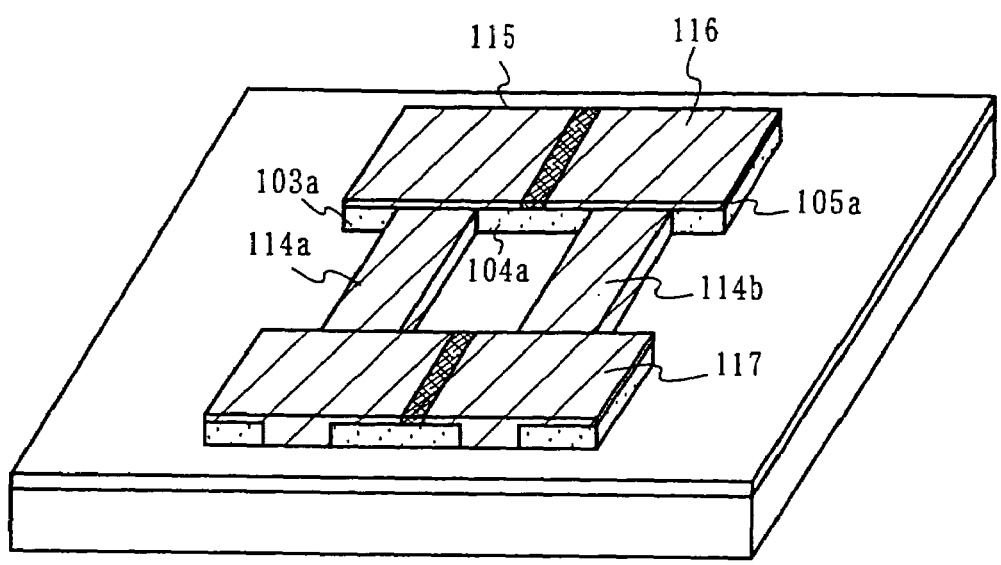

FIG. 6A
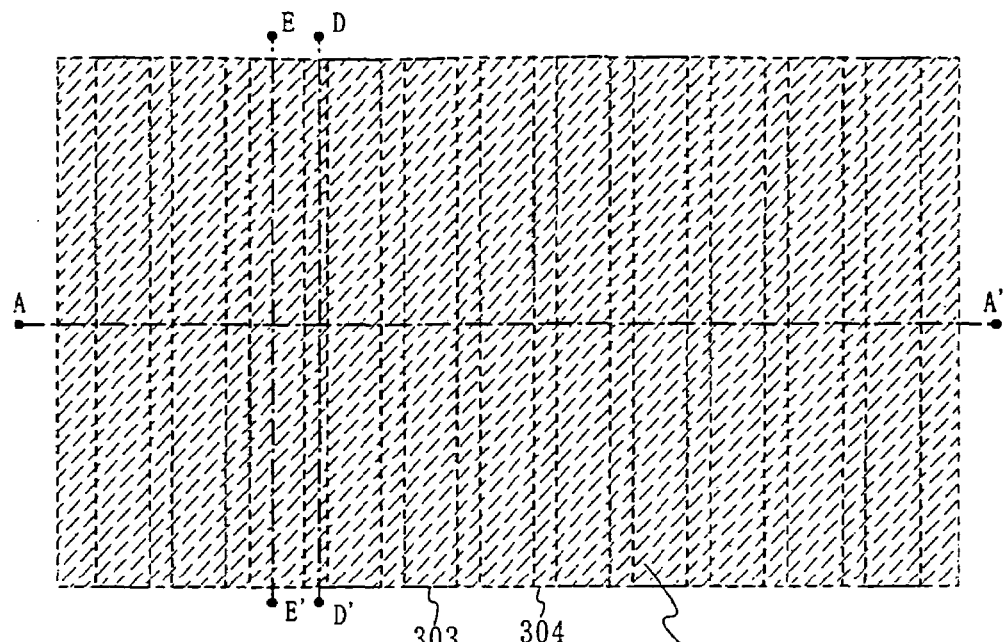
FIG. 6B
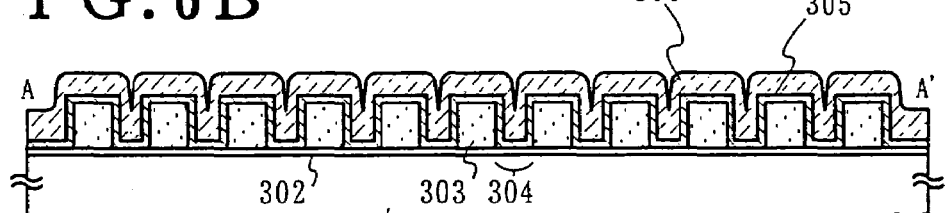
FIG. 6C
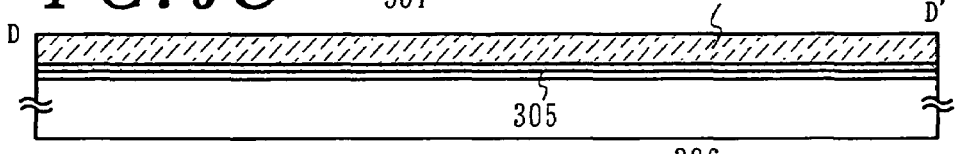
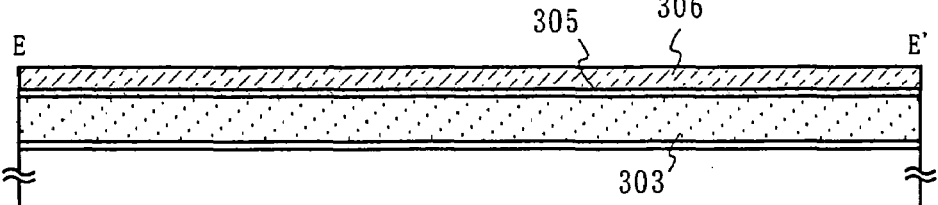
FIG. 6D

307

FIG. 9A
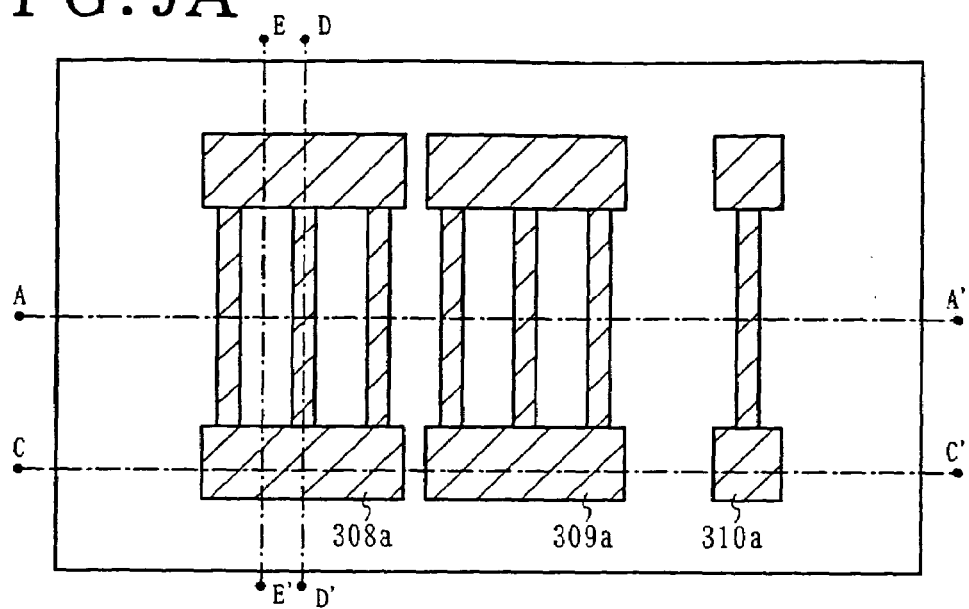
FIG. 9B
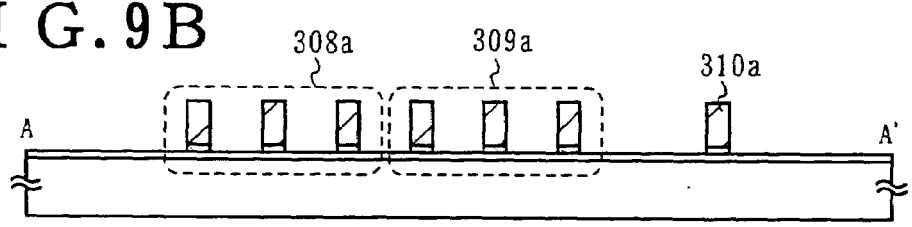
FIG. 9C
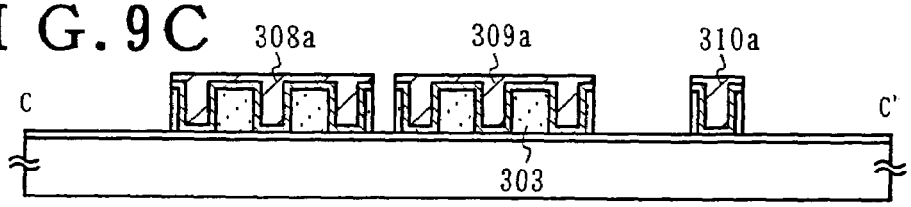
FIG. 9D
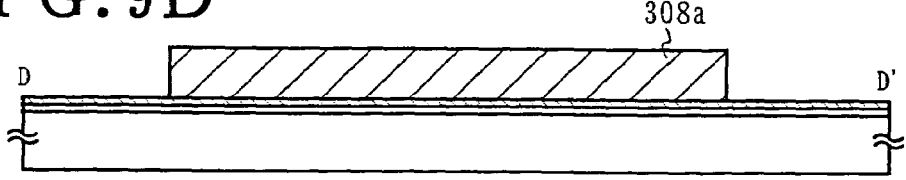
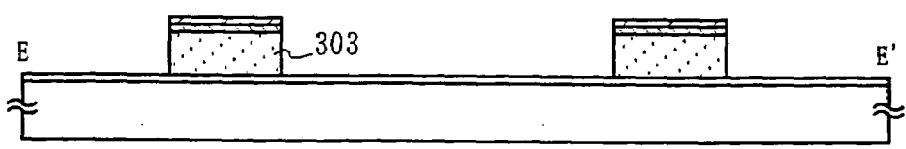
FIG. 9E F I G. 11A
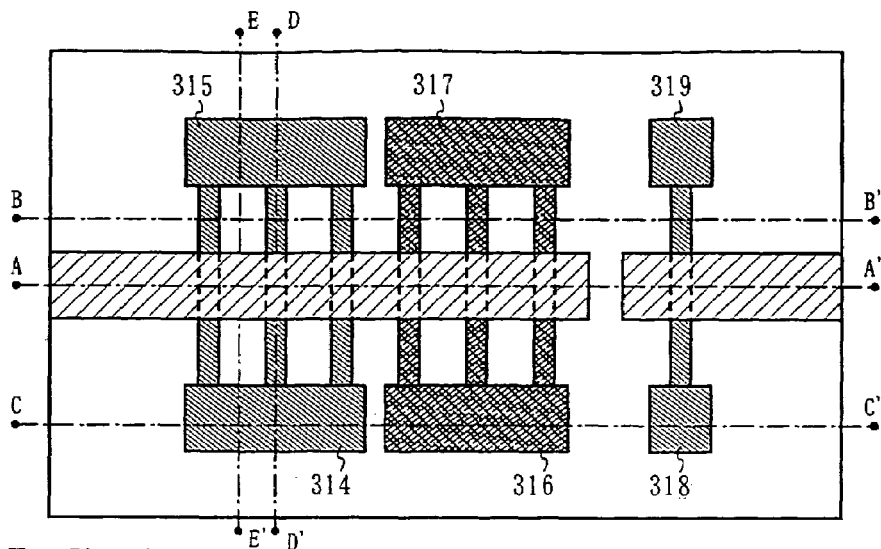
F I G. 11B
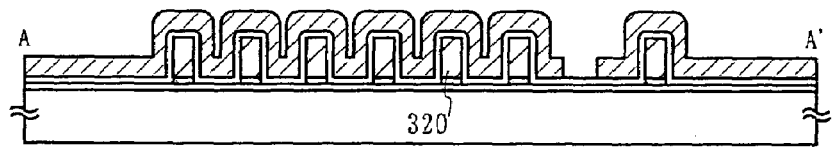
F I G. 11C
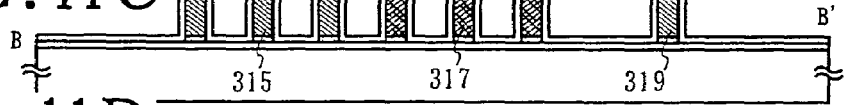
F I G. 11D
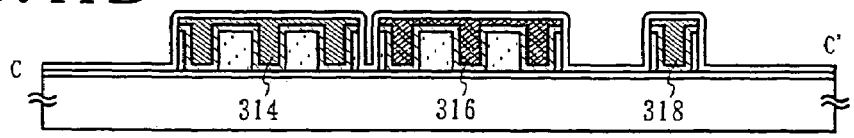
F I G. 11E
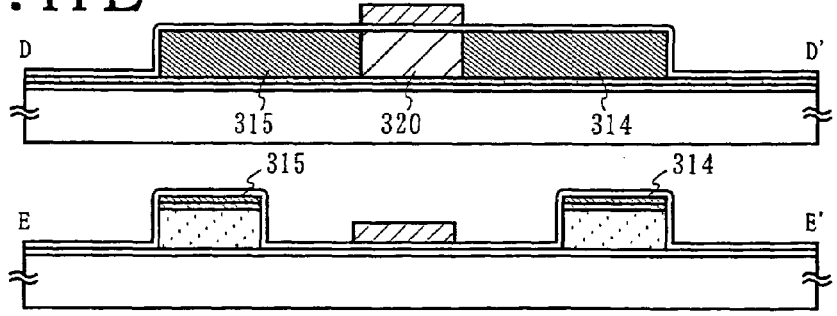
F I G. 11F FIG. 21A
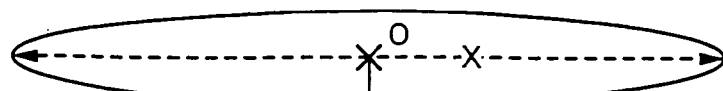
FIG. 21B
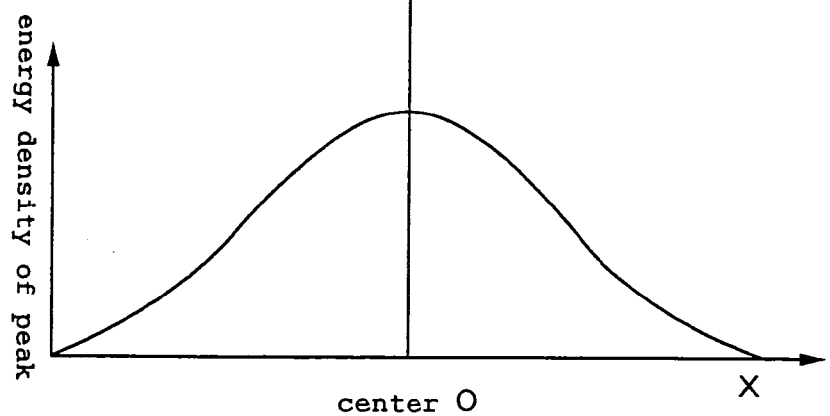
FIG. 21C
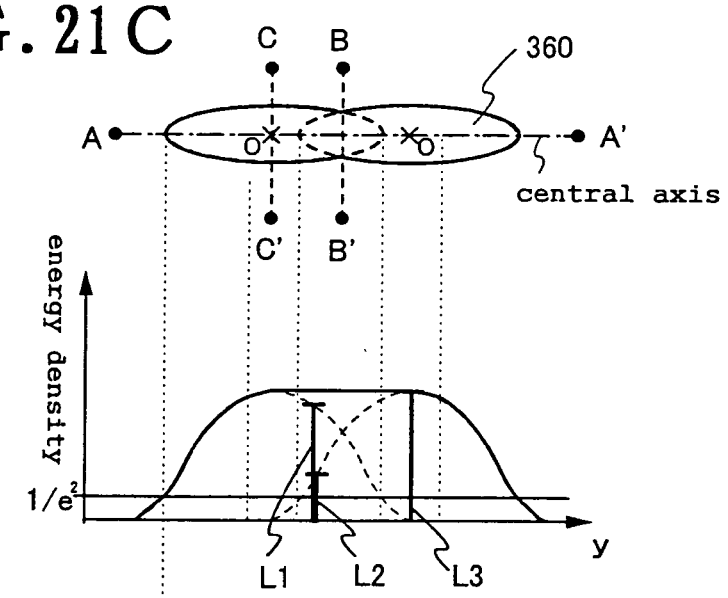
FIG. 21D

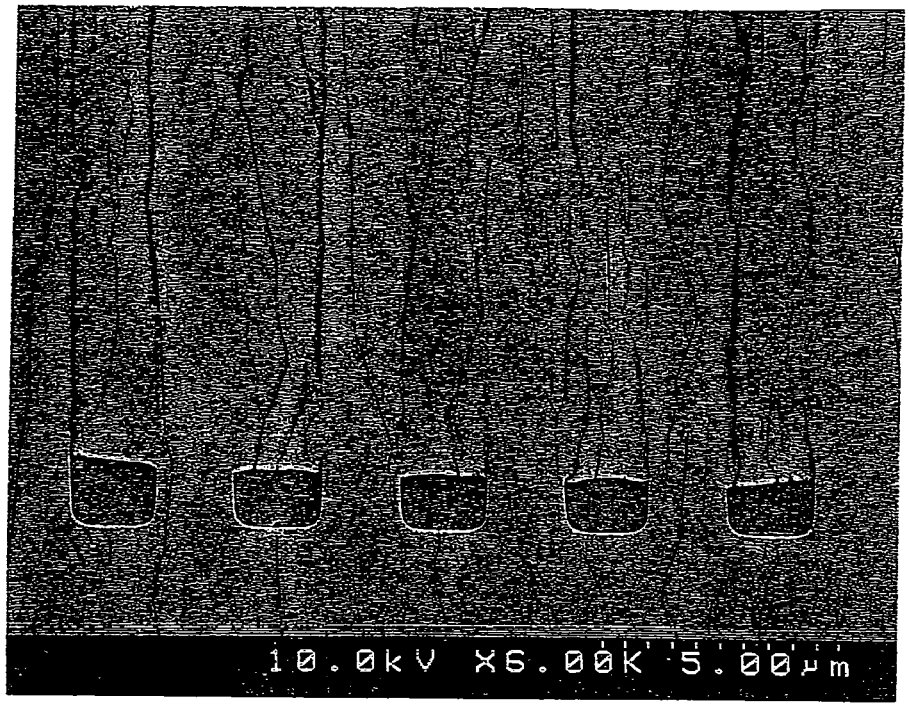
F I G. 23A
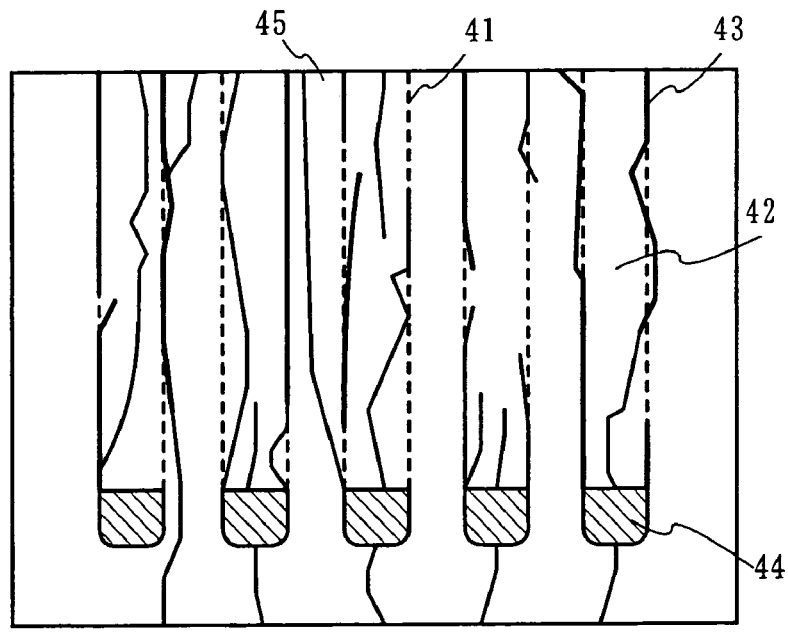
F I G. 23B sample : MA467#12
difference : L/S=0.50/0.50um

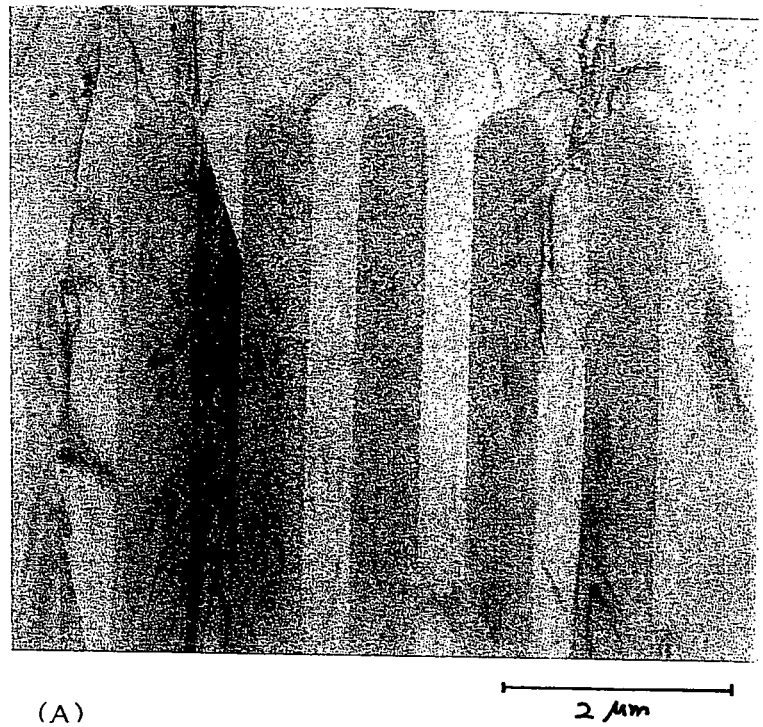
(A)
F I G. 25 A
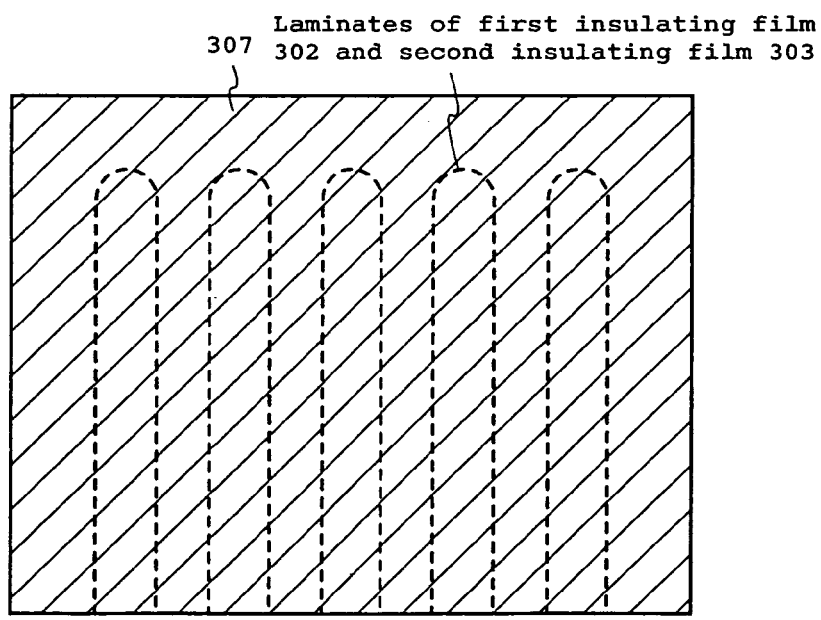
F I G. 25 B

FIG. 32A
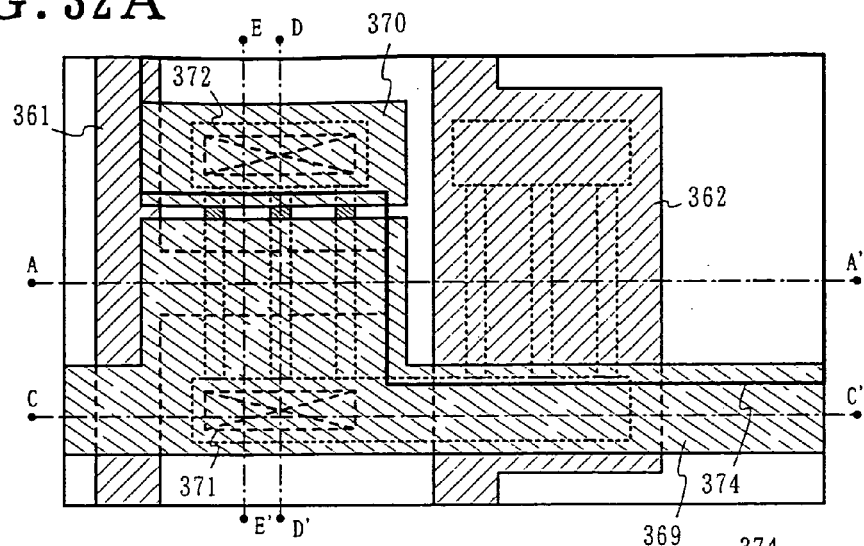
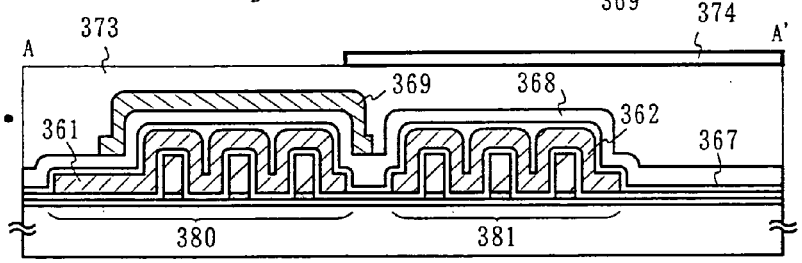
FIG. 32B
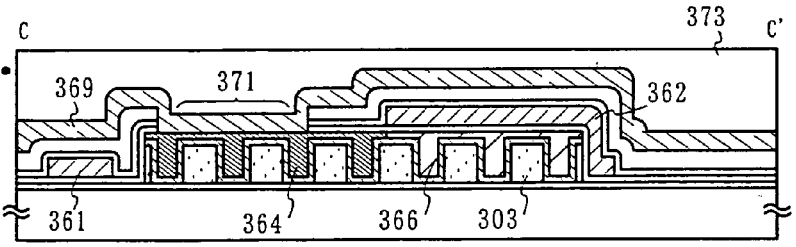
FIG. 32C
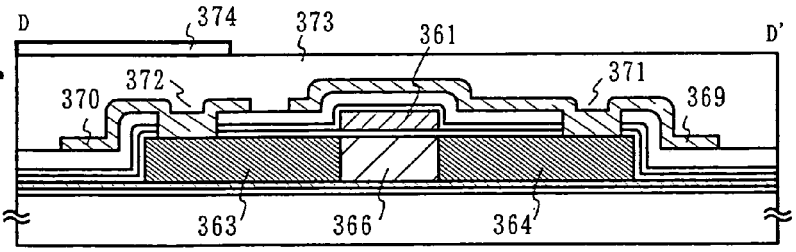
FIG. 32D
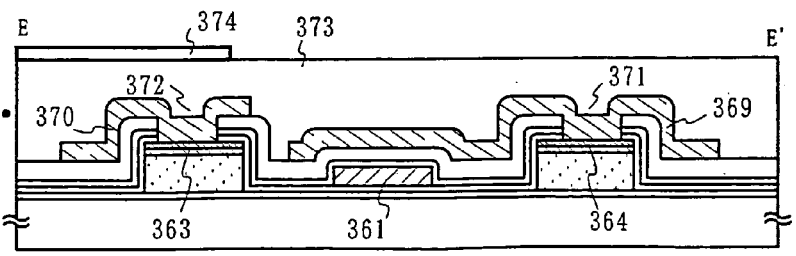
FIG. 32E F I G. 34 A
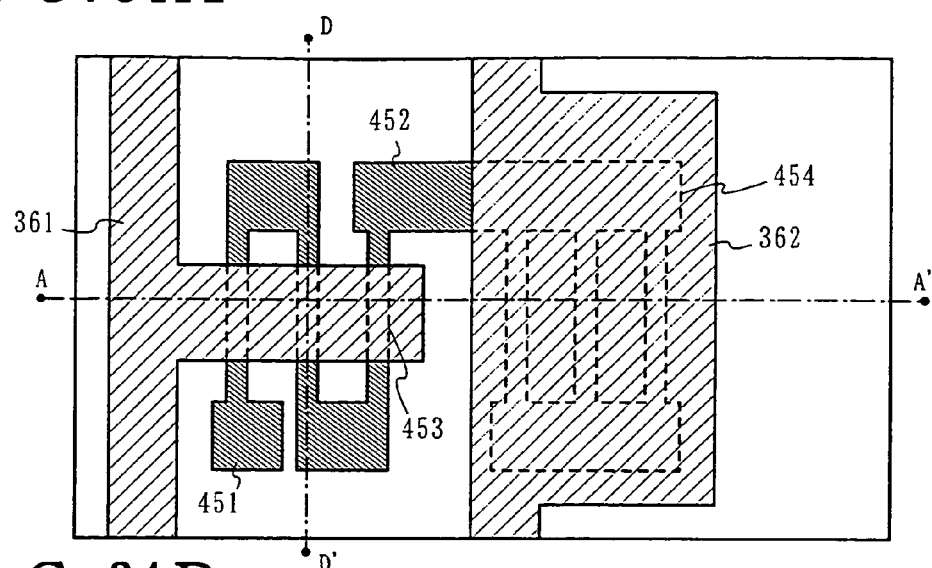
F I G. 34 B
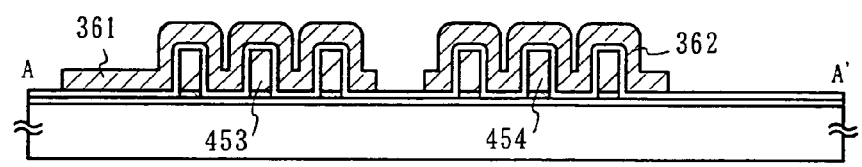
F I G. 34 C
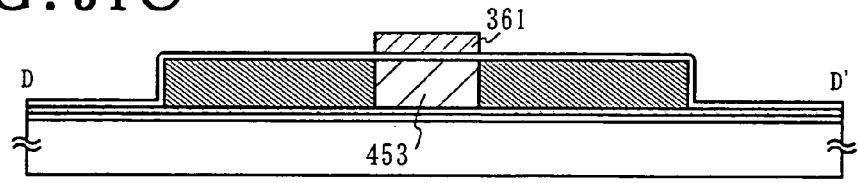

F I G. 37
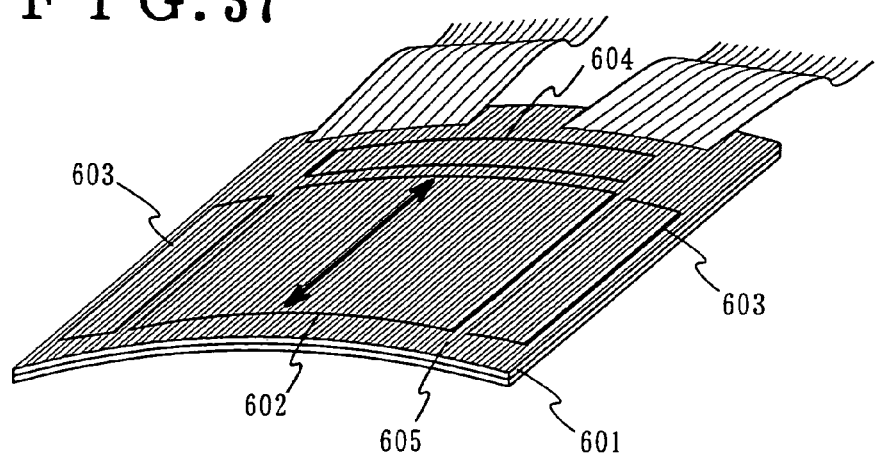

F I G. 39A
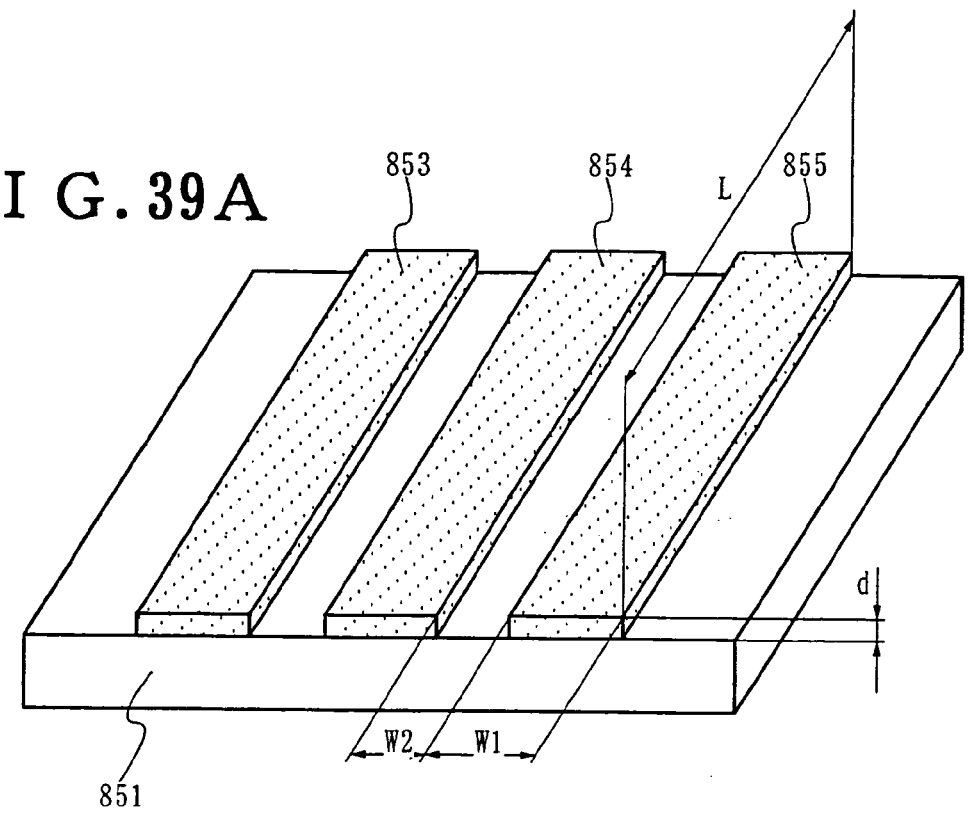
F I G. 39B
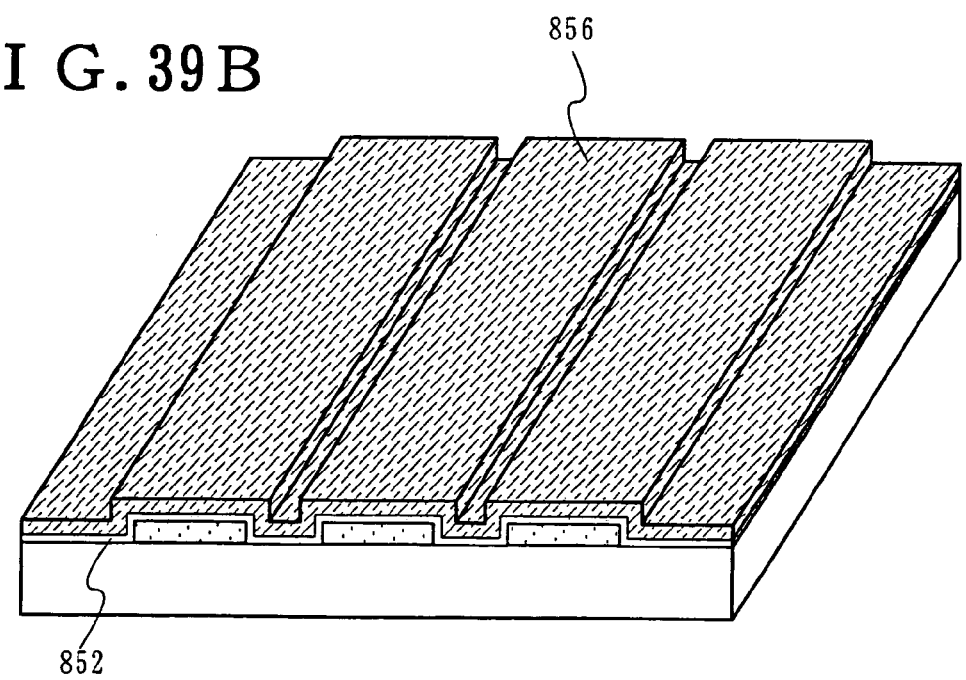

SEMICONDUCTOR ELEMENT, SEMICONDUCTOR DEVICE, ELECTRONIC DEVICE, TV SET AND DIGITAL CAMERA

This is a division of Ser. No. 10/387,410, filed Mar. 14, 2003, now U.S. Pat. No. 6,847,050.

BACKGROUND OF THE INVENTION

The present invention relates to a semiconductor element formed using a semiconductor film having a crystal structure and a method for manufacturing the same, and relates to a semiconductor device having a circuit which integrated the semiconductor element and a method for manufacturing the same. This invention especially relates to a thin film diode or the like using a field-effect transistor (Typically Thin-Film Transistor) and a crystalline semiconductor film.

Technology for forming semiconductor elements such as a transistor by crystallizing an amorphous silicon film that was formed on an insulating substrate of glass or the like is developed. Especially the technology for irradiating laser beams and crystallizing the amorphous silicon film is applied to the manufacture technology of a thin-film transistor (TFT). A transistor produced using semiconductor films (crystalline semiconductor films) with crystal structure is applied to a plane type display device (flat panel display) represented by a crystal display device.

Technology of re-crystallization of a damage layer and an amorphous semiconductor film formed on a semiconductor substrate or semiconductor films and the technology of crystallization of the amorphous semiconductor films formed on the insulating surface is developed by using laser beams in a semiconductor manufacture process. Widely used laser beams for a laser oscillation device applied for this semiconductor manufacture process is represented by a gas laser such as an excimer laser, and a solid-state laser such as a YAG laser.

An example of crystallization of an amorphous semiconductor film by irradiation of laser beams is disclosed in JP-A-62-104117, which proposes a poly-crystallization of the amorphous semiconductor film by high-speed scan with the scanning speed of laser beams set to more than a diameter of beam spot×5000/second, without making the amorphous semiconductor film result in a perfect melting state. In addition, U.S. Pat. No. 4,330,363 discloses a technology to form a single crystal region substantially on a semiconductor film, which is formed in the shape of an island by irradiating the extended laser beams. Or JP-A-8-195357 discloses a crystallization method of an amorphous semiconductor film using such as a laser processing apparatus, which processes a light beam in linear form before irradiation in an optical system.

Further, JP-A-2001-144027 proposes a technology such that crystalline semiconductor films with large grain size are formed by irradiating laser beams of a second harmonic wave onto the amorphous semiconductor films using solid laser oscillation device such as Nd:YVO$_4$ laser. A transistor is thus constituted.

However, when crystallization is made by irradiating the laser beams onto the amorphous semiconductor film formed on the flat surface, the crystal was made into poly-crystals, producing defects such as a grain boundary which was formed improperly. Therefore, crystal orientations without deviation could not be obtained.

Crystal defects are involved in a grain boundary, resulting in a carrier trap. This may be considered as a causative factor that migration degree of electron or holes falls. Also, the semiconductor films with neither deviation nor crystal defects could not be formed due to a volume contraction of the semiconductor films caused by crystallization, thermal stress applied to a ground material, or lattice mismatching. Accordingly, if special methods such as bond-and-etchback SOI (Silicon on Insulator) are excluded, the crystallized or re-crystallized crystalline semiconductor films formed on an insulating surface, could not obtain an equivalent quality to a MOS transistor which is formed on a single crystal substrate.

The above-described flat panel display device and the like have semiconductor films formed on glass substrates to constitute a transistor. However, it was almost impossible to arrange a transistor so as to obviate a grain boundary formed improperly. That is, the grain boundary or crystal defects involved therein unexpectedly could not be eliminated by controlling the crystallinity of the channel formation regions of a transistor strictly. Consequently, this produced a causative factor of not only the inferior electrical property of a transistor, but also variation in each element characteristics.

Especially when crystalline semiconductor films are formed on a non-alkali glass substrate currently used abundantly industrially by using laser beams, the focus of the laser beams varies in response to the influence of the surge of the non-alkali glass substrate itself, involving a problem of causing crystalline variation as a result. Furthermore, in order for a non-alkali glass substrate to avoid contamination by the alkaline metal, it is necessary to prepare protection films such as insulating films, as ground films. And it was almost impossible to form thereon the crystalline semiconductor films with large grain size and with no grain boundary and crystal defects, which were eliminated.

SUMMARY OF THE INVENTION

In view of the above-described problems, object of this invention is to provide a semiconductor device that is formed from semiconductor elements or semiconductor element group that has capabilities of high-speed operation, high current driving, and has little variation among pluralities of elements by forming crystalline semiconductor films having no grain boundary existing at least in channel formation regions that is formed on the insulating substrate, especially on the insulating surface that a glass substrate serves as a support base.

In addition to providing the semiconductor element, another object of the present invention is to provide a semiconductor device in which the semiconductor element and a capacitor element are combined. The capacitor element (condenser) which can hold high-density electric charges requiring a small area is formed on the same substrate.

In order to solve the above-described problems, in this invention an insulating film including depressions or projections extending in linear stripe pattern is formed on a substrate with an insulating surface. And an amorphous semiconductor film is formed on the insulating film. Then a crystalline semiconductor film which was crystallized in such a way that a semiconductor film is melted and poured in a portion corresponding to the depressions of the insulating film (hereinafter, only depressions) is formed. Further, a crystalline semiconductor film which is separated in the shape of an island from the crystalline semiconductor film (serving as a part of the semiconductor elements henceforth) after etching removal of the unnecessary regions is carried out is formed. And a gate insulating film and a gate electrode are provided on the crystalline semiconductor film so that the part to form a channel formation region may serve as a crystalline semiconductor film (hereinafter, a first crystalline semiconductor film) formed on the depressions.

Incidentally, as for the insulating film including depressions and the projections (referred as only projections henceforth), the crystal of the crystalline semiconductor film formed on the projections is inferior compared with the crystalline semiconductor film formed on the depressions. However, in this invention, the crystalline semiconductor films formed on the projections are positively used as an electrode (if it is a thin-film transistor, it is equivalent to a source region or a drain region), or wiring. When using as wiring, since the flexibility of the design about occupancy area is high, adaptation is widened such that wiring length is adjusted to use as resistance, or by assuming a crooked-shaped form it is possible to function as a protection circuit.

Depressions may be formed by direct etching processing over the surface of the insulating substrate, or may be formed by indirect etching processing using silicon oxide, silicon nitride or silicon oxynitride film and carrying out etching processing of those films. Depressions are formed according to a semiconductor element, and the arrangement of the island-shaped semiconductor film including a channel formation region of a transistor especially, and preferably formed in agreement with the channel formation region at least. Moreover, the depressions are provided in an extending manner in the direction of channel length. The width of the depressions (the channel width direction in case of defining as a channel formation region) is formed by 0.01 μm or more and 2 μm or less, or formed by 0.1 μm to 1 μm preferably, and the depth is formed by 0.01 μm or more and 3 μm or less, or 0.1 μm or more and 2 μm or less preferably.

Of course, it is also possible to form an insulating island-shaped film on the insulating surface, and to form projections positively. In this case, since the projections extending in linear stripe patterns adjacently forms the portion corresponding to the depressions relatively. Therefore, the depressions may be formed according to the arrangement of the island-shaped semiconductor film including a channel formation region of a semiconductor element, and the width may be contained in the aforementioned range also.

An amorphous semiconductor film or a poly-crystal semiconductor film formed by plasma CVD method, sputtering method, and low-pressure CVD method, or a poly-crystal semiconductor film formed by a solid phase growth is applied for a semiconductor film which is formed covering from the insulating film to depressions in the first stage. In addition, the amorphous semiconductor film as used in this invention includes not only the film with perfect amorphous structure in a closed meaning but the state where a fine crystal particle is included or the so-called fine crystal semiconductor film, and a semiconductor film including a crystal structure locally are also included. An amorphous silicon film is typically applied, an amorphous silicon germanium film, an amorphous silicon carbide film, and the like can also be applied. Moreover, a poly-crystal semiconductor film is formed by crystallizing these amorphous semiconductor films by using a known method.

The means by which the crystalline semiconductor film is melted and crystallized includes a pulse oscillation defining a gas laser oscillation device or a solid laser oscillation device as a light source, or continuous oscillator laser beams. The laser beams to irradiate are linearly condensed in an optical system, distribution strength has a uniform region in the lengthwise direction, and the laser beams to irradiate may have a distribution in the orthogonal direction also. Rectangular beam solid laser oscillation device is applied for the laser oscillation device used as a light source, and especially slab laser oscillation device is applied preferably. Or the combination of the solid laser oscillation device and a slab structure amplifier may be applied also. The solid laser oscillation device uses a Nd, Tm, and Ho doped rod, or especially uses the Nd, Tm, and Ho doped crystal such as YAG, $YVO_4$, YLF, $YAIO_3$. As a slab material, crystal such as Nd:YAG, Nd:GGG (gadolinium, gallium, garnett), or Nd:GSGG (gadolinium, scandium, gallium, garnett) of GSGG is used. The slab laser proceeds inside of the tabular laser medium by zigzag optical path, repeating all reflections.

Also strong light, which is compliant with above laser beams may be irradiated. Light with high energy density condensing the light emitted from such as a halogen lamp, a xenon lamp, a high pressure mercury-vapor lamp, a metal halide lamp, and an excimer lamp may be exemplified as such light.

Crystallization or re-crystallization is performed through such process that the laser beam or strong light which was linearly condensed and extended in the lengthwise direction is irradiated onto crystalline semiconductor films, and the irradiation position of the laser beams and substrates having the crystalline semiconductor films formed thereon are moved relatively to scan a part or the whole surfaces thereof, to thereby cause the crystalline semiconductor films to be melted. The scanning direction of the laser beams is performed in the lengthwise direction along the depressions formed on the insulating films and extended linearly in stripe pattern, or in the channel length direction of a transistor. By the above, a crystal can grow along the scanning direction of laser beams, and a grain boundary can be prevented from intersecting the channel length direction.

Moreover, irradiation of laser beams is typically performed from the upper surface side of semiconductor films. However, irradiation method can be varied in such a way that irradiation from an undersurface side (substrate side), irradiation from upper surface slant, or irradiation from undersurface slant, or the irradiation from both-sides of the upper surface and the undersurface (the irradiation from slant-is also included) may be performed.

Moreover, as other constitution, crystalline semiconductor films may be provided on the metal layer containing a kind or pluralities of kinds chosen from W, Mo, Ti, Ta, and Cr, on a glass or quartz substrate. An insulating film may be intervened between the metal layer and the crystalline semiconductor film. Or the constitution may be formed in such a way that the metal layer containing a kind or pluralities of kinds chosen from W, Mo, Ti, Ta, and Cr and the insulating film formed out of aluminum nitride or aluminum oxynitride on the metal layer are provided on a glass or quartz substrate, and a crystalline semiconductor film is provided on this insulating film. The metal layer formed here can also be served as a shielding film which shields the light which carries out incidence onto a channel formation region, or can control the spread of a fixed electric charge or depletion layer, by giving a specific potential. Moreover, the metal layer can be served as a heat sink to make a Joule heat diffuse also.

The semiconductor film melted by laser beams or irradiation of strong light, condenses in depressions due to a surface tension and solidified, by setting the depth of the depressions to be comparable as the thickness of the semiconductor film or more. Consequently, the thickness of the semiconductor film formed on the projections of the insulating film can become thin, and can centralize stress deviation there. Moreover, flank side of the depressions specifies a certain level of crystal orientations.

Semiconductor films are condensed with melting state by a surface tension in depressions which is formed on an insulating substrate. Deviation generated with the crystallization can be centralized on regions other than the depressions by carrying out crystal growth from almost intersection of the bottom and the flank side of the depressions. That is, a crystalline semiconductor region (first crystalline semiconductor region) formed so that the depressions may be filled up can be free from deviation. And a crystalline semiconductor region which remains on the insulating film and includes crystal grain boundary and crystal defects (second crystalline semiconductor region) is used for portions other than the channel formation regions of a semiconductor element, and typically used as a source region or a drain region.

And after forming a crystalline semiconductor film having no crystal grain boundary existing thereon, an active layer (semiconductor layer serving as a career migration course) of a semiconductor element is formed by patterning, a gate insulating film which is brought into contact with the active layer is formed, and a gate electrode is formed further. A field-effect transistor can subsequently be formed by the well-known technology.

By specifying a semiconductor element such as a transistor or especially the region where a channel formation region is formed, it becomes possible to form a crystalline semiconductor region having no grain boundary existing therein. By the above, factors of variation in characteristics due to a crystal grain boundary which intervenes improperly or crystal defects, can be eliminated. That is, a semiconductor element or the semiconductor element group that has capabilities of high current driving, high-speed operation, and little variation among pluralities of elements can be achieved.

The depression in no fewer than 0.01 μm to nor more than 2 μm in width, and in no fewer than 0.01 μm to nor more than 3 μm in depth make it possible to form a semiconductor region having high aspect ratio in linear stripe pattern. In the present invention, taking advantage of the characteristics, we use the semiconductor region having high aspect ratio as other electrode of the capacitor element. It makes possible to increase an effective surface area per unit area, then, the capacitance element may have high-density electric charge requiring a small area. Thus, the capacitance element included in the semiconductor device of the present invention is formed from a plurality of the first crystalline semiconductor region provided in parallel, the insulating film covering the plurality of the first crystalline semiconductor region, and wirings opposing to the crystalline semiconductor region by sandwiching the insulating film.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the accompanying drawings:

FIG. 4 is a perspective view illustrating the crystallization method of the present invention;

FIG. 6A is a plan view illustrating a producing process of a transistor of the present invention;

FIGS. 6B to 6D are longitudinal sectional views illustrating the producing process of the transistor of the present invention;

FIG. 9A is a plan view illustrating the producing process of the transistor of the present invention;

FIGS. 9B to 9E are longitudinal sectional views illustrating the producing process of the transistor of the present invention;

FIG. 11A is a plan view illustrating the producing process of the transistor of the present invention;

FIGS. 11B to 11F are longitudinal sectional views illustrating the producing process of the transistor of the present invention;

FIGS. 21A to 21D are graphs showing a constitution of a laser beam used in carrying out the present invention;

FIG. 23A is a TEM photograph of an observation of an upper surface after secondary etching of a crystalline silicon film obtained by carrying out the present invention;

FIG. 23B is a schematic view of the observation of the upper surface after secondary etching of the crystalline silicon film obtained by carrying out the present invention;

FIG. 25A is a TEM photograph of an observation of an upper surface of a crystalline silicon film obtained by carrying out the present invention;

FIG. 25B is a schematic view of the observation of the upper surface of the crystalline silicon film obtained by carrying out the present invention;

FIG. 32A is a plan view illustrating the producing process of the transistor of the present invention;

FIGS. 32B to 32E are longitudinal sectional views illustrating the producing process of the transistor of the present invention;

FIG. 34A is a plan view illustrating the producing process of the transistor of the present invention;

FIGS. 34B and 34C are longitudinal sectional views illustrating the producing process of the transistor of the present invention;

FIG. 37 is a view showing an example of an external view of a semiconductor device of the present invention;

FIGS. 39A and 39B are perspective views illustrating a crystallization method of the present invention.

EMBODIMENT MODES OF THE INVENTION

Embodiment Mode 1

Figure 1A:
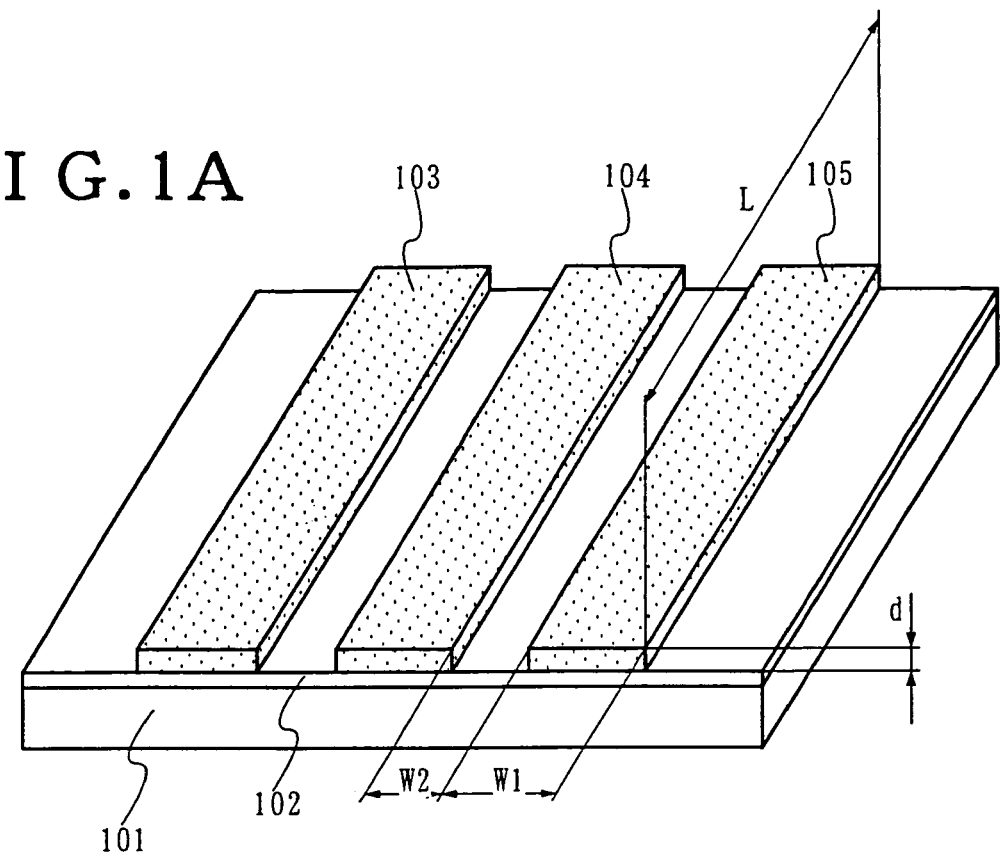
FIGS. 1A and 1B are perspective views illustrating a crystallization method of the present invention.

Aspects of the embodiment of manufacturing method for a thin film transistor using the present invention will be explained in the following with reference to the drawings. The perspective diagram shown in FIG. 1A shows the film formation where first insulating film 102 and second insulating films 103 to 105 formed in linear stripe pattern are formed on substrate 101. Three linear stripe patterns formed by the second insulating film are shown in FIG. 1A. However, the number thereof is not limited to this.

As for substrates, a substrate covering the surface of a commercial non-alkali glass substrate, a quartz substrate, a sapphire substrate, a single crystal, or a poly-crystalline semiconductor substrate with an insulating film, and a substrate covering the surface of a metal board with an insulating film can be applied. For forming a linear stripe pattern with a submicron design rule, it is desirable to set the irregularities on the surface of the substrate, surge or twist of the substrate, to below the focal depth of an exposure apparatus (especially stepper). Specifically, it is desirable for the surge or the twist of the substrate to be Set to 1 μm or less, 0.5 μm or less preferably in one time exposure light irradiation region. In this point, cautions are required when using a non-alkali glass as a support base.

Width W1 of the second insulating film formed in a linear stripe pattern is 0.1 to 10 μm (preferably 0.5 to 1 μm), and the interval W2 with the adjoining second insulating film is 0.01 to 2 μm (preferably 0.1 to 1 μm), and thickness d of the second insulating film is 0.01 to 3 μm (preferably 0.1 to 2 μm). Furthermore, the relation with film thickness t 02 in depressions of the amorphous semiconductor film provided so as to cover the second insulating film is acceptable when d≧t 02. However, since crystalline semiconductor films do not remain on projections when d is too thick compared with t 02, it demands attention.

Moreover, level difference do not need to be a regular periodic pattern, and may be arranged at a different interval according to the width of an island-shaped semiconductor film. The length L is not numerically limited especially, but long formation covering from the end of a substrate to the other end is possible. For example, the length may be set to the extent such that a channel formation region of a transistor can be formed.

It is desirable that materials for a first insulating film 102 can secure a selection ratio with the second insulating film formed later. The first insulating film 102 may typically formed of silicon nitride, silicon oxide, and silicon oxynitride with a bigger oxygen content than a nitrogen content (indicated as SiOxNy.), silicon nitride oxide with a bigger nitrogen content than an oxygen content (indicated as SiNxOy.), aluminum nitride (indicated as AlxNy.), aluminum oxynitride with a bigger oxygen content than a nitrogen content (indicated as AlOxNy), aluminum nitride oxide with a bigger nitrogen content than an oxygen content (indicated as AlNxOy), or the material chosen from the aluminum oxide with thickness of 30 to 300 nm. Especially, since blocking effect of an aluminum oxide film over sodium (Na) is expectable, the first insulating film is effective for measures for pollution control from a glass substrate.

In addition, as a silicon oxynitride (SiOxNy) film, composition ratio is preferred to set from 25 to 35 atomic % of Si, 55 to 65 atom % of oxygen, 1 to 20 atomic % of nitrogen, and 0.1 to 10 atomic % of hydrogen contained therein. Also, a silicon oxynitride (SiNxOy) film where composition ratio is preferred to set from 25 to 35 atomic % of silicon, 15 to 30 atomic % of oxygen, 20 to 35 atomic % of nitrogen, and 15 to 25 atomic % of hydrogen contained therein may be used. Also, an aluminum oxynitride (AlOxNy) film where composition ratio is preferred to set from 30 to 40 atomic % of aluminum, 50 to 70 atomic % of oxygen, and 1 to 20 atomic % of nitrogen contained therein may be used. Moreover, an aluminum oxynitride (AlNxOy) film where composition ratio is preferred to set from 30 to 50 atomic % of aluminum, 30 to 40 atomic % of oxygen, and 10 to 30 atomic % of nitrogen contained therein may be used.

Also, the second insulating films 103 to 105 may be formed of silicon oxide or silicon oxynitride with thickness of 10 to 3000 nm, preferably 100 to 2000 nm. Silicon oxide can be formed by mixing tetraethyl ortho silicate (TEOS) and $O_2$, followed by plasma CVD method. A silicon oxynitride film can be formed by the plasma CVD method, using $SiH_4$, $NH_3$, $N_2O$ or $SiH_4$, and $N_2O$ as materials.

As shown in FIG. 1A, when a linear stripe pattern is formed by the insulating films of two layers, selection ratio is needed to be secured in etching processing between the first insulating film 102 and the second insulating films 103 to 105. In fact, it is preferable to adjust materials and film formation conditions suitably, so that the etching speed of the second insulating films 103 to 105 may become relatively faster than the first insulating film 102. As an etching method, etching using buffer hydrofluoric acid, or dry etching using $CHF_3$ is adopted. And the angle of the flank side of depressions formed on the second insulating films 103 to 105 may be set within 5 to 120°, preferably within 80 to 100°.

In addition, as the second insulating films 103 to 105, it is preferable to use the insulating films formed by CVD method (typically plasma CVD method or thermal CVD method) or PVD method (typically a sputtering method or a deposition method). The reason is that softness of the film is considered to be an important factor for obtaining excellent crystallinity, being capable of easing the stress accompanying crystallization when the amorphous semiconductor film is crystallized. The reason of the above as will hereinafter be described.

Figure 1B:
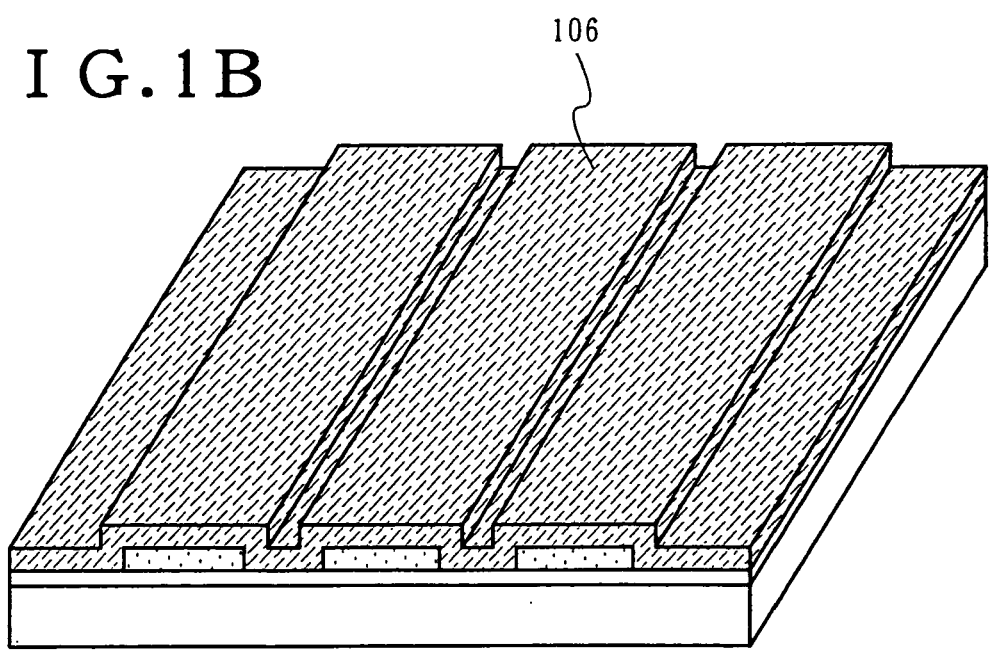

Next, as shown in FIG. 1B, the amorphous semiconductor film 106 which covers over the surface consisting of this first insulating film 102 and the second insulating films 103 to 105 and depressions, is formed in the thickness of 0.01 to 3 µm (preferably 0.1 to 1 µm). The thickness of the amorphous semiconductor film 106 is preferably set to be comparable to the depth of the depressions formed on the second insulating films 103 to 105 or more. Silicon, the compound of silicon and germanium ($Si_xGe_{1-x}$: note, however, that Ge is preferable to be 0.01 to 2 atomic %), or alloy, or the compound of the silicon and carbon or alloy can be adaptable for the amorphous semiconductor films.

As shown in the figure, amorphous semiconductor film 106 is formed to cover the irregular structure formed by the first insulating film 102 and the second insulating film 103 to 105 as a base film. Also, silicon oxynitride film is preferable to be formed continuously without exposing to an atmosphere within the same film formation device as a third insulating film (not shown) immediately before forming the amorphous semiconductor film 106, so as to obviate the influence of chemical pollution, such as boron which is adhered to the surface of the first insulating film 102 and the second insulating films 103 to 105, and moreover, so as to obviate the direct contact of the insulating surface and the amorphous semiconductor film. Film thickness of the third insulating film aims at exclusion of the influence of the chemical pollution, and improvement in adhesive property, and even thin film is effective enough. Typically, thickness of 5 to 50 nm is satisfactory. (For heightening the blocking effect of chemistry contamination, thickness of 20 nm or more is preferable.)

And this amorphous semiconductor film 106 is melted momentarily, then, crystallized. This crystallization is caused by condensing laser beams or radiation beams from a lamp light source into the energy density through optical system to the extent that a semiconductor film melts. In this process, it is preferable to use laser beams radiating from a continuous oscillation laser oscillation device as the light source. The laser beams applied is linearly condensed in the optical system, and longitudinally extended. It is preferable for the distribution strength to have a uniform region in a longitudinal direction, and to secure a certain amount of distribution in an orthogonal direction.

In addition, when crystallization is carried out, the position where a marker used for mask alignment of patterning is formed later such as the edge of the board, is preferably not crystallized. The reason is that the transmissivity of visible light increases, when crystalline semiconductor film (especially crystalline silicon film) is crystallized, causing difficulty in discernment as a marker. However, the problem is not involved in performing alignment control of the type, which optically identifies differences in contrast due to the level difference of the marker.

A rectangular beam solid laser oscillation device is applied for the laser oscillation device, and especially slab laser oscillation device is applied preferably. As a slab material, crystal such as Nd:YAG, Nd:GGG (gadolinium, gallium, garnett), or Nd:GSGG (gadolinium, scandium, gallium, garnett) of GSGG is used. The slab laser proceeds inside of the tabular laser medium by zigzag optical path, repeating all reflection. Or a solid laser oscillation device using Nd, Tm, and Ho doped rod, especially the solid laser oscillation device using the crystal in which Nd, Tm, and Ho is doped to the crystal such as YAG, $YVO_4$, YLF, and $YAlO_3$ may be combined with a slab structure amplifier.

Figure 2A:
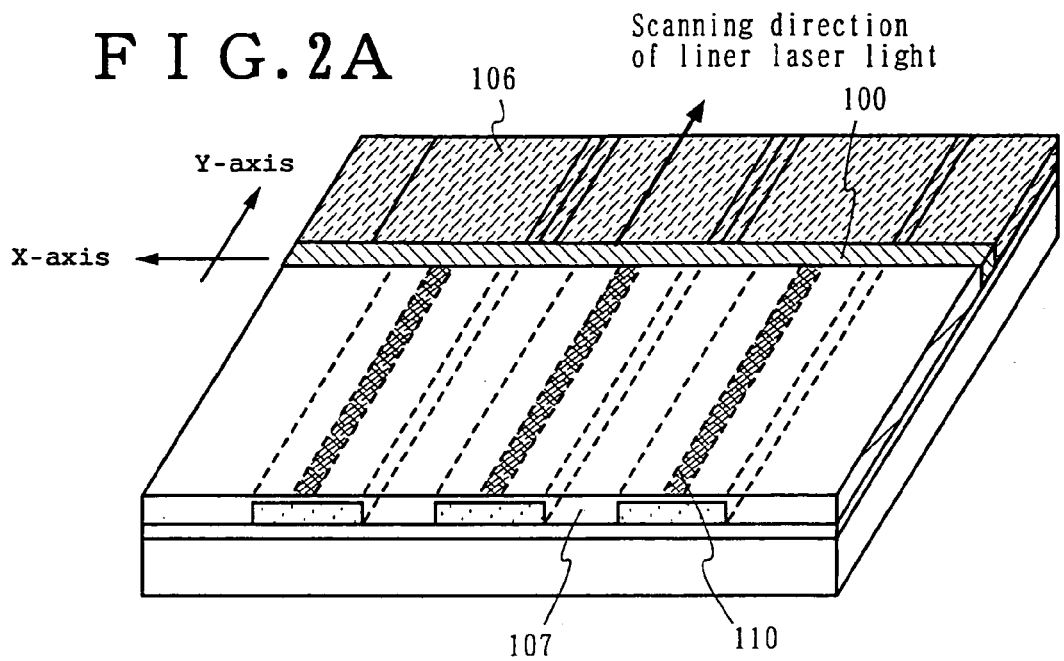
FIGS. 2A and 2B are perspective views illustrating the crystallization method of the present invention.

And as shown by the arrow in FIG. 2A, linear laser beams or linear strong light is scanned so that the longer direction of the irradiation region 100 (X-axis direction in the figure) may be intersected with each of the second insulating films 103 to 105 formed in linear stripe pattern. In addition, linear form as mentioned here refers to the ratio defined in such a way that the ratio of the longitudinal direction (X-axis direction) to the length of the orthogonal direction (Y-axis direction in the figure) is 1 to 10 or more. Moreover, end portion of the irradiation region 100 of the linear laser beams, which is only partially shown in the FIG. 2A, may assume any form either short form or the form with curvature.

Also, the wavelength of continuous oscillation laser beams is preferably set to 400 to 700 nm, in consideration of the optical absorption coefficient of the amorphous semiconductor film. The light of such a wavelength region is obtained by condensing the second harmonic wave of a basic wave and the third harmonic wave using a wavelength conversion element. As a wavelength conversion element, ADP (ammonium dihydrogenphosphate), $Ba_2NaNb_5O_{15}$ (niobium acid barium sodium), CdSe (selenium cadmium), KDP (potassium dihydrogenphosphate), $LiNbO_3$ (niobium acid lithium) and Se, Te, LBO, BBO, $KB_5$, and the like are applied. It is preferable to use LBO especially. Typically, the second harmonic wave (532 nm) of $Nd:YVO_4$ laser oscillation device (fundamental wave with 1064 nm) is applied. Moreover, the oscillation mode of laser employs the single mode of the $TEM_{00}$ mode.

In case of the silicon chosen as a material most suitable for an amorphous semiconductor film, the region where absorption coefficient is $10^3$ to $10^4$ cm$^{-1}$ is in mostly visible region. When a substrate with high visible light transmissivity such as glass, and the amorphous semiconductor film formed with the thickness of 30 to 200 nm by silicon are crystalized by irradiating the light of visible region with a wavelength of 400 to 700 nm, the semiconductor films can be heated alternatively and crystallization is possible without giving a damage to a ground insulating film. Specifically, the invasion length of light with a wavelength of 532 nm is substantially 100 nm to 1000 nm compared with the amorphous silicon film. This is a length enough to reach the inside of the amorphous semiconductor film 106 formed with 30 nm to 200 nm thickness. Namely, heating from the inner side of the semiconductor films is possible and substantially whole surface of the semiconductor films in the irradiation region of laser beams can be uniformly heated.

Laser beams are scanned in the direction parallel to the direction where a linear stripe pattern extends. Surface tension works and the melted semiconductor flows into depressions and is solidified. The surface becomes almost flat with a solidified state as shown in FIG. 2A. This is because the interface of the melted semiconductor and the gaseous phase reaches a balanced state and a flat interface is formed either on projections or depressions when a semiconductor once melts. Furthermore, the growth end and a crystal grain boundary are formed on the second insulating films (on projections) (region 110 shown by hatching in the figure). Crystalline semiconductor film 107 is thus formed.

Then, heat treatment at 500 to 600° C. is performed preferably, so as to remove accumulated deviation on the crystalline semiconductor films. This deviation is generated by volume contraction of a semiconductor caused by crystallization, heat stress with a ground material, and lattice mismatching. This heating process can be satisfied by using the usual heat treatment device. However, 1 to 10 minutes processing may satisfactorily be performed by using the moment heat annealing (RTA) method of a gas heating method. In addition, this process is not obligatory and is selective, in this invention.

Figure 2B:
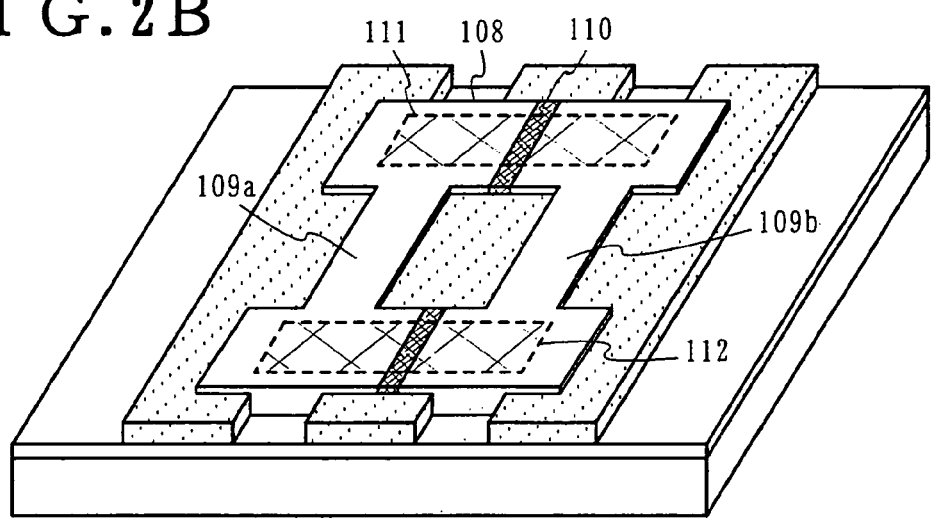

Then, as shown in FIG. 2B, crystalline semiconductor film 107 is subjected to etching and the active layer 108 of a thin-film transistor is formed. At this time, region 110 where a growth end and a crystal grain boundary are concentrated may partially remain. In this invention, by utilizing positively the second crystalline semiconductor regions including region 110 as an electrode such as a source region and a drain region of a thin-film transistor, the design margin of a contact part (region shown by 111 and 112 in FIG. 2B) with the electrode (a source electrode or a drain electrode) which is connected to the source region, the drain region, and each region is secured. Of course, highly crystalline semiconductor regions (first crystalline semiconductor regions) 109a and 109b formed in the depressions are intended to be used as channel formation regions of a thin-film transistor. The highly crystalline semiconductor regions 109a and 109b have characteristics that plural of crystal orientations are included and a crystal grain boundary is not formed.

Figure 3A:
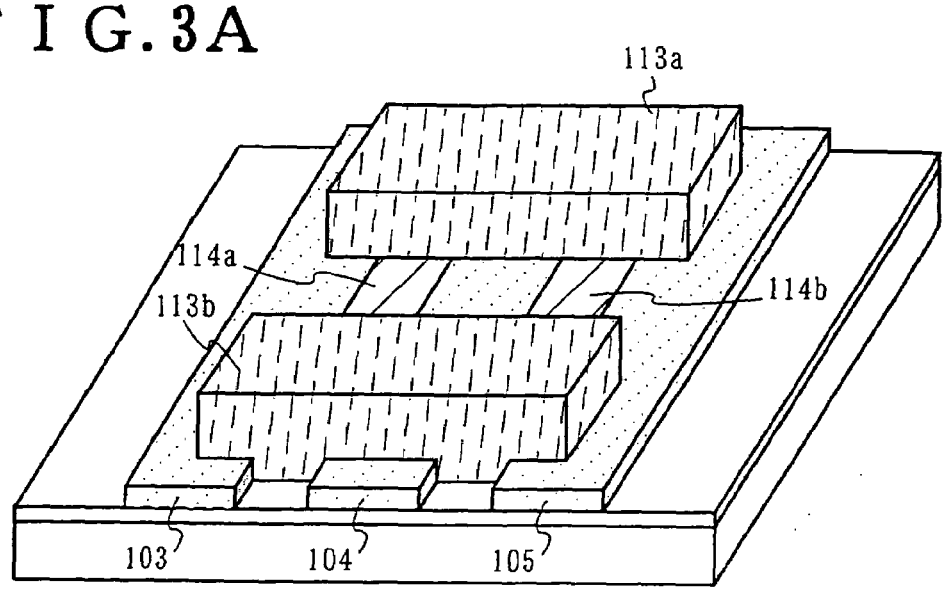
FIGS. 3A and 3B are perspective views illustrating the crystallization method of the present invention.

As shown in FIG. 3A, resist masks 113a, 113b are formed to cover the region that becomes a source region and a drain region in the active layer 108, then, the active layer 108 is etched by a dry etching or wet etching to expose the second insulating films 103 to 105. Further, in the above-mentioned etching process, not only a chemical polishing but also a mechanical polishing such as CMP (chemical mechanical polishing) can be used. The chemical polishing can be used in combination with the mechanical polishing.

According to this process, the first crystal semiconductor region and the second crystal semiconductor region are left having original thickness in the covered portion by the resist masks 113a, 113b. And, the first crystal semiconductor regions 114a, 114b having the same thickness as that of the second insulating films 103 to 105 may be left in the depression portion.

Figure 3B:
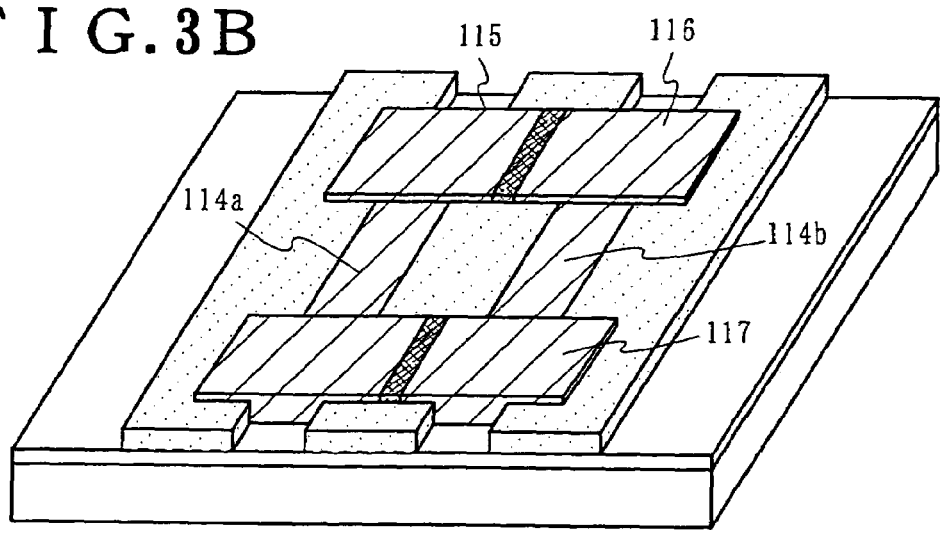

The active layer 115 as shown in FIG. 3B is formed. On the active layer 115, the conductive region (the region that becomes a source region 116 or a drain region 117) having thicker thickness than that of the first crystal semiconductor region (the region that becomes a channel formation region) 114a, 114b is left. According to this embodiment mode, the first crystal semiconductor regions 114a, 114b may be formed in a self-aligning manner by the second insulating films 103 to 105, and it can prevent to form accidentally the channel forming region in the projective portion of the second insulating film due to patterning deviance, and then, it can decrease the situation that the crystal grain boundary is included in the channel formation region.

Next, as shown in FIG. 4, the second insulating films 103 to 105 is etched as using the active layer 115 as a mask. Wet etching and dry etching can be used here. The condition of the selective ratio of the active layer 115 and the second insulating films 103 to 105 may be selected properly by the operator. For example, in the case that a crystal silicon film is used as materials for the active layer 115, and the silicon oxide film is used as materials for the second insulating films 103 to 105, Wet etching using hydrofluoric acid and dry etching using $CHF_3$ gas can be used. Since an isotropic etching is conducted in the case of using the wet. etching, the dry etching is preferred to be conducted.

In addition, the second insulating film 103a, 104a, and 105a formed in a self-aligning manner by the active layer 115 are left underneath the region that becomes the source region (same as the region that becomes the drain region 117). Due to the second insulating film 103a, 104a, and 105a, the region that becomes the source region 116 and the drain region 117 can be kept plane.

When the state shown in FIG. 4 is obtained, a gate insulating film and a gate electrode is formed in order to form the first crystalline semiconductor regions 114a, 114b into a channel formation region. The transistor can be completed through each step in this way.

FIG. 5 is a conceptual diagram showing the knowledge of the crystallization obtained from the experiment result by this inventor. FIG. 5A to FIG. 5E is a schematic diagram showing the relation between the depth and interval of depressions formed by a first insulating film and a second insulating film, and a crystal growth.

In addition, sign and numerals indicating the length shown in FIG. 5 are described as follows:

t01: thickness of the amorphous semiconductor films on the second insulating films (projections);
t02: thickness of the amorphous semiconductor films of depressions;
t11: thickness of the crystalline semiconductor films on the second insulating films (projections);
t12: thickness of the crystalline semiconductor films of depressions;
d: thickness of the second insulating films (depth of depressions);
W1: width of the second insulating film; and
W2: width of depressions.

Figure 5A:
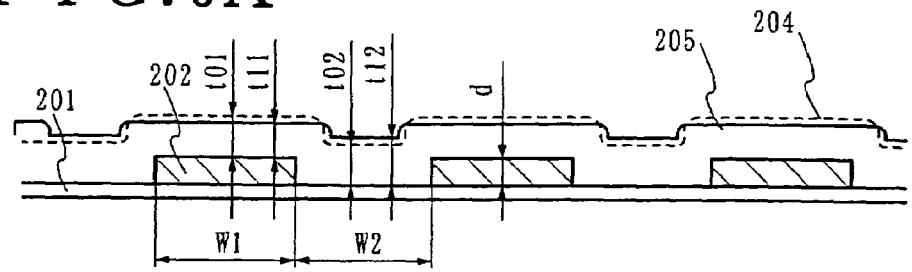
FIGS. 5A to 5E are longitudinal sectional views illustrating a relationship between a shape of an aperture portion in crystallization and a form of a crystalline semiconductor film.

FIG. 5A is a view showing the case where d<t02, W1 and W2 are comparable to 1 μm or less, when the depth of the depressions is smaller than the amorphous semiconductor film 204, since the depressions are shallow even after subjected to the melting crystallization process, the surface of the crystalline semiconductor film 205 is not planarized enough. Namely, the surface state of the crystalline semiconductor film 205 is in the state where the irregular form of a ground material is reflected.

Figure 5B:
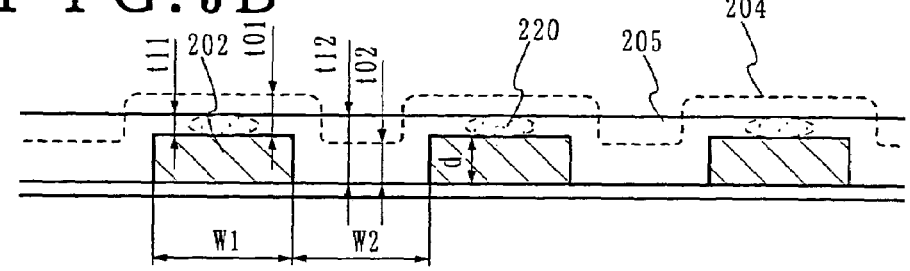

FIG. 5B is a view showing the case where d≧t02, and W1, W2 are comparable to 1 mm or less. In the case where the depth of the depressions almost equal to the amorphous semiconductor film 204 or larger, surface tension works so as to be collected in the depressions. Thereby the surface becomes almost flat as shown in FIG. 5B under solidified state. In this case, it is set to t11<t12, and stress concentrates on the thin part 220 of the second insulating film 202, with the result that deviation is accumulated here and the crystal grain boundary is formed thereon.

The scanning electron microscope (SEM) photograph shown in FIG. 23A shows an example of the state of FIG. 5B. This specifically shows the result that 150 nm amorphous silicon film is formed on the ground insulating film with level difference of 170 nm, having width and interval formed of projections of 0.5 μm, and crystallized. Moreover, the surface of crystalline semiconductor film is subjected to etching (referred as secco etching also) over generally known secco-solution (medical fluid prepared using $K_2Cr_2O_7$ as an additive agent over $HF:H_2O=2:1$) in order to elicit the crystal grain boundary.

The result shown in FIG. 23 shows that potassium dichromate ($K_2Cr_2O_7$) 2.2 g was dissolved in 50 cc of water, so as to prepare the 0.15 mol/l of solution. 100 cc of hydrofluoric acid was added to this solution, and the solution was further diluted with water to five times solution. This solution was used as secco-solution. Moreover, the condition of secco etching was set to 75 seconds at room temperature (10 to 30° C.). In addition, secco-solution or secco etching as referred in this specification indicates the solution as described here or the condition.

FIG. 23B is a schematic diagram of the photograph of FIG. 23A. In this figure, reference numeral 31 denotes an insulating film (a second insulating film) extending in linear stripe pattern. Situation that the crystal grain boundary 33 exposed by secco etching and intensively collected in projection 32 can be seen. In addition, region 34 indicated to be a disappearance portion is a field equivalent to the starting point of the stripe pattern, and the scan of laser beams is started from this starting point. Detailed reason is unknown though, the silicon film formed onto the starting point is put aside in the direction of scanning, and the second insulating film is exposed, which was at the starting point. Since the secco-solution etches a silicon oxide film, the region at the starting point is disappeared by the secco etching.

By the way, in comparison with the photograph shown in FIG. 23A, on the crystalline semiconductor film formed in the depression 35, the crystal grain boundary or defects is not distinctly exposed by secco etching. In other words, it turns out that the crystal grain boundary or the defect does not exist substantially. It is well known that a laminating defect and the crystal grain boundary are preferentially subjected to etching by secco etching. And the crystalline semiconductor film obtained by this invention is characterized to have substantially no crystal grain boundary or defects as being exposed by secco etching.

Of course, since it is not a single crystal, there may naturally be a grain boundary or defects which are not exposed by secco etching. Since such a grain boundary and defects have no influence on the electrical property when forming the semiconductor element, they are considered to be electrically inactive. In general, such an electrically inactive grain boundary is a so-called planate grain boundary (lower or higher twin crystal grain boundary or correlative grain boundary). And it is estimated that the grain boundary which is not exposed by secco etching is a planate grain boundary. From this viewpoint, it may as well describe that the state where the crystal grain boundary or defects do not exist substantially implies that there is no crystal grain boundary except the planate grain boundary.

Also, FIG. 25 shows the result of the orientation of the crystalline semiconductor film formed in depressions 35 shown in FIG. 23B which was obtained by Electron Backscatter diffraction Pattern (EBSP). EBSP having a detector of exclusive use in a scanning electron microscope, is a method to irradiate an electronic beam onto a crystal surface, and carry out the image recognition of the crystal direction identification from the Kikuchi lines by computer. That micro crystallinity is measured in view of not only the surface orientation but all crystal orientations. (The technique is hereinafter referred to as EBSP method for convenience).

Data shown in FIG. 25 shows that the crystal is growing in the direction parallel to the scanning direction of linearly condensed laser beams in depression 35. The preponderance of the crystal orientations of the growth is <110> directions (that is, main orientation is {110} surface), however, there is also the growth in <100> directions.

Figure 5C:
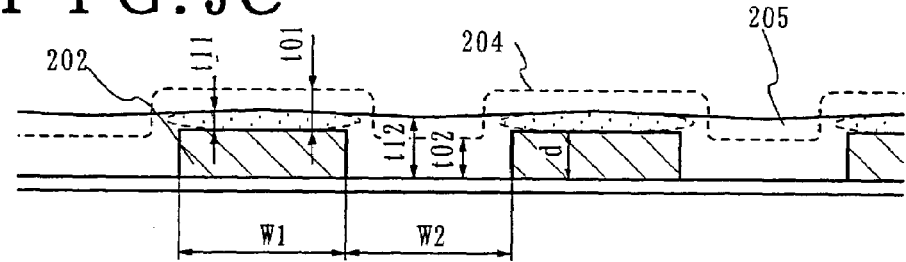

FIG. 5C is a view showing the case where d≧t02 and W1, W2 are comparable to 1 μm or a little larger. When the depressions are widened, the depressions are filled up with crystalline semiconductor film 205, and it may be as a planarization. However, crystal grain boundary occurs near the center of the depressions. Also, stress is concentrated on the second insulating film, then, deviation is accumulated thereon, and then, a crystal grain boundary is formed. It is supposed that it is occurred because of decreasing an effect of stress relaxation due to strengthen the interval. This condition is not preferable, since crystal grain boundary may arise also in a semiconductor region used as a channel formation region.

Figure 5D:
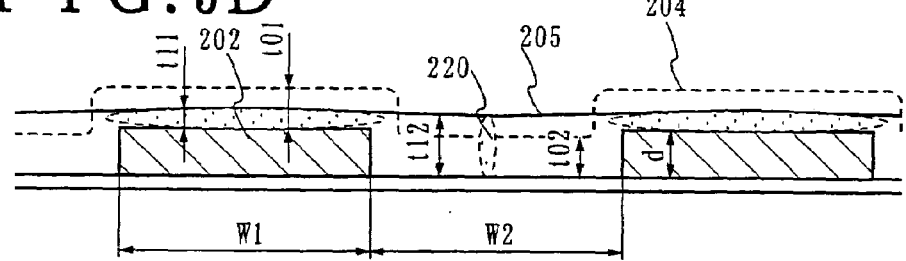

FIG. 5D is a view showing a case where d≧t02 and W1, W2 are larger than 1.0 μm, wherein the state of FIG. 5C becomes further obvious. The current state is not preferable, since it causes the generation of a crystal grain boundary with high probability in a semiconductor region used as a channel formation region.

Figure 24:
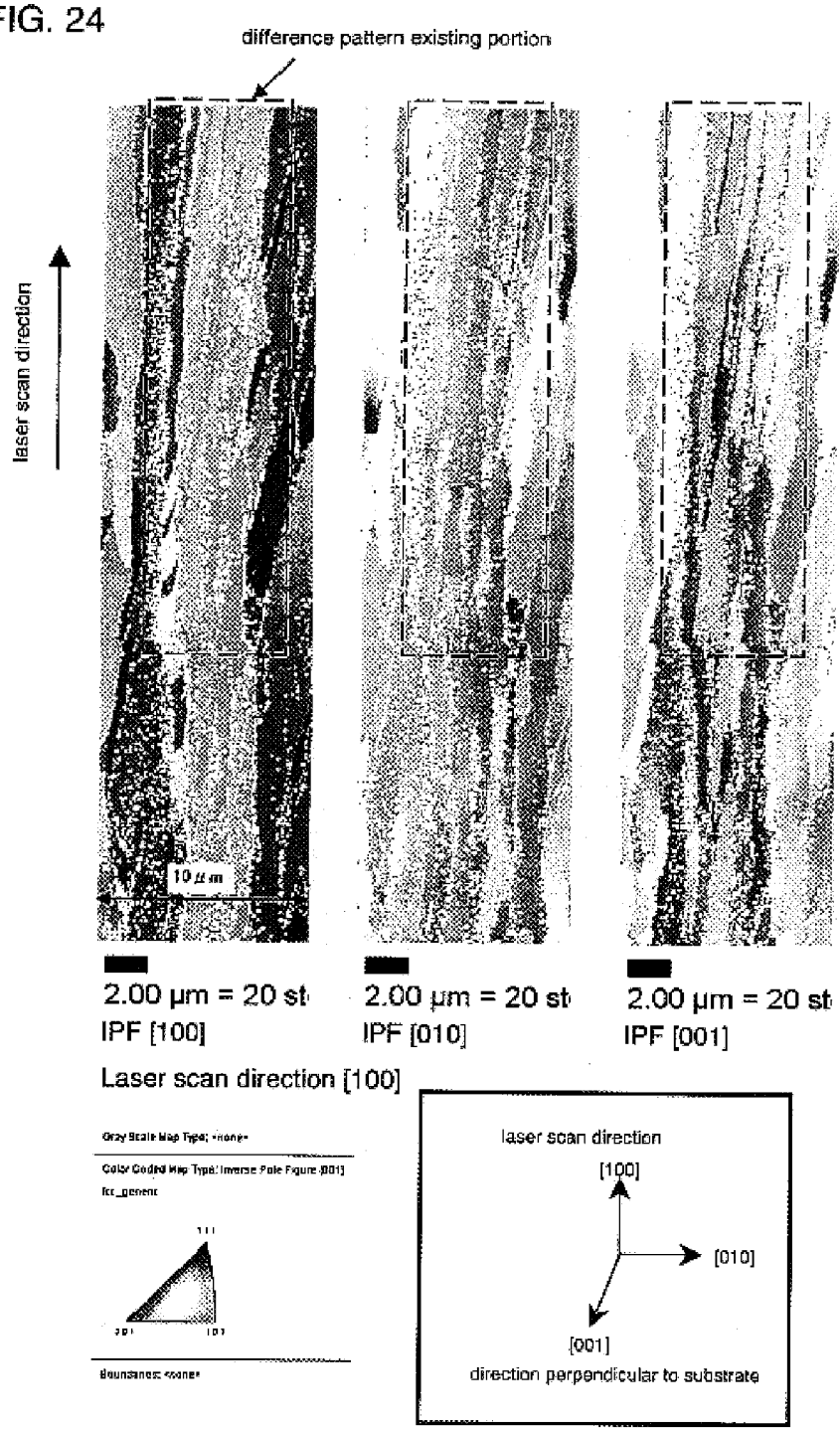
FIG. 24 shows EBSP mapping data showing an orientation of a crystal formed in a recessed portion.

The scanning electron microscope (SEM) photograph shown in FIG. 24A shows an example of the state of FIG. 5D. This specifically shows the result that amorphous silicon film with 150 nm is formed on a base insulating film having a level difference of 170 nm, and projections of 1.8 μm in width and interval, and then, being crystallized. In order to expose the crystal grain boundary, the surface of the crystalline semiconductor film is subjected to etching by using above-mentioned secco solution.

Also, FIG. 24B is a schematic diagram of the photograph of FIG. 24A. In this figure, reference numeral 41 denotes an insulating film (the second insulating film) extending in linear stripe pattern. It can be seen that the crystal grain boundary 43 exposed by secco etching and intensively generated in projection 42. In addition, region 44 described as a disappearance portion is a region corresponding to the starting point of the stripe pattern, and for the above-described reason, disappeared by secco etching. In addition, in comparison with the photograph shown in FIG. 24A, a crystal grain boundary is generated not only in projection 42 in a stripe pattern but also in depression 45.

Figure 5E:
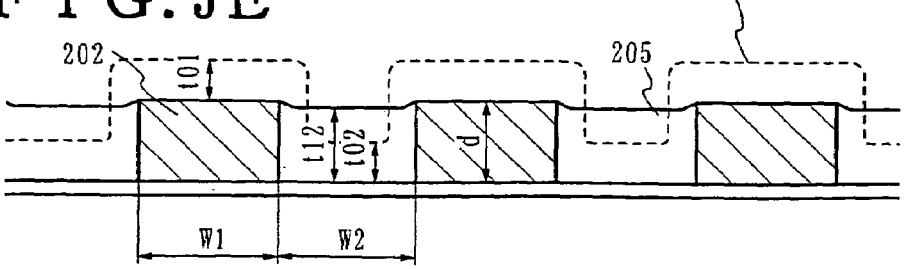

FIG. 5E is a referential example in this invention that shows the case where d>>t 02, and W1, W2 are 1 μm or less. Namely, when thickness d of the second insulating film is too thick in caparison with thickness t02 of the amorphous semiconductor film in depressions, the crystalline semiconductor film 205 is formed to fill up the depressions, and hardly remained on the second insulating film 202. Therefore, the crystalline semiconductor film on the second insulating film cannot be used for a contact portion of a source region and a source electrode (or a drain region and a drain electrode) as in the present invention.

As described above, and as explained using FIG. 5A to FIG. 5D, when a semiconductor element is formed, especially when a channel formation region in a thin-film transistor is formed, the form of FIG. 5B is considered to be most suitable. Namely, when secco etching is subjected by using the secco-solution, it is preferable for channel formation regions to use the crystalline semiconductor film that has hardly crystal grain boundary and a defect, in other words, to use the crystalline semiconductor film that has substantially no crystal grain boundary nor a defect.

An example of forming an irregular form of the base that constitutes the crystalline semiconductor film by using a first insulating film and a second insulating film was shown here. However, it is not limited thereto, and can be substituted with materials having the similar form. For example, an insulating film with thickness of about 200 nm to 2 μm may be subjected to etching in order to form the depressions having the desired depth.

In addition, it can be expected that the effect of relaxation of the stress which is caused by contraction of the semiconductor film at the time of the crystallization process if the second insulating film is a soft insulating film (low density insulating film) as described above. On the contrary, in case of a hard insulating film (high density insulating film), stress occurs so as to oppose the semiconductor film which is contracting or expanding. Therefore, stress deviation is likely to be left in the semiconductor film which has been crystallized, and it leads to a crystal defect. For example, with well-known Graphoepitaxy use ("M. W. Geis, D. C. Flanders, H. I. Smith: Appl. Phys. Lett. 35 (1979) pp. 71"), irregularities on a substrate is directly formed by hard quartz glass. In this case, it becomes clear that orientation axis of crystal Si is a [100] axis, and main orientation axis is {100} surface.

However, when this invention is implemented, as shown in FIG. 25, main orientation (plane that is most existed) is {110}, and it becomes clear that the semiconductor films in different crystal forms are formed. The applicant presumes that the different crystal forms are caused by a soft insulating film on which irregularities are formed by CVD method and PVD method. That is, the generation of stress at the crystallization could be more relaxed, or the stress could be centralized on the crystalline semiconductor film on projections by using softer materials than quartz glass for the second insulating film serving as a base film.

In addition, a softer insulating film than quartz glass is intended to be an insulating films having high etching rate than general quartz glass for example (quartz glass used industrially as a substrate), or an insulating film having low degree of hardness. With respect to the etching rate and the hardness, since it can be decided by relative comparison with quartz glass, it is independent on the measurement conditions of etching rates or the measurement conditions of hardness.

For example, if silicon oxynitride film is used as the second insulating film, it is preferable to use the silicon oxynitride film formed by plasma CVD method using $SiH_4$ gas and $N_2O$ gas as materials. The etching rate of the silicon oxynitride over mixed solution containing 7.13% of ammonium hydrogen fluoride ($NH_4HF_2$) and 15.4% of ammonium fluoride ammonium ($NH_4F$) at 20° C. is 110 to 130 nm/min (500° C., 1 hour+550° C. and 90 to 100 nm/min after heat treatment of 4 hours.)

Also, when a silicon nitride oxide film is used as a second insulating film, plasma CVD method using $SiH_4$ gas ($SiH_4$), $NH_3$ gas, and $N_2O$ gas as materials is preferably chosen as a formation method thereof. The etching rate of the silicon oxynitride over mixed solution containing 7.13% of ammonium hydrogen fluoride ($NH_4HF_2$) and 15.4% of ammonium fluoride ($NH_4F$) at 20° C. is 60 to 70 nm/min (500° C., 1 hour +550° C. and 40 to 50 nm/min after heat treatment for 4 hours.)

As described above, the linear stripe pattern having depressions and projections is formed by an insulating film, and an amorphous semiconductor film is deposited thereon. Then, by irradiating laser beams to cause melting state followed by crystallization, a semiconductor is poured in the depressions and solidified. Thereby, deviation or stress due to crystallization can be centralized on regions except depressions, and the region with bad crystallinity such as crystal grain boundary can be alternatively formed. And a semiconductor region with good crystallinity is used as a region where carrier movement of such as the channel formation region of a thin-film transistor is performed, and a semiconductor region with bad crystallinity is used as a contact part with an electrode.

That is, the crystalline semiconductor film having pluralities of crystal orientations in depressions and pluralities of gathered crystal grains extending in the direction parallel to the direction where linear stripe pattern extends can be formed, without forming a crystal grain boundary. By forming a transistor so that channel formation regions may be arranged by such crystalline semiconductor films, a semiconductor device constituted by a transistor capable of high-speed operation, with high current drive capability and little variation in pluralities of elements or its transistor group can be formed.

Embodiment Mode 2

In a formation of the crystalline semiconductor film of this invention, as shown in Embodiment mode 1, melting recrystallization may be satisfactory by irradiating laser beams further after crystallization by solid phase growth, other than the method which irradiates laser beams onto an amorphous semiconductor film to obtain crystallization.

For example, after amorphous semiconductor film 106 is formed in FIG. 1B, nickel is doped as metallic elements with catalyst action to promote crystallization in such a way that crystallization temperature of the amorphous semiconductor film (for example, amorphous silicon film) is lowered, and orientation quality is raised.

This technology is detailed in JP-A-11-354442 by this applicant. The crystalline semiconductor film formed by doping nickel defines the main orientation as surface {110}. If such crystalline semiconductor films are used for the channel formation regions of a thin-film transistor, both electronic degree of movement and hole degree of movement improve significantly, with the result that degree of electric field effect movement of a N channel transistor and a P channel transistor improve as well. Especially improvement in the electric field effect of the P channel transistor accompanying improvement in the hole degree movement is highly important. This is one of the advantages in setting main orientation surface to {110}.

Moreover, the method of doping nickel has no limitation, such as spin coating method, deposition method, and sputtering method can be applied. When the spin coating is used, 5 ppm solution of acetic acid nickel salt is coated to form a metallic-elements content layer. Of course, a catalyst element is not limited to nickel but other well-known material may be used.

Then, amorphous semiconductor film 106 is crystallized by heat treatment for 4 hours at 580° C. Laser beams or a strong light equivalent to the laser beams is irradiated onto this crystallized semiconductor film in order to be melted, then, re-crystallization is performed. In this way, the crystalline semiconductor with substantially planarized surface can be obtained in a similar manner as shown in FIG. 2A. A region having growth end or crystal grain boundary 110 is formed on the crystalline semiconductor film in the same way.

The advantage of using a crystallized semiconductor film as an irradiating object by laser beams is the variation ratio of the optical absorption coefficient of the semiconductor film. Even if laser beams are irradiated onto the crystallized semiconductor film to be melted, an optical absorption coefficient is hardly changed. Therefore, a large margin of laser irradiation conditions can be obtained.

In this way, metallic elements remain on the formed crystalline semiconductor film, but can be removed by gettering. For the detailed technology, refer to Patent Application No. 2001-019367 (or Patent Application No. 2002-020801). Moreover, the heat-treatment due to the gettering also has the effect of reducing deviations of the crystalline semiconductor film.

Then, as in the case with Embodiment mode 1, a thin-film transistor that uses a crystalline semiconductor film of depressions as a channel formation region, and that uses a crystalline semiconductor film of projections as a source region or a drain region is formed. The crystalline semiconductor films of depressions is characterized in that a plurality of crystal orientations are included, and grain boundary is not formed thereon. Therefore, a semiconductor device that is constituted by a transistor or a group of the transistors that is capable of driving at high-speed, has high current driving capability, and has little variations among pluralities of elements.

Embodiment Mode 3

Next, one mode of manufacturing a transistor will be explained with reference to the drawings. This transistor includes a crystalline silicon film formed on a base insulating film having depressions and a channel formation region arranged in the semiconductor region which is formed in the depressions. In addition, in each drawing of this embodiment mode, A is a top view and subsequent B is a longitudinal cross section showing each part corresponding to A.

In FIGS. 6A–D, first insulating film 302 consisting of 30 to 300 nm silicon nitride, silicon oxynitride with a bigger nitrogen content than an oxygen content, aluminum nitride, or aluminum oxynitride is formed on glass substrate 301. Linear stripe pattern having depressions and projections on the first insulating film 302 is formed by the second insulating film 303 made from silicon oxide or silicon oxynitride. The silicon oxide is subjected to plasma CVD method, wherein TEOS and $O_2$ are mixed, the reaction pressure of 40 Pa and the substrate temperature of 400° C. are set, so as to be discharged with high frequency (13.56 MHz), electric power density 0.6 $W/cm_2$, deposing in 10 to 3000 nm, more preferably in 100 to 2000 nm. Then depression 304 is formed by etching. In the place where a channel formation region is arranged especially, the depressions are formed with width setting to 0.01 to 1 μm, preferably 0.05 to 0.2 μm.

Next, the third insulating film 305 consisting of oxidation film and silicon oxynitride film, and the amorphous silicon film 306 are formed continuously on the first insulating film 302 and the second insulating film 303 using the same plasma CVD apparatus and without exposing to an atmosphere. The amorphous silicon film 305 is formed by the semiconductor film containing silicon as the main composition, and formed by the plasma CVD method using $SiH_4$ as material gas. In this stage, as shown in FIG. 6B, the uneven surface is formed by covering the bottom and the flank side of depression 304.

A crystallization is performed by irradiating continuous oscillator laser beams. The state after the crystallization is shown in FIGS. 7A–D. Conditions of crystallization is determined in such a way that using the $YVO_4$ laser oscillator of continuous oscillation mode, in an optical system, outputs 5 to 10 W of the second harmonic wave (wavelength 532) are condensed in linear laser beams setting longitudinal ratio to an orthogonal direction as 10 or more, or condensed so that uniform energy density distribution may be obtained in the lengthwise direction. This causes crystallization, scanning at a rate of 5 to 200 cm/sec. The uniform energy density distribution is not intended to eliminate all but a completely fixed one. The range permitted in the energy density distribution is ±10%.

As for the strength distribution of the laser beams linearly condensed, it is preferable that the strength distribution is longitudinally uniform (in the X-axis direction in FIG. 2A). This is for obtaining a uniform temperature of the semiconductor to be heated over the whole surface of the irradiation region of the laser beams. If a temperature distribution arises in the X-axes direction of the linearly condensed laser beams, it becomes impossible to specify the direction of crystal growth of a semiconductor film in the scanning direction of the laser beams. By arranging a linear stripe pattern so as to be united with the scanning direction of the irradiation region of the linearly condensed laser beams, the growth direction of a crystal and the direction of channel length of all transistors can be united. According to this, variations in pluralities of elements of a transistor can be made reduced.

Also, crystallization by the linearly condensed laser beams may be completed by only one scan (namely, one direction), or both-way scan may be performed in order to raise crystallinity more. Furthermore, after crystallization by laser beams, the surface of a silicon film is processed with alkali solution, such as oxide removal by such as hydrofluoric acid or ammonia hydrogen peroxide solution processing, portion of bad quality with a quick etching speed is removed alternatively, and same crystallization processing may be performed again. Thus, crystallinity can be raised.

Figure 7A:
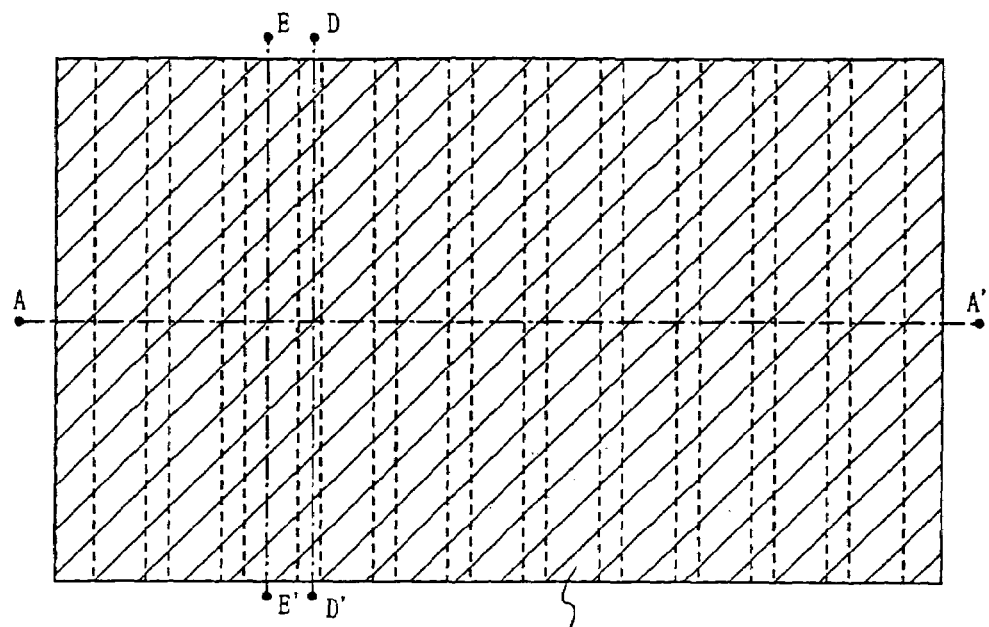
FIG. 7A is a plan view illustrating the producing process of the transistor of the present invention.
Figure 7B:
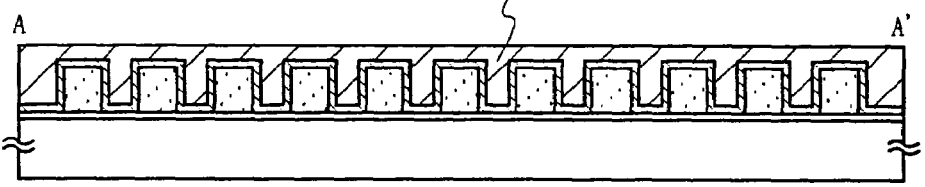
FIGS. 7B to 7D are longitudinal sectional views illustrating the producing process of the transistor of the present invention.
Figure 7C:
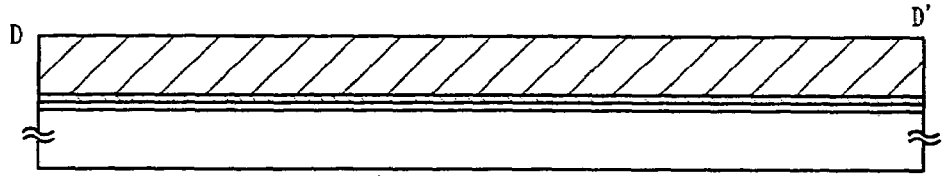
Figure 7D:
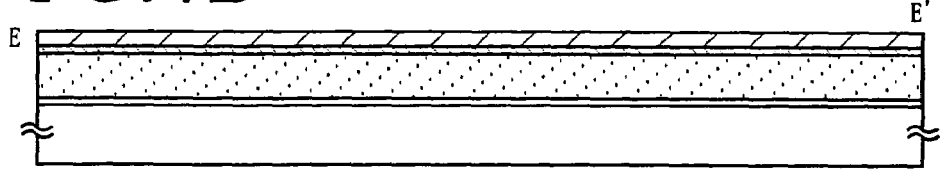
Figure 8A:
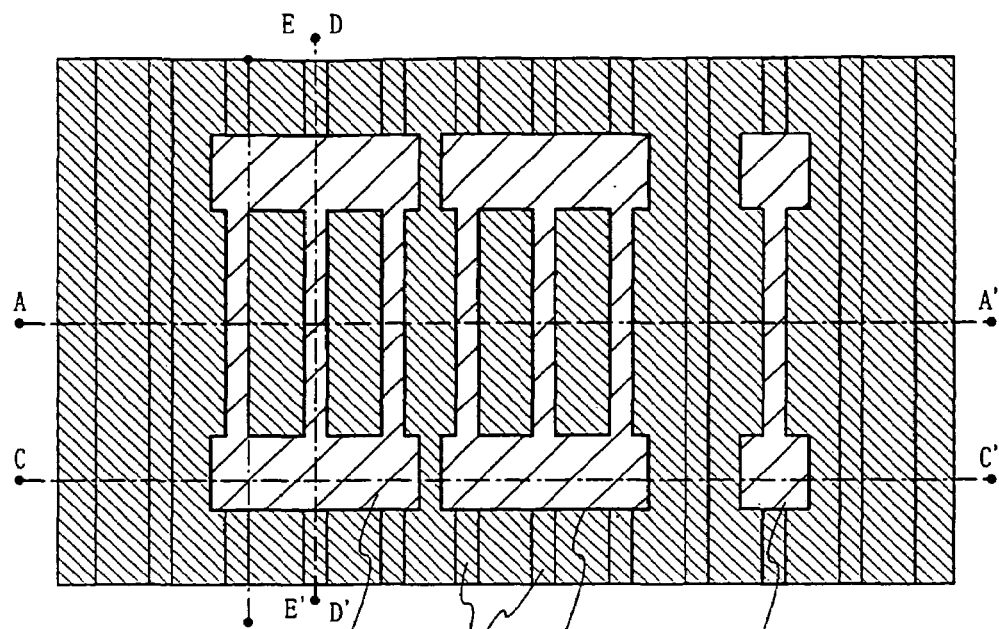
FIG. 8A is a plan view illustrating the producing process of the transistor of the present invention.
Figure 8B:
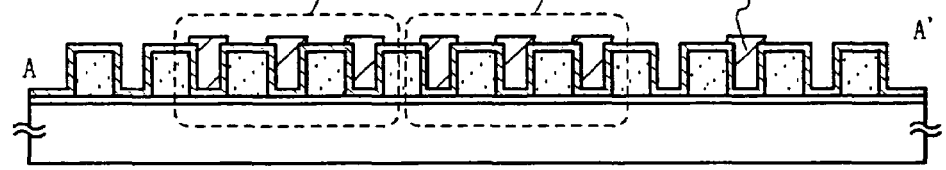
FIGS. 8B to 8E are longitudinal sectional views illustrating the producing process of the transistor of the present invention.
Figure 8C:
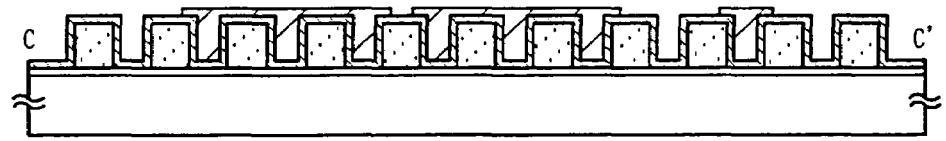
Figure 8D:
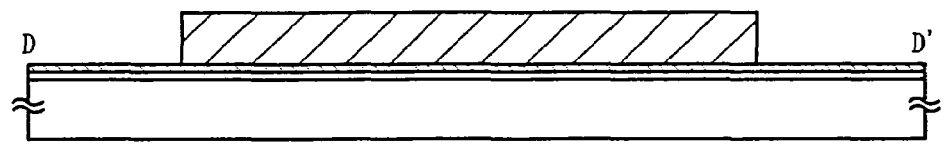
Figure 8E:
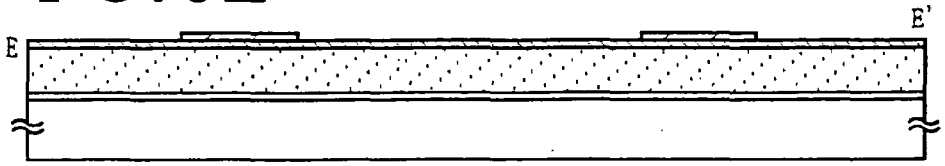
Figure 10A:
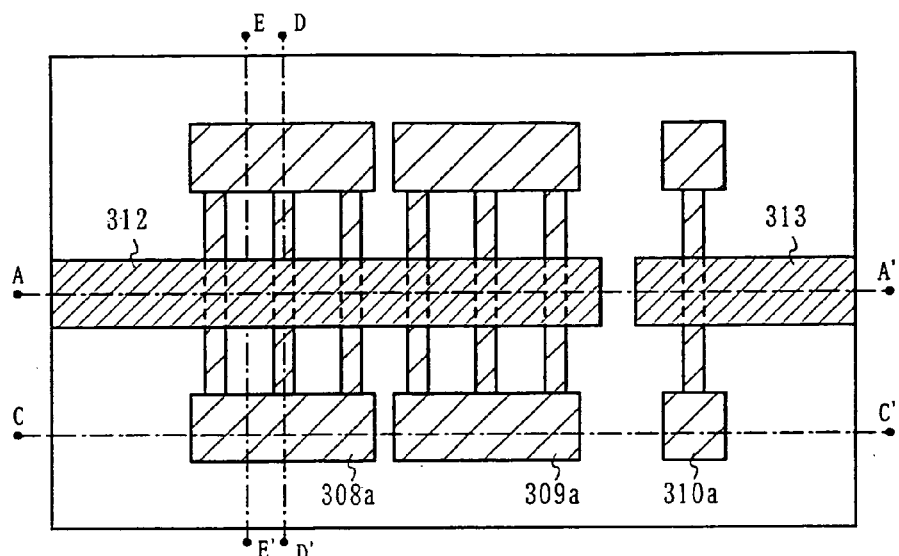
FIG. 10A is a plan view illustrating the producing process of the transistor of the present invention.
Figure 10B:
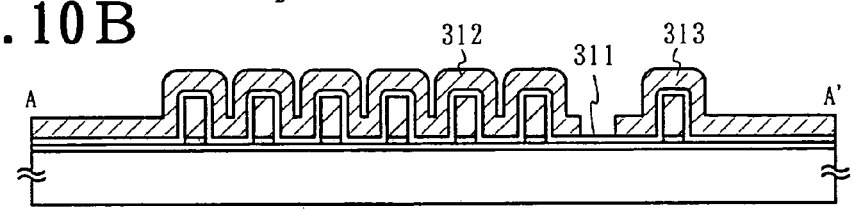
FIGS. 10B to 10E are longitudinal sectional views illustrating the producing process of the transistor of the present invention.
Figure 10C:
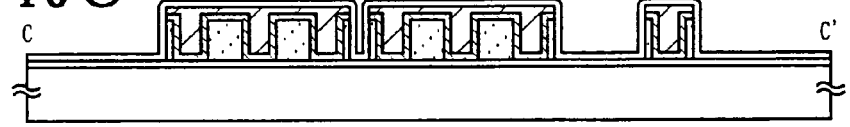
Figure 10D:
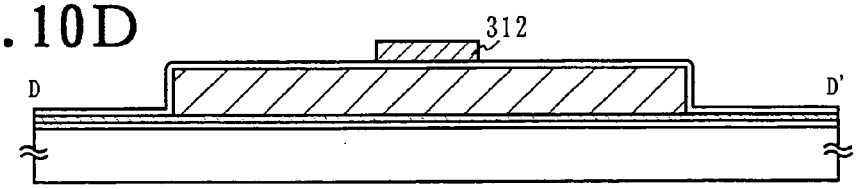
Figure 10E:
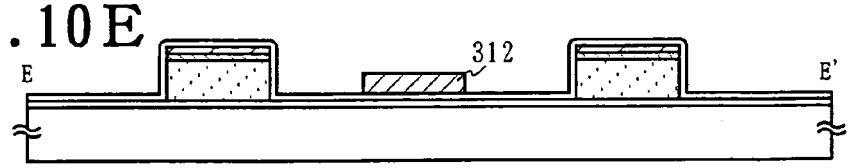
Figure 12A:
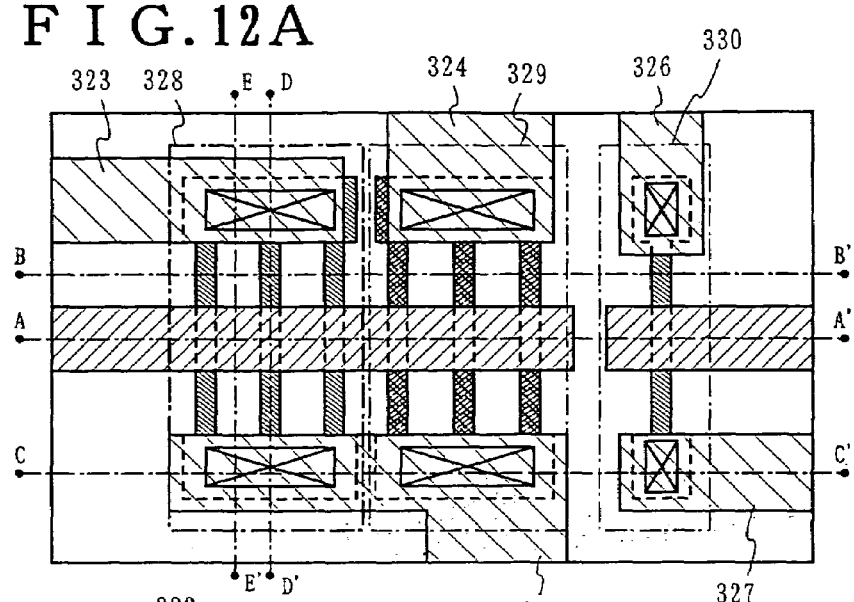
FIG. 12A is a plan view illustrating the producing process of the transistor of the present invention.
Figure 12B:
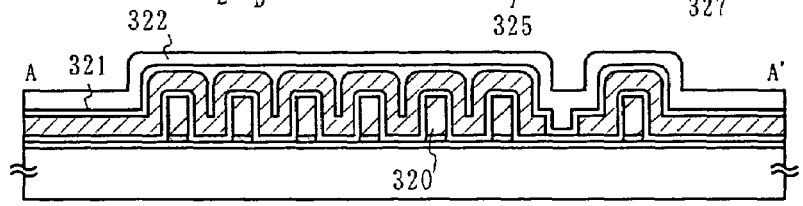
FIGS. 12B to 12F are longitudinal sectional views illustrating the producing process of the transistor of the present invention.
Figure 12C:
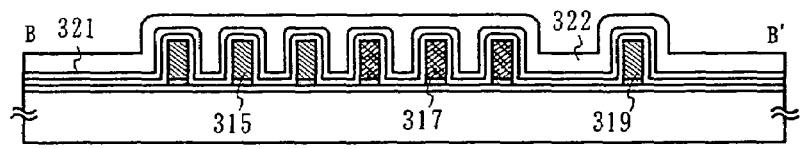
Figure 12D:
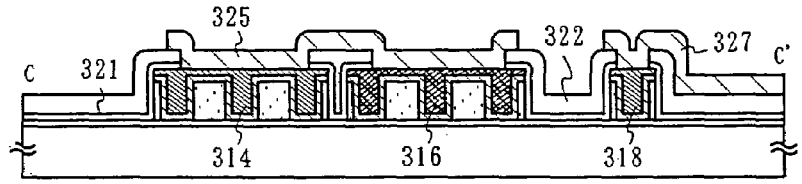
Figure 12E:
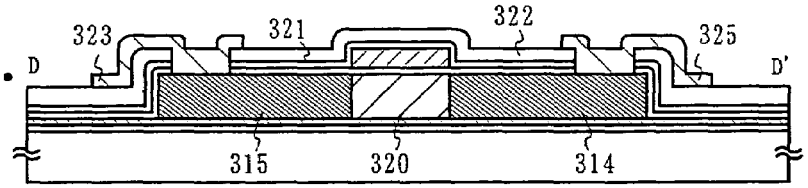
Figure 12F:
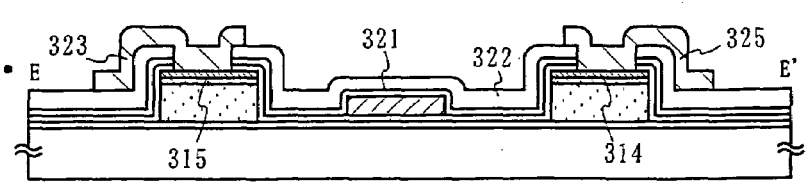

By irradiating laser beams on this condition, an amorphous semiconductor film is melted momentarily and crystallized. Substantially, while a melting region moves, crystallization advances. The melted silicon is condensed and solidified in depressions under the influence of surface tension. By the above, crystalline semiconductor film 307 with flat surface is formed so that depression 304 may be filled up with, as shown in FIG. 7D.

Then, as shown in FIGS. 8A–E, crystalline semiconductor film 307 is subjected to etching, and semiconductor film regions 308 to 310 used as the active layer of a thin-film transistor are formed. In addition, the forms of the semiconductor regions 308 to 310 are not limited to FIGS. 8A–E, and especially not limited within the limits according to a predetermined design rule as described in Embodiment mode 1.

By using the gas and oxygen of a fluoride system as etching gas, crystalline semiconductor film 307 and third insulating film 305 can be subjected to etching selectively. Of course, even if third insulating film 305 was subjected to etching, when selectivity of the first insulating film 302 disposed under the third insulating film 305 and the second insulating film 303 can be secured, it is satisfactory in any way.

In addition, as an etching method, plasma-etching method using the mixed gas of $CF_4$ and $O_2$, and $NF_3$ gas may be adopted. Or plasma-less gas etching using fluoridation halogen gas, such as $ClF_3$ gas without exciting may be adopted also. The plasma-less gas etching is an effective method. The reason is that plasma damage does not occur to a crystalline semiconductor film, and crystal defects can be controlled.

As explained in Embodiment mode 3 using FIGS. 3A–B, resist masks (not shown) are provided to form a portion to be a channel formation region of the semiconductor regions 308 to 309 into thin film. For the process of thin film, mixed gas of $CF_4$ and $O_2$ can be used. When the thin film process is completed, resist masks are removed, and the state that shown in FIGS. 9A–B is formed by etching the third insulating film 305 and the second insulating film in a self-aligning manner by using the semiconductor region as masks. In FIGS. 9A–B, reference numeral 308a to 310a are semiconductor regions that portions to be a channel formation region formed into thin film. Of course, as shown in FIG. 9C, the second insulating film 303 is left at the cross-sectional surface taken along the line C–C' of FIG. 9A, as well as the semiconductor region is left having a thickness before conducting a thin film process.

Next, as shown in FIGS. 10A–E, fourth insulating film (functioning as a gate insulating film) 311 and conductive films 312 and 313 used for a gate electrode are formed in order to cover the semiconductor regions 308a to 310a. Fourth insulating film 311 may be included of either of silicon oxide film, silicon nitride film, silicon oxynitride film, silicon nitride oxide, aluminum nitride film, aluminum oxynitride, aluminum oxynitride, or aluminum oxide. Or laminated films combining these films may be satisfactory.

In order to improve coverage of a gate insulating film, silicon oxide film using TEOS is preferably used. Using aluminum nitrioxide formed by the RF sputtering method may also be used. Or the laminated films of these aluminum nitrioxide film and silicon oxide (silicon oxide film may satisfactorily be formed in such a way that a semiconductor film serving as an active layer is oxidized by hydrogen peroxide.) are satisfactory.

Moreover, the electric conductive films 312 and 313 used as a gate electrode are formed by tungsten, the alloy containing tungsten, or aluminum or an aluminum alloy.

Next, as shown in FIGS. 11A–F, one-conductivity-type impurity fields 314 to 319 are formed in semiconductor regions 308a to 310a. Here, n type impurity fields 314, 315, 318, and 319 and p type impurity fields 316 and 317 are formed for convenience. Electric conductive films 312 and 313 may be formed self-aligned in these impurity fields as masks, or may be formed by masking using a photoresist. Source or drain regions may also be formed in the impurity fields 314 to 319. Low density drain regions (generally referred to as LDD regions.) can also be provided if needed.

As the impurity fields 314 to 319, ion implantation where impurity ions are accelerated by electric field to be poured into semiconductor regions or ion doping is applied. In this case where this invention is applied, the existence of mass separation of the ion kind to pour in does not pose an essential problem.

At this time, semiconductor region 320 of semiconductor regions 308 to 310, disposed under gate electrodes 312 and 313 and formed in depression 304, is intended to serve as a channel formation region of a thin-film transistor of this invention.

And fifth insulating film (functioning as a passivation film.) 321 by silicon nitride film or silicon oxynitride film containing about 50 to 100 nm hydrogen as shown in FIGS. 12A–F is formed. By heat-treating at 400 to 450° C. in this state, hydrogen contained in silicon nitride film or silicon oxynitride film is emitted, and the hydrogenation can be performed over an island-shaped semiconductor film.

Subsequently, sixth insulating film (functioning as an inter-layer insulating film.) 322 is formed by silicon oxide film and others, and wiring 323 to 327 linked to impurity fields 314 to 319 is formed. In this way, n channel type transistors 328 and 330 and p channel type transistor 329 can be formed.

Multi-channel type transistor which has pluralities of channel formation regions 320 arranged in parallel, and connected between a pair of impurity fields 314 and 315 (or 316 and 317) is shown by n channel type transistor 328 and p channel type transistor 329 as shown in FIG. 12. Specifically, inverter circuit serving as a basic circuit of CMOS structure is constituted from the n channel type multi-channel transistor 328 and the p channel type multi-channel transistor 329, and one of this example is shown. The number of the channel formation regions arranged in parallel in this constitution is not limited, but pluralities of numbers may be arranged if needed. For example, a single channel like the n channel type transistor 330 may also be satisfactory.

Embodiment Mode 4

In this embodiment mode, an example will be described in which a thin film transistor functioning as a switching element and a storage capacitor for holding charges to be stored in each pixel are formed in a pixel portion of a semiconductor device. More specifically, an example will be described in which a crystalline silicon film is formed on a base insulating film having recessed portions, a thin film transistor, in which a channel forming region is formed, is formed on a semiconductor region formed in the recessed portions, and a storage capacitor including another semiconductor region formed in the recessed portions as one electrode is formed. Note that in each figure for this embodiment mode, A indicates a plan view and B and subsequent alphabets indicate longitudinal sectional views of each portion corresponding to the plan view.

In FIGS. 6A–D, a first insulating film 302 including silicon nitride of 30 to 300 nm, silicon oxide nitride having a nitrogen content larger than an oxygen content, aluminum nitride, or aluminum oxide nitride is formed on a glass substrate 301. A linear stripe pattern having recessed portions and projected portions is formed on the first insulating film 302 with a second insulating film 303 including silicon oxide or silicon oxide nitride. The silicon oxide film is formed by mixing TEOS and $O_2$ with the plasma CVD method. Then, a reactive pressure and a substrate temperature thereof are set to 40 Pa and 400° C., respectively, and the silicon oxide film is discharged at a high frequency (13.56 MHz) power flux density of 0.6 w/cm$^2$, and deposited with a thickness of 10 to 3000 nm, preferably 100 to 2000 nm. Thereafter, recessed portions 304 are formed by etching. A width of the recessed portions is 0.01 to 1 μm, preferably 0.05 to 0.2 μm, in particular, in a place where the channel forming region is arranged.

Next, a third insulating film 305 and an amorphous silicon film 306 including an oxide film or a silicon oxide and nitride film are continuously formed using an identical plasma CVD device, without bringing them into contact with the atmosphere, on the first insulating film 302 and a second insulating film 303. The amorphous silicon film 306 is formed of a semiconductor film containing silicon as a main component and by the plasma CVD method using $SiH_4$ as a material gas. At this stage, bottoms and sides of the recessed portions 304 are coated and an uneven surface shape is formed as shown in FIG. 6B.

Crystallization is performed by irradiating continuous oscillation laser beams. FIGS. 7A–D show a state after the crystallization. As conditions for the crystallization, a $YVO_4$ laser oscillator of a continuous oscillation mode, an output 5 to 10 W of a second higher harmonic (wavelength 532 nm) of the laser oscillator is condensed into a linear laser beam, in which a ratio of a longitudinal direction with respect to a latitudinal direction is 10 or more, by an optical system and condensed so as to have a uniform energy density distribution in the longitudinal direction to scan a film at a speed of 5 to 200 cm/sec and crystallize it. The uniform energy distribution does not mean eliminating energies other than a completely constant one, and an allowable range in an energy density distribution is ±10%.

It is desirable that an intensity distribution of a linearly condensed laser beam is uniform in a longitudinal direction (X axis direction in FIG. 2A). This is for the purpose of making a temperature of a semiconductor to be heated uniform over an entire irradiation area of the laser beam. This is because, when a temperature distribution is generated in the X axis direction of the linearly condensed laser beam, a direction of crystal growth of a semiconductor film cannot be regulated to a scanning direction of the laser beam. A growth direction of crystal and a channel length direction of all transistors can be matched by arranging a linear strip pattern in accordance with the scanning direction of the irradiation area of the linearly condensed laser beam. Consequently, fluctuation of characteristics among elements of the transistors can be reduced.

In addition, the crystallization by the linearly condensed laser beam may be completed only with one scanning (i.e., in one direction) or may be reciprocatingly scanned in order to increase crystallinity. Moreover, after crystallization by the laser beam, it is also possible to remove oxide by fluorine or the like, or treat a surface of a silicon film with an alkaline solution by ammonia hydrogen peroxide treatment or the like to selectively remove parts where an etching speed is high and a grade is low, and perform the same crystallization treatment again. In this way, crystallinity can be improved.

By irradiating a laser beam under the conditions, an amorphous semiconductor film is instantly fused and crystallized. Practically, crystallization progresses while a fusing zone is moving. Fused silicon is subjected to surface tension to concentrate and solidify in the recessed portions. Consequently, as shown in FIG. 7, a crystalline semiconductor film 307 with an even surface is formed in a form of filling the recessed portions 304.

Thereafter, as shown in FIGS. 28A–E, the crystalline semiconductor film 307 is etched to form a semiconductor region 358 to be an active layer of a thin film transistor and a semiconductor region 359 to be one electrode (lower electrode) of a storage capacitor. Note that FIGS. 28A–E does not limitationely show shapes of the semiconductor regions 358 and 359, restrictively, and the shapes are not specifically limited within a range in accordance with a predetermined design rule as described in Embodiment mode 1.

The crystalline semiconductor film 307 can be etched with selectivity between the crystalline semiconductor film 307 and the third insulating film 305 by using a fluorine gas and oxygen as an etching gas. It is needless to mention that there is no problem as long as selectivity between the crystalline semiconductor film 307 and the first insulating film 302 or the second insulating film 303 can be secured even if the third insulating film 305 is etched. Note that, the etching may be performed with a plasma etching method using a mixed gas of $CF_4$ and $O_2$ or an $NF_3$ gas as the etching gas. Alternatively, plasma-less gas etching, which uses a fluoride halogen gas such as a $ClF_3$ gas without exciting it, may be performed. The plasma-less gas etching is a more effective technique for suppressing crystal failure because it does not have to give plasma damage to the crystalline semiconductor film.

Figure 29A:
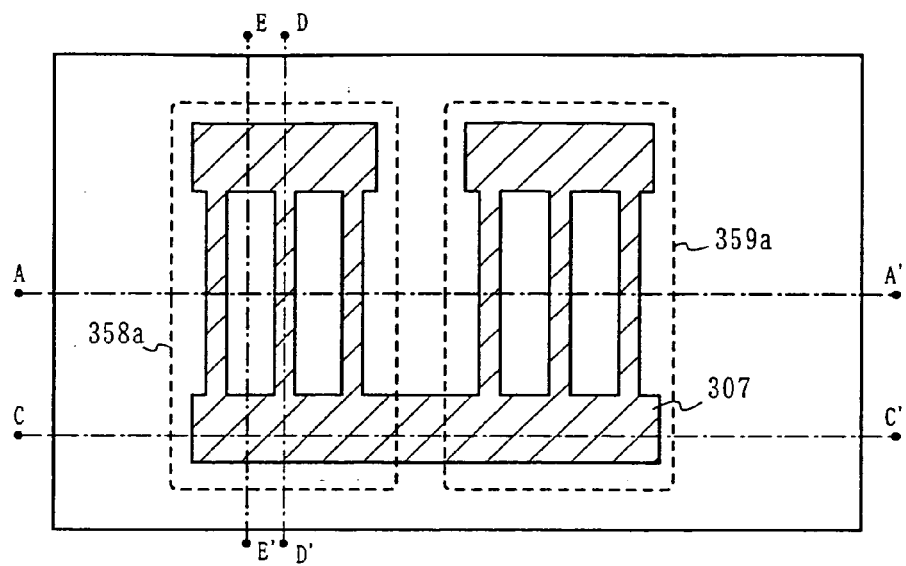
FIG. 29A is a plan view illustrating the producing process of the transistor of the present invention.
Figure 29B:
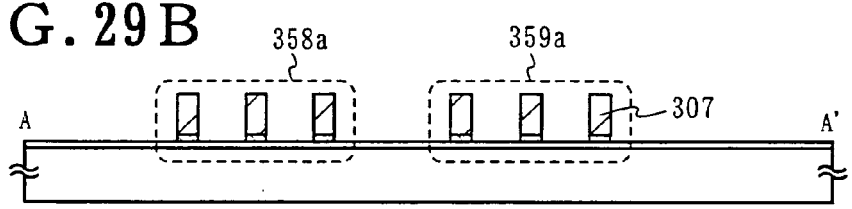
FIGS. 29B to 29E are longitudinal sectional views illustrating the producing process of the transistor of the present invention.
Figure 29C:
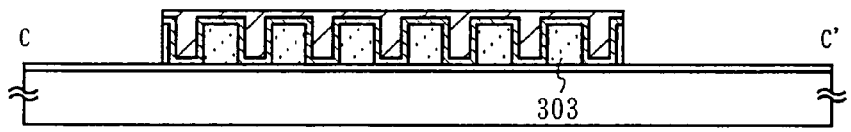
Figure 29D:
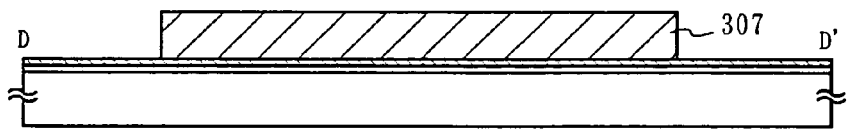
Figure 29E:
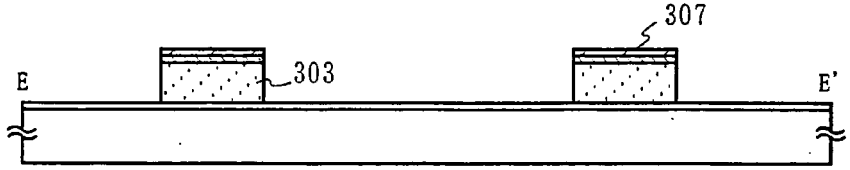
Figure 30A:
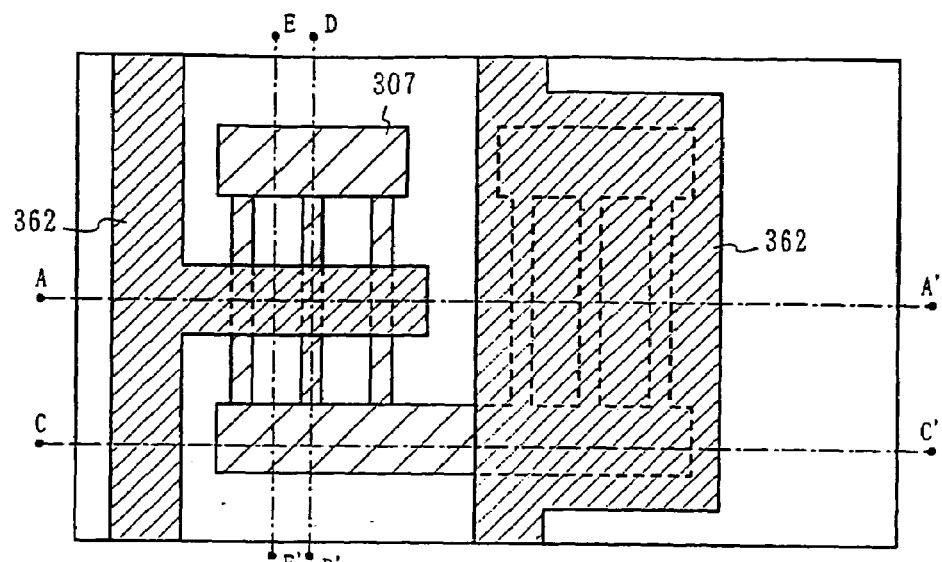
FIG. 30A is a plan view illustrating the producing process of the transistor of the present invention.
Figure 30B:
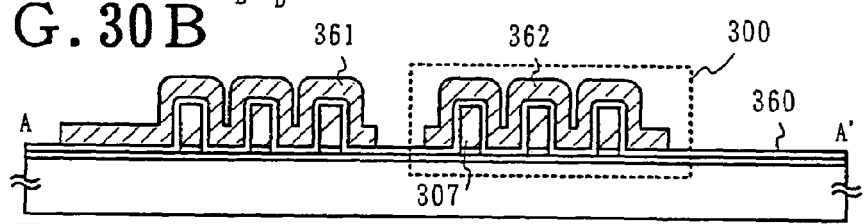
FIGS. 30B to 30E are longitudinal sectional views illustrating the producing process of the transistor of the present invention.
Figure 30C:
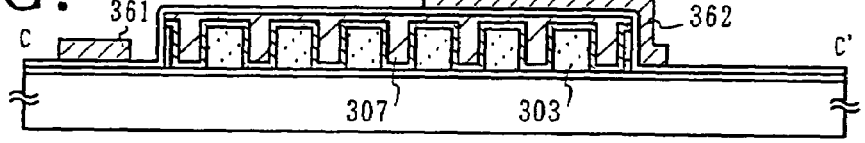
Figure 30D:
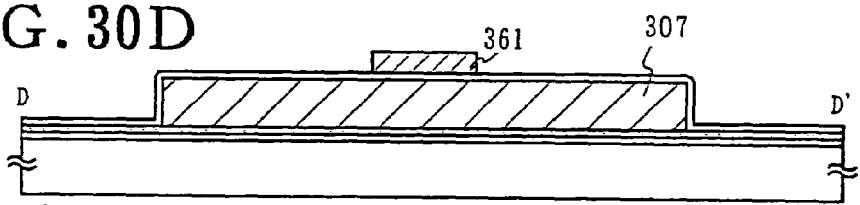
Figure 30E:
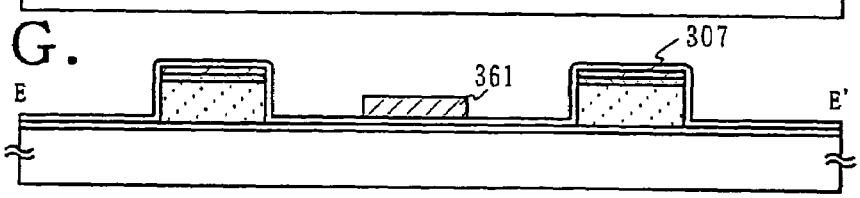
Figure 31A:
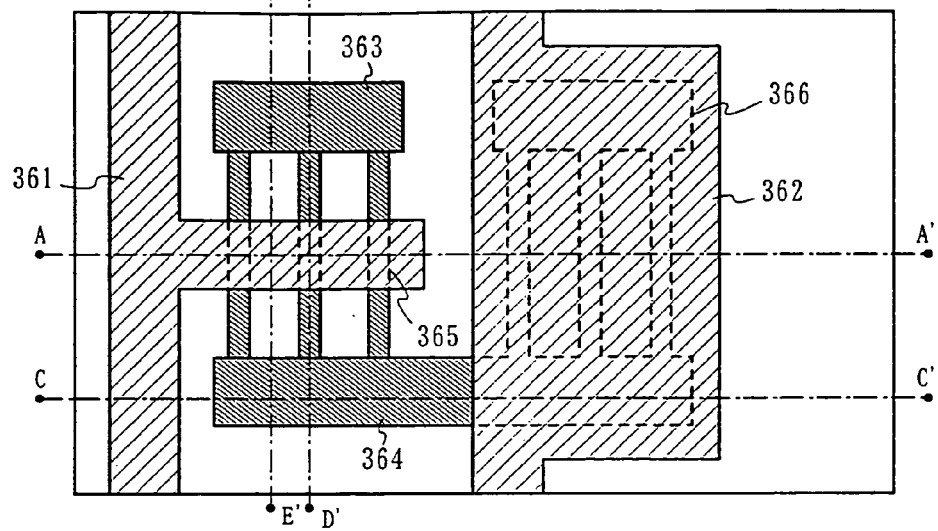
FIG. 31A is a plan view illustrating the producing process of the transistor of the present invention.
Figure 31B:
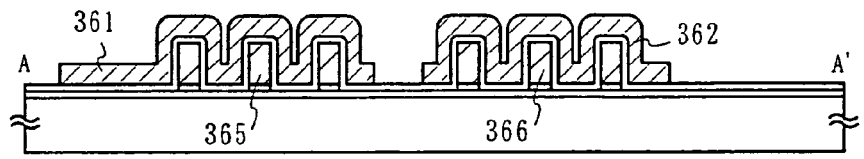
FIGS. 31B to 31E are longitudinal sectional views illustrating the producing process of the transistor of the present invention.
Figure 31C:
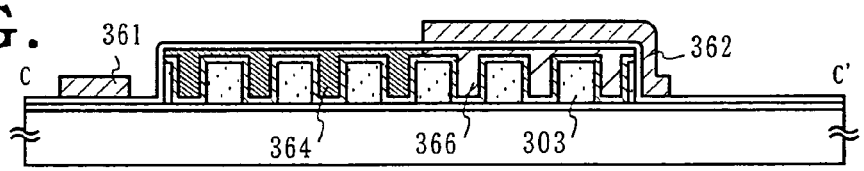
Figure 31D:
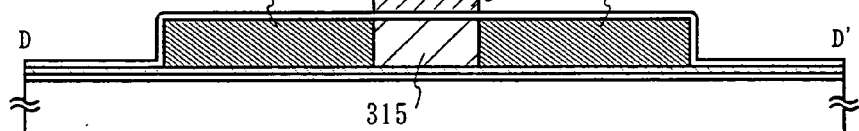
Figure 31E:
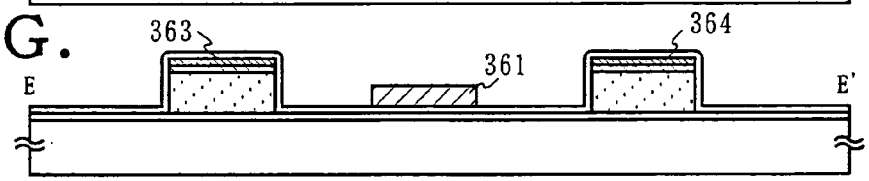

Next, a resist mask (not shown) is provided as described using FIGS. 3A–B in Embodiment mode 1, and a part to be the channel forming region of the semiconductor region 358 and a part formed in a stripe pattern of the semiconductor region 359 are changed into thin films. In this film thinning process, it is sufficient to use a mixed gas of a $CF_4$ gas and an $O_2$ gas. Then, when the film thinning is completed, after removing the resist mask, the third insulating film 305 and the second insulating film 303 are etched in a self-aligning manner with the semiconductor regions as a mask as described using FIG. 4 to obtain a state shown in FIGS. 29A–E. In FIGS. 29A–E, reference symbols 358a and 359a denote semiconductor regions which are obtained by changing the part to be the channel forming region and the part formed in a stripe pattern into thin films, respectively. It is needless to mention that, as shown in FIG. 29C, the second insulating film 303 remains in a section cut along C–C' of FIG. 29A and the semiconductor regions also remain with the film thickness before the film thinning.

Next, as shown in FIG. 30, a gate insulating film 360, a gate wiring (also functions as a gate electrode) 361, and a capacitive wiring 362 are formed so as to cover the semiconductor regions 358a and 359a. As the gate insulating film 360, any of the silicon oxide film, the silicon nitride film, the silicon oxide nitride film, the silicon nitride oxide film, the aluminum nitride film, the aluminum nitride oxide film, the aluminum oxide nitride film, and the aluminum oxide film, which are described in Embodiment mode 1, may be used, or a laminated film obtained by combining these films appropriately may be used. In order to improve coverage of the gate insulating film, if it is a silicon oxide film, a silicon oxide film using TEOS is preferable. If it is an aluminum oxide nitride film, it is preferable to use an aluminum nitride oxide film formed by an RF sputtering method or use a laminated film of the aluminum nitride oxide film and the silicon oxide film (the silicon oxide film may be one obtained by oxidizing a semiconductor film to be an active layer with hydrogen peroxide). In addition, the gate electrode 361 and the capacitive wiring 362 are formed of tungsten or an alloy containing tungsten, or aluminum or an aluminum alloy.

In this state, the storage capacitor comprises the semiconductor region 359a including a first crystalline semiconductor region, the gate insulating film 360, and the capacitive wiring 362. That is, the semiconductor region 359a, the gate insulating film 360, and the capacitive wiring 362 carry out functions as parts of the storage capacitor as one electrode, a dielectric body, and the other electrode, respectively.

Next, as shown in FIG. 31, unidirectional conductivity type impurity regions 363 and 364 are formed in the semiconductor regions 358a and 359a, respectively. Here, it is assumed that n-type impurity regions 363 and 364 are provided for convenience' sake. These impurity regions may be formed in a self-aligning manner with the gate electrode 361 and the capacitive wiring 362 as a mask or may be masked with a photo-resist or the like to be formed. The impurity regions 363 and 364 are regions to be a source region or a drain region of a thin film transistor functioning as a switching element, in which a low concentration drain region (which is generally called an LDD region) can be provided if necessary.

At this point, a semiconductor region 365, which is located below the gate electrode 361 and formed in the recessed portions 354, of the semiconductor regions 358a and 359a become the channel forming region of the thin film transistor, and a semiconductor region 366 located below the capacitive wiring 362 becomes the lower electrode of the storage capacitor.

Then, a passivation film 367 including a silicon nitride film or a silicon oxide nitride film, which contains nitrogen in the order of 50 to 100 nm, is formed as shown in FIGS. 32A–E. By applying heat treatment to the passivation film 367 to increase its temperature to 400 to 450° C., hydrogen contained in the silicon nitride film or the silicon oxide and nitride film is emitted and hydrogenation with respect to an island shape semiconductor film can be performed. Subsequently, an interlayer insulating film 368 including a silicon oxide film or the like is formed, and a data wiring 369 to be connected to the impurity region 364 and a drain wiring 370 to be connected to the impurity region 363 are formed. Note that reference numeral 371 denotes a contact portion between the impurity region 364 and the data wiring 369, and 372 denotes a contact portion between the impurity region 363 and the drain wiring 370.

An n-channel thin film transistor is completed through the above-described process. The n-channel thin film transistor shown in FIGS. 32A–E has a multi-channel structure in which plural channel forming regions 365 are disposed in parallel with each other and are connected between the pair of impurity regions 363 and 364. In this structure, there is no limitation in the number of channel forming regions to be disposed in parallel with each other, and it is sufficient to dispose plural channel forming regions as required.

When the n-channel thin film transistor is completed, an interlayer insulating film 373 is further formed. Any material may be used for the interlayer insulating film 373 as long as the material is a publicly known insulating film, and in particular, an organic resin film which can be planarized is preferable. In addition, a nitride insulating film may be combined with the organic resin film to be laminated as required. Further, a pixel electrode 374 including oxide conductive film (represented by ITO) is formed on the interlayer insulating film 373. In this way, an active matrix substrate having a thin film transistor 380 functioning as a switching element and a storage capacitor 381 functioning as charge holding means is completed. Note that the active matrix substrate indicates a substrate on a side where various circuits and pixel portions are formed in a semiconductor device such as a liquid crystal device.

Figure 33A:
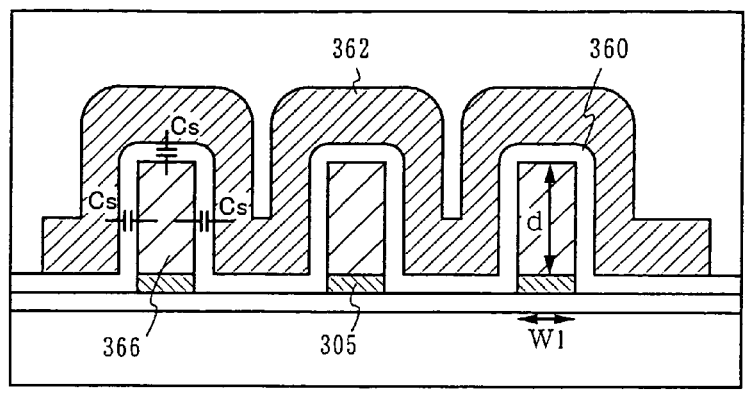
FIG. 33A is a sectional view of a storage capacitor obtained by carrying out the present invention.

In the active matrix substrate completed according to the above-mentioned process, a section of an enlarged part of the storage capacitor 381 of FIG. 32B is shown in FIG. 33A. In FIG. 33A, a capacitor (which may be referred to as a storage capacitor) is formed in a part denoted by a reference symbol Cs, and three capacitors are formed on three sides, namely, side surfaces and an upper surface, of the semiconductor region 366, respectively. In this embodiment mode, since three semiconductor regions 366 are provided in parallel with each other, total nine capacitors denoted by the reference symbol Cs are formed.

Figure 33B:
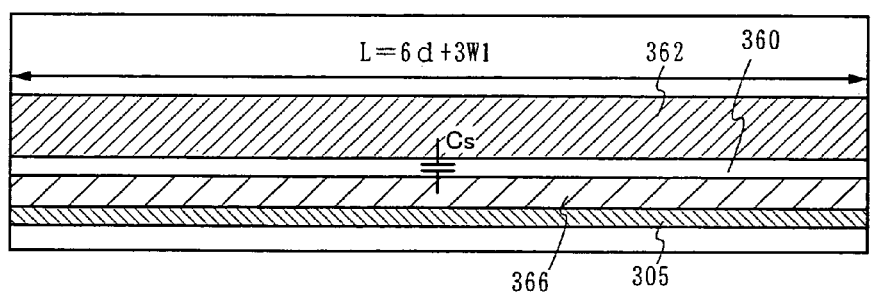
FIG. 33B is a schematic view of the storage capacitor obtained by carrying out the present invention.

FIG. 33B is an equivalent schematic view of the storage capacitor shown in FIG. 33A. When a height and a width of the semiconductor region 366 are assumed to be d and W, respectively, an equivalent length L of the semiconductor region 366 in the schematic view is represented by L=6d+3W1. That is, in the semiconductor device obtained by carrying out the present invention, storage capacitors are formed on the side surfaces and the upper surfaces of the semiconductor region 316, respectively, whereby an occupied area of the storage capacitors as a whole can be reduced and it becomes possible to store charges of a high density. Thus, there is an advantage that an aperture ratio of a pixel (or effective display region) can be increased as the occupied area in a pixel can be reduced.

Embodiment Mode 5

Figure 13A:
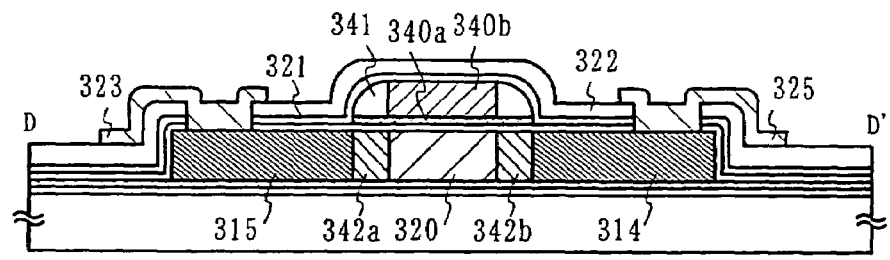
FIGS. 13A to 13C are longitudinal sectional view showing an example of a gate structure which can be applied in the transistor of the present invention.
Figure 13B:
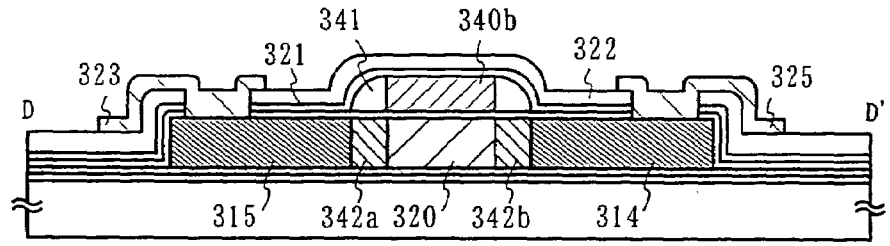
Figure 13C:
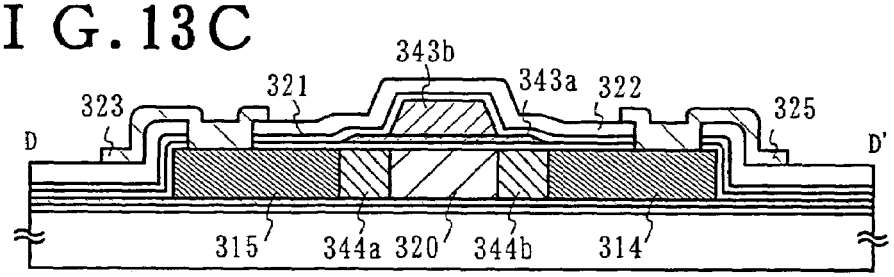

A transistor is shown by single drain structure in embodiment modes 3, 4. However, low-density drain (LDD) may also be provided. FIGS. 13A–C are views showing an example of the n channel type multi-channel transistor having LDD structure.

The structure of a transistor shown in FIG. 13A is an example of forming a gate electrode by nitride metal 340a such as titanium nitride or tantalum nitride, and metal 340b of high melting point such as tungsten, or tungsten alloy. And spacer 341 is formed in the flank side of the gate electrode 340b. Spacer 341 may be formed out of insulators such as silicon oxide or n type multi-crystal silicon to give conductivity by anisotropic dry etching. LDD regions 342a and 342b can be formed self-aligned to gate electrode 340b, before this spacer is formed. When a spacer is formed out of a conductive material, LDD regions 342a and 342b can be structured as Gate-Overlapped LDD structure substantially superimposed on a gate electrode.

On the other hand, FIG. 13B is showing the structure in which gate electrode 340a is not prepared, and serves as LDD structure in this case.

As shown in FIG. 13C, the n type impurity field 344 forming LDD regions adjoining n type impurity field 315 (reference numeral 363 in Embodiment mode 4) is formed.

Gate electrode 343 is a two-layer structure of under layer side gate electrode 343a and upper layer side gate electrode 343b. And n type impurity fields 314 and 315 (reference numeral 364, 363 in Embodiment mode 4) and LDD regions 344a and 344b can be formed in a self-aligned manner. Detailed descriptions of such a gate electrode and impurity regions, and manufacturing method thereof are disclosed in Patent Application No. 2000-128526, or Patent Application No. 2001-011085 for reference.

At any rate, the structure that forms LDD regions in a self-aligned manner according to such gate structure is especially effective in miniaturization of a design rule. The transistor unipolar structure is shown here, and CMOS structure as well as Embodiment mode 3 or 4 can also be formed.

In addition, in this embodiment mode, explanation for the same constitution with Embodiment mode 3 or 4 other than a gate electrode and LDD regions is omitted to simplify an explanation.

Embodiment Mode 6

This embodiment mode is different from the constitution described in Embodiment mode 1 and relates to an invention that is characterized in that one conductivity type impurity region functioning as an electrode is directly used as wiring. This embodiment mode aims at an improvement in the yield while reducing the number of contact parts and aims at an improvement in the scale of integration by reduction of a design margin.

FIG. 14 is used for an explanation. FIG. 14A is a top view, and FIGS. 14B to FIG. 14F show cross-sectional views of the respective parts. In addition, it is a view corresponding to the state shown in FIG. 11 in Embodiment mode 1. The process that comes to this state and subsequent transistor forming processes can be referred to Embodiment mode 3.

Figure 14A:
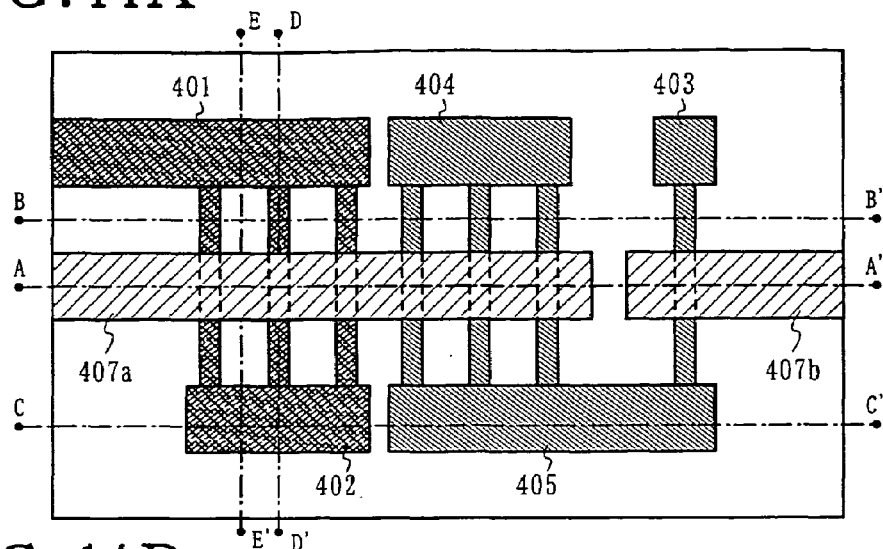
FIG. 14A is a plan view illustrating the producing process of the transistor of the present invention.
Figure 14B:
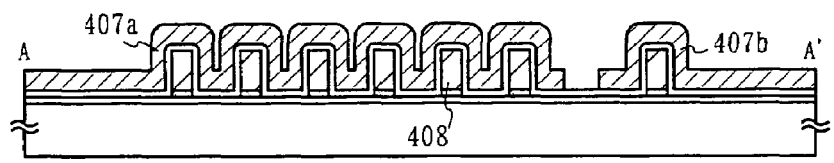
FIGS. 14B to 14F are longitudinal sectional views illustrating the producing process of the transistor of the present invention.
Figure 14C:
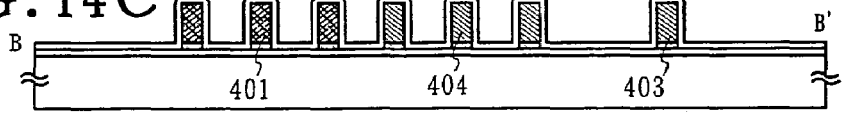
Figure 14D:
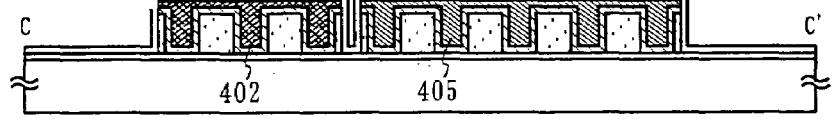
Figure 14E:
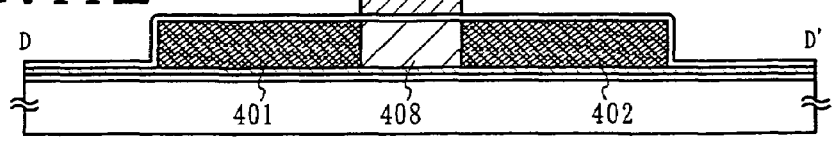
Figure 14F:
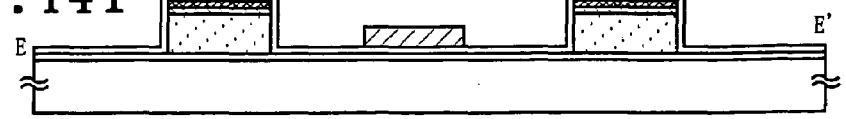

In FIGS. 14A, reference numeral 401 to 405 function as impurity region of one conductivity type, reference numeral 401 and 402 function as source regions and drain regions of a P channel type transistor, respectively. Further, reference numeral 403 and 404 function as the source regions of the N channel type transistor, respectively, and reference numeral 405 functions as a drain region of a N channel type transistor. At this time, drain region 405 functions as wiring which connects two transistors electrically.

Since a crystalline semiconductor region with bad crystallinity is also utilizable as an electrode in this invention, the number of contact parts can be reduced by utilizing as wiring like this embodiment mode. In addition, a design margin for contact formation can be extended. Therefore, it is very effective to form the logic circuit which is especially made finer.

In addition, this embodiment mode is only an example and proposes a technical thought that the impurity fields of a conductivity type can be used not only as an electrode but also as wiring in this invention. Accordingly, combining with any technology disclosed in embodiment modes 1 to 4 makes it possible to obtain the effect described in these embodiment modes.

As characteristics of the present invention, since even the semiconductor region having poor crystallinity can be utilized as an electrode, the number of contact portions can be reduced by means of using the semiconductor region as a wiring, further, the design margin for forming contacts can be expanded. Thus, it is especially effective in forming a miniaturized logic circuit.

This embodiment mode is illustrative only, and discloses a technology idea that one conductivity type impurity region can be used as not only as an electrode but as a wiring. Therefore, this embodiment mode can provide effects that are described therein even if it is combined with technologies disclosed in Embodiment modes 1 to 5.

Embodiment Mode 7

The embodiment mode is different from the constitution explained in Embodiment mode 1, and relates to the invention wherein a plurality of transistors are formed to be connected in series by using a conductive type impurity region as wiring. This embodiment mode makes it possible to obtain a transistor having a plurality of channel formation regions between a source region and a drain region, and shows possibilities of further embodiment modes.

Figure 15A:
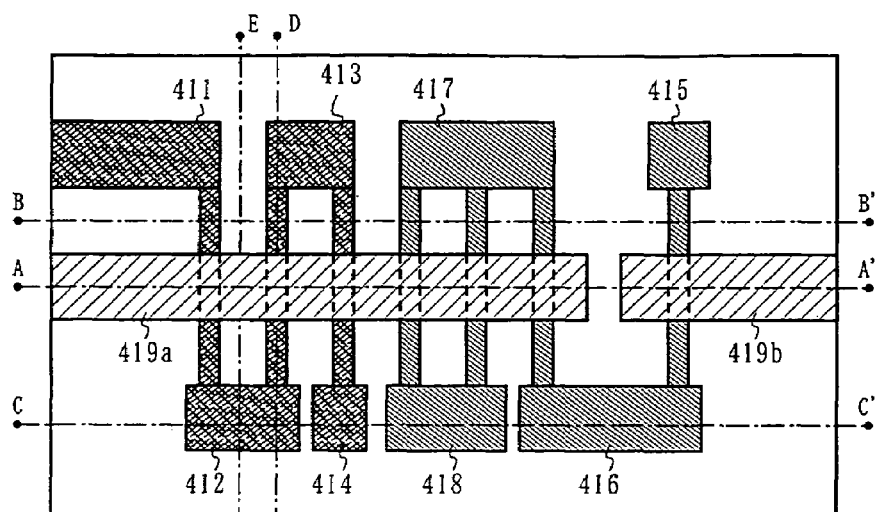
FIG. 15A is a plan view illustrating the producing process of the transistor of the present invention.
Figure 15B:
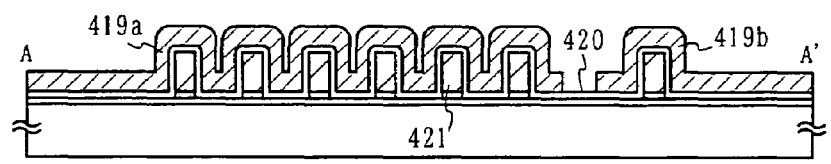
FIGS. 15B to 15F are longitudinal sectional views illustrating the producing process of the transistor of the present invention.
Figure 15C:
Figure 15D:
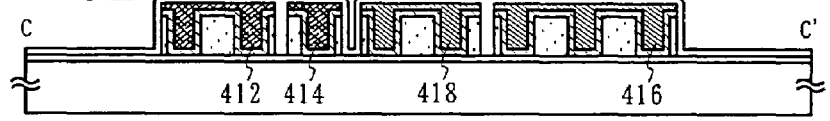
Figure 15E:
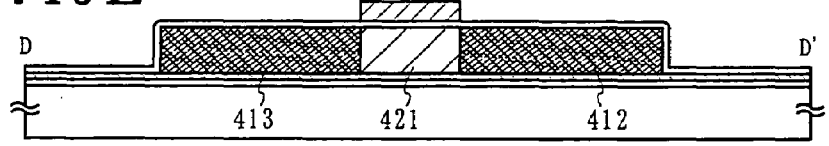
Figure 15F:
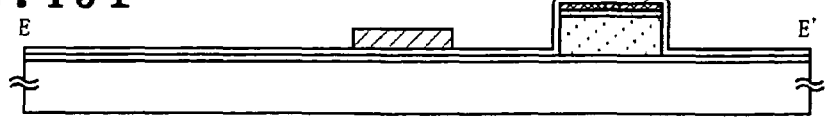

FIGS. 15A–F are used for an explanation. FIG. 15A is a top view, and FIGS. 15B to FIG. 15F are cross-sectional views of the respective parts. In addition, it is a view corresponding to the state of FIG. 11 in Embodiment mode 1. The process that comes to this state and subsequent transistor forming processes can be referred to Embodiment mode 1.

In FIG. 15A, reference numeral 411 to 418 are impurity regions of one conductive type, reference numeral 411 and 414 are source regions and drain regions of the p channel type transistor respectively, and reference numeral 412 and 413 are impurity regions used as wiring. In addition, since occupancy area of the impurity regions 412 and 413 can be enlarged in this invention, this portion may be used only for wirings, or may be used as an electrode by extending area. Also, it is possible to form in the crooked form so as to function as a protection circuit.

Moreover, reference numeral 415 is a source region of the N channel type transistor of a single channel, and reference numeral 416 is a drain region. Furthermore, such transistor as having the drain region 416 as a source region and impurity region 418 as a drain region is constituted. In this case, impurity region 417 functions as wiring. This transistor has three channel formation regions altogether. However, two transistors of them are provided in parallel inside and connected with the remaining one in series. Of course, this embodiment mode is not limited to the constitution of the transistor described above.

This embodiment mode is illustrative only, and discloses a technology idea that one conductivity type impurity region can be used as not only as an electrode but as a wiring. Therefore, this embodiment mode can be combined with technologies disclosed in Embodiment modes 1 to 6.

Embodiment Mode 8

This embodiment mode is an embodiment mode different from the structure described in Embodiment mode 1 and relates to an invention which is characterized by forming a transistor having a structure in which plural transistors are connected in series by using a unidirectional conductivity type impurity region as a wiring. This embodiment mode discloses that it is also possible to obtain a transistor having plural channel forming regions between a source region and a drain region and indicates a further embodiment mode of the present invention.

FIGS. 34A–C will be used for the description. FIG. 34A is a plan view and FIGS. 34B and 34C show sectional views of corresponding portions, respectively. Note that FIGS. 34A–C are views corresponding to the state of FIGS. 31A–E in Embodiment mode 4. For understanding of the process for reaching this state and the process of transistor formation thereafter, it is sufficient to refer to Embodiment mode 1.

In FIG. 34A, reference numerals 451 and 452 denote a source region and a drain region of an n-channel thin film transistor, respectively, and 453 denotes a channel forming region. In addition, reference numeral 454 denotes a semiconductor region functioning as one electrode of a storage capacitor. In this case, three channel forming regions 453 are provided between the impurity regions 451 and 452, which is a redundant design for reducing an OFF current (also referred to as a leak current) at the time when the thin film transistor is in an OFF state. It is needless to mention that this embodiment mode is not limited to a structure of the transistor.

Note that this embodiment mode is only an example and discloses a technical thought that a unidirectional conductivity type impurity region can be used not only as an electrode but also as a wiring in the present invention. Therefore, this embodiment mode may be combined with any one of the techniques disclosed in Embodiment modes 1 to 6.

Embodiment Mode 9

In a transistor of this invention, it becomes possible to impress the so-called substrate bias by preparing an electric conductive layer in a lower layer side. The manufacture method of a transistor is according to Embodiment mode 3 or 4. However, difference will be explained with reference to FIGS. 16A–C.

Figure 16A:
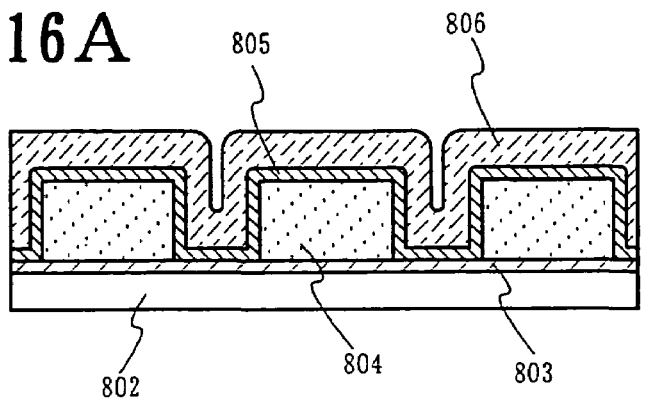
FIGS. 16A to 16C are longitudinal sectional view illustrating the producing process of the transistor of the present invention.

In FIG. 16A, on a substrate, a silicon nitride film is formed as first insulating film 802, and tungsten film 803 is formed thereon by sputtering method. A silicon nitride film can be formed fine film if it is formed by the high frequency sputtering method. Second insulating film 804 is formed out of a silicon oxide film. Depressions are formed on the silicon oxide film by etching as shown in the figure. However, since the selection ratio to the tungsten film for a base film is about 30, the silicon oxide film can be easily formed.

Figure 16B:
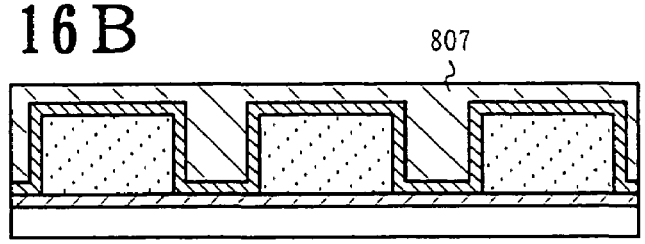
Figure 16C:
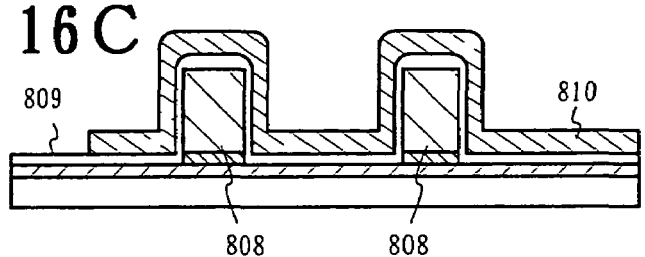

On the silicon oxide film 804, a silicon oxynitride film and amorphous silicon film 806 are formed in succession as third insulating film 805. The melting-crystallization of this amorphous semiconductor film 806 is carried out, and as shown in FIG. 16B, crystalline silicon film 807 is formed. Then, as shown in FIG. 16C, channel formation region 808 of a transistor is formed by etching, and gate insulating film 809 and gate electrode 810 are formed. Since the gate insulating film 809 is formed on the tungsten film 803, short circuit with the gate electrode 810 does not occur.

In such a form, if tungsten film 803 is fixed to grounded potential, variation in the threshold voltage of a transistor can be made small. Moreover, ON current can be increased if the gate electrode 810 and this potential are applied and driven.

Figure 17:
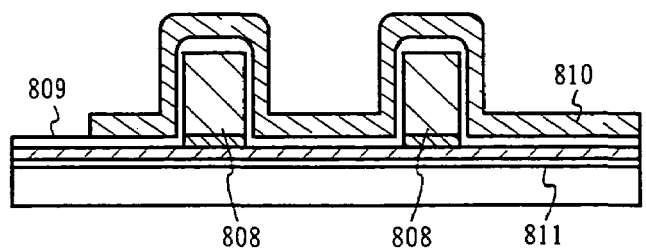
FIG. 17 is a longitudinal sectional view illustrating the producing process of the transistor of the present invention.

Moreover, in order to heighten the heat dissipation effect, an aluminum oxynitride film (or aluminum nitride film) 811 is formed on the upper layer of the tungsten film 803, as shown in FIG. 17. Object of having these films is to secure the selection ratio of etching processing. That is, in order for the etching gas of fluoride systems, such as $CHF_3$, to remove the silicon oxide serving as the second insulating film 804 and not to expose tungsten film 803 of a ground, aluminum nitride film or aluminum oxynitride film with small selection ratio is preferable as a silicon nitride film.

This embodiment mode is disclosed the constitution in which a conductive film is formed under the second insulating film forming the depression and projection in order to obtain a heat releasing effect and a threshold control on operation. This embodiment mode can be combined with the constitutions which are disclosed in Embodiment modes 1 to 6, and some effects described in this embodiment mode are provided to the invention.

Embodiment Mode 10

In this embodiment-mode, an example of etching and forming into a thin film of a portion of the crystal semiconductor film 307 (a portion that becomes a channel formation region) before the active layer 308 of a thin film transistor is formed thereon as shown in Embodiment mode 3 is described.

First the state shown in FIG. 8 is obtained according to the manufacturing method shown in Embodiment mode 3. Next, resist mask is formed on a semiconductor region of crystalline semiconductor film 307 which will serve as a source region or a drain region later.

And the crystalline semiconductor film 307 is subjected to etching by dry etching method and wet etching method using resist mask as a mask in order to expose the third insulating film 305. The crystalline semiconductor film 1802 can be left only on depressions according to this process. Moreover, under the resist mask, crystalline semiconductor film having original thickness is left. In this embodiment mode, crystalline semiconductor film is used as a channel formation region of a thin film transistor and crystalline semiconductor film is used as a source region or a drain region of a thin film transistor.

In addition, not only the chemical technique but the mechanical grinding method like CMP (chemical mechanical polishing) may be used for the etching process. Also combined use of the chemical technique and the mechanical technique is satisfactory.

According to this embodiment mode, since a channel formation region can be formed in a self-aligned manner by the second insulating film 303, it can be prevented that the channel formation region is formed accidentally on projections of the second insulating film due to a pattern gap. And the situation that crystal grain boundary is contained in the channel formation region can be reduced.

After the above process, the process subsequent to the FIG. 10 of Embodiment mode 3 may satisfactorily be referred to, omitting and simplifying the explanation in this embodiment mode. In addition, this embodiment mode can be freely combined with any embodiment modes 1 to 7.

Embodiment Mode 11

In this embodiment mode, a liquid crystal display panel and an organic electroluminescence (EL) display panel will be referred to as examples of the semiconductor device of the present invention, and examples in which the present invention is applied to a pixel structure of each of them will be described. Note that, although the organic EL display panel may be called an organic light emitting diode display panel (OLED), these indicate the identical object.

Figure 35A:
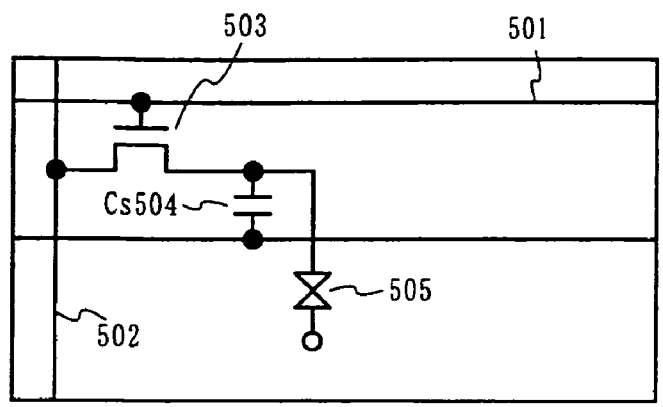
FIGS. 35A and 35B are diagrams showing an example of a semiconductor device of the present invention.

FIG. 35A shows an example of a pixel structure of a liquid crystal display panel. In FIG. 35A, a TFT 503 is provided as a switching element in a crossing portion of a gate line 501 and a data line 502. Further, one end of the TFT 503 is connected to the data line 502 and the other end is connected to a storage capacitor (Cs) 504 and a liquid crystal element 505. This structure is identical with the pixel structure of the liquid crystal display element described in Embodiment mode 3. The present invention is extremely useful in formation of the TFT 503 and formation of the storage capacitor 504. That is, in particular, in the case in which the liquid crystal panel is a transmission type, whereas reduction of an element size is essential in order to increase an aperture ratio, as described in the Embodiment mode 3, the storage capacitor 504 can store charges at a high density, although it is small in an occupied area.

Figure 35B:
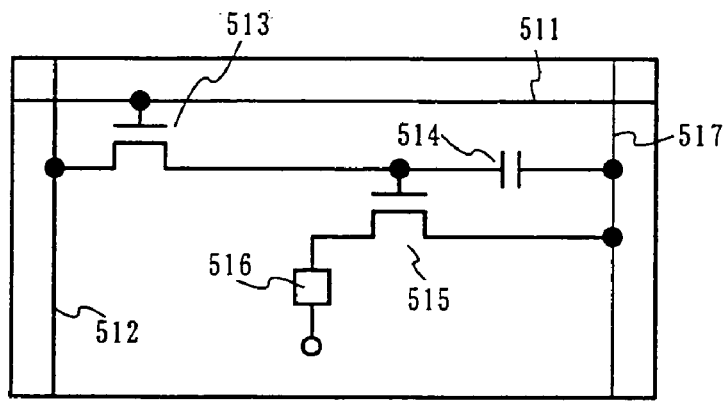

In addition, FIG. 35B shows an example of a pixel structure of an organic EL display panel. In FIG. 35B, a switching TFT 513 is provided as a switching element in a crossing portion of a gate line 511 and a data line 512. Further, one end of the switching TFT 513 is connected to the data line 512 and the other end is connected to a storage capacitor (Cs) 514 and a gate of a drive TFT 515. A drain and a source of this drive TFT 515 are connected to a light emitting element 516 and a power supply line 517, respectively. In this structure, a thin film transistor obtained by carrying out the present invention can be used both as the switching TFT 513 and the drive TFT 515. In addition, as described in Embodiment mode 4, the storage capacitor 514 can store charges at a high density, although it is small in an occupied area.

Note that, although there are various examples of a circuit structure of the organic EL display panel, the present invention can be applied to any circuit structure. More specifically, the present invention may be applied to a driving method for holding the power supply line 517 at a constant voltage or may be applied to a driving method for holding it at a constant current. In addition, it is also possible to apply the present invention to a pixel structure described in JP-A-2001-343933 or JP-A-2001-289983 which was filed by the applicant of this application.

As described above, the present invention is an extremely useful technique. in a semiconductor device in which it is necessary to form a capacitive element on a substrate, in particular, a display panel having a pixel portion. The present invention can be applied not only to the above-mentioned two examples but also to semiconductor devices of various forms. Note that it is possible to combine this embodiment mode with any one of the structures of Embodiment modes 1 to 6.

Embodiment Mode 12

In this embodiment mode, a dynamic random access memory (DRAM) and a capacitive DA converter (C-DAC) will be referred to as examples of the semiconductor device of the present invention, and examples in which the present invention is applied to a circuit structure of each of them will be described.

Figure 36A:
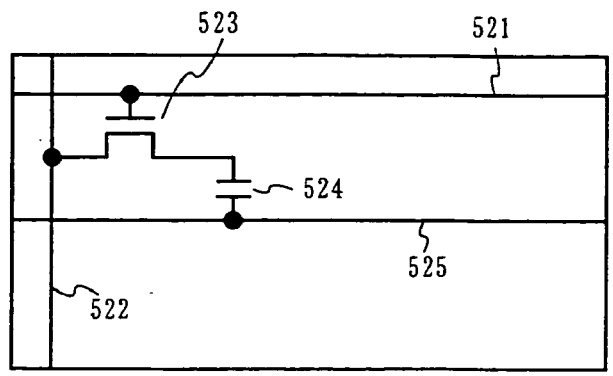
FIGS. 36A and 36B are diagrams showing an example of a semiconductor device of the present invention.

FIG. 36A shows an example of a circuit structure of the DRAM. In FIG. 36A, a TFT 523 is provided in a crossing portion of a word line 521 and a bit line 522 as a switching element. Further, one end of the TFT 523 is connected to the bit line 522 and the other end is connected to a storage capacitor (Cs) 524. This structure is similar to the pixel structure of the liquid crystal display element described in Embodiment mode 3, and is practically integrated to constitute a memory circuit as in a pixel. The present invention is extremely useful in formation of the TFT 523 and formation-of the storage capacitor 524. That is, in view of the present situation in which miniaturization of a memory is required, whereas it is a key for integration how to reduce an occupied area, as described in Embodiment 3, the storage capacitor 524 can store charges at a high density, although it is small in an occupied area.

Figure 36B:
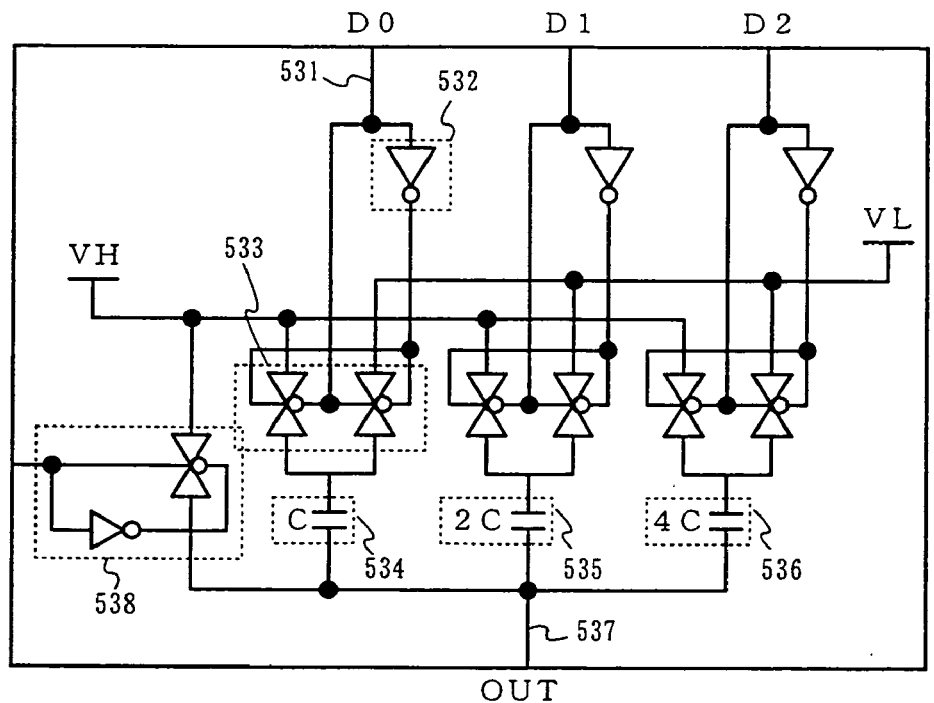

In addition, FIG. 36B shows an example of a circuit structure of the C-DAC, which has circuit structures corresponding to input lines for three bits (D0, D1, and D2). If the circuit structure for one bit is described, it has a structure in which a circuit having an inverter 532, two transfer gates 533, and a capacitive element 534 as a basic structure in association with an input line 531. In a basic circuit corresponding to these input lines for three bits, capacitive elements 534 to 536 are provided, respectively. The capacitive elements are in a relationship in which, if a capacitance of the capacitive element 534 is represented by C, a capacitance of the capacitive element 535 is represented by 2C and a capacitance of the capacitive element 536 is represented by 4C.

Further, a digital signal inputted in the respective input line of D0, D1, and D2 is finally outputted as an analog signal from an output line 537. Note that reference numeral 538 denotes a reset circuit formed by combining an inverter and a transfer gate.

In the case in which such a C-DAC circuit is formed, since the capacitive elements 534 to 536 are equal in a distance between electrodes and a dielectric constant of a dielectric body, in order to realize the relationship of C, 2C, and 4C among the capacitances, it is inevitable to increase an occupied area of the capacitive elements as a capacitance is increased. In such a case, if capacitive elements can be obtained by carrying out the present invention, a necessary and sufficient capacitance can be secured while preventing increase in an occupied area, and it becomes possible to obtain a highly integrated C-DAC circuit.

As described above, the present invention is also an extremely useful technique in a semiconductor device in which it is necessary to form a capacitive element on a substrate, in particular, in a display element having a memory using a capacitor. The present invention can be applied not only to the above-mentioned two examples but also to various forms of semiconductor devices. Note that it is possible to combine this embodiment mode with any one of the first to seventh embodiment modes. In particular, in the semiconductor device indicated in Embodiment mode 7, the present invention is extremely useful in forming a pixel portion, a drive circuit portion, and a memory portion on an identical substrate.

Embodiment Mode 13

This invention can be applied to various semiconductor devices, and the form of the display panel manufactured according to Embodiment modes 1 to 8, will be explained. In addition, as a specific example of the display panel shown in this embodiment mode, the display panel using a transistor as semiconductor elements, such as a liquid-crystal-display panel, EL (electro luminescence) display panel, and a display panel for FED (field emission display), are mentioned. Of course, these display panels include a module which is currently in the marketplace.

Figure 18:
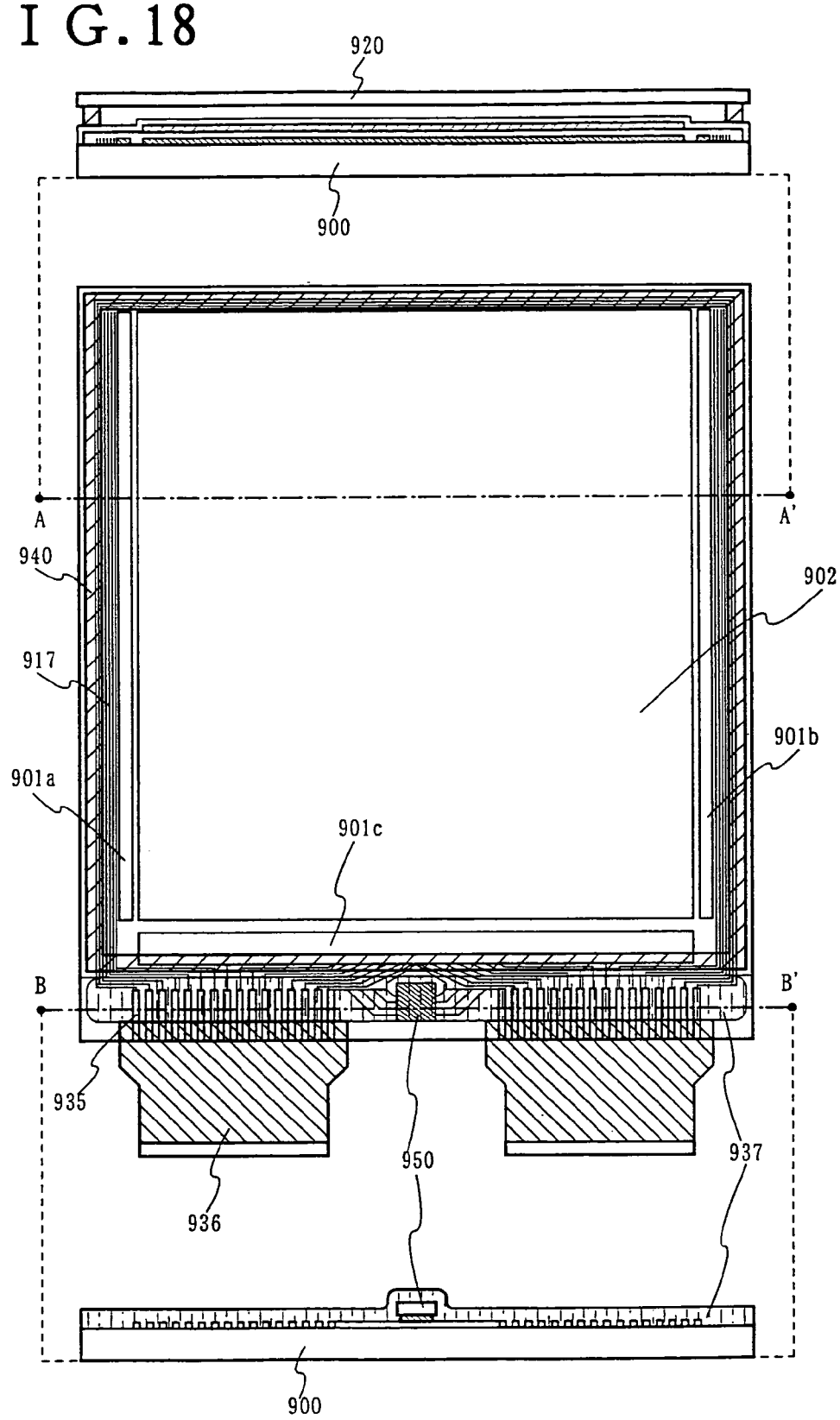
FIG. 18 is a view showing an example of an external view of a semiconductor device of the present invention.

In FIG. 18, pixel part 902, gate signal side drive circuit 901a, 901b, data signal side drive circuit 901c, input-and-output terminal part 908, and wiring, or wiring group 917 are provided on substrate 900.

Seal pattern 940 is a pattern for making sealing space between opposite substrate 920 and substrate 900, and in case of a liquid crystal display panel, liquid crystal is enclosed, and in case of an EL panel, EL materials (especially organic electro luminescence material) are protected from atmosphere. The part may overlap with the wiring or wiring group 917 which connects gate signal side drive circuit 901a, 901b, data signal side drive circuit 901c and the driver circuit portion, and an input terminal. With this arrangement, the area of the frame region (circumference region of a pixel part) of the display panel can be reduced. In an external input terminal portion, FPC (flexible print circuit) 936 is fixated.

Furthermore, chip 950 having various logic circuits, a high frequency circuit, a memory, a microprocessor, a media processor/DSP (Digital Signal Processor), LSI for graphics, Code LSI, and amplifier may be mounted using a transistor obtained by implementing the present invention. These functional circuits are formed with a different design rule from pixel portion 902, gate signal side driver circuit 901a, 901b, and data signal side drive circuit 901c, and specifically, a design rule of 1 μm or less is applied. Incidentally, it is satisfied that the external input terminal part and chip 950 are protected with resin (such as mall resin) 937. Moreover, there is no limitation in the method of mounting, and such a system using a TAB tape and a COG (chip-on glass) system can be applied.

In addition, in this embodiment mode, FIG. 13A and FIG. 13B are suitable as gate structure of a transistor. For example, the transistor shown in Embodiment modes 3 to 4 is applicable as switching elements of pixel part 902, and applicable as an active elements constituting gate signal side drive circuit 901a, 901b, and data signal side drive circuit 901c further. Of course, this embodiment mode represents an example of a display panel obtained by this invention and is not limited to the constitution of FIG. 18.

Embodiment Mode 14

In this embodiment mode, an example is shown in which a semiconductor device is produced by using a substrate having flexibility (typically, a plastic substrate or a plastic film) as a support substrate and carrying out the present invention. Note that, concerning each circuit structure formed on the substrate, it is possible to select the structure as described using FIG. 18 in Embodiment mode 13. Moreover, in addition to being thin and light in weight, the semiconductor device using the substrate having flexibility can be applied to a display, a show window, and the like having a curved surface. Thus, its application is not limited to portable elements but is manifold.

Incidentally, in the case in which a surface of a substrate is uneven, a problem is to which extent a curvature can be increased. When the curvature of the substrate is increased, due to a stress generated in an insulating film formed on the substrate, a semiconductor element formed on the insulating film cannot obtain desired characteristics. In particular, when a thickness of the insulating film is increased, this tendency is strong.

Therefore, as in this embodiment mode, in the case in which the present invention is applied to a flexible substrate, it is preferable to equalize a longitudinal direction (Y axis direction in FIG. 2A) of an insulating film extending in a linear strip pattern with a longitudinal direction of a bus on a curved surface of the substrate. Naturally, this means that, since the longitudinal direction of the bus on the curved surface of the substrate is different depending upon an application of the semiconductor device, it is preferable to use the semiconductor device taking into account the above-mentioned points in incorporating the semiconductor device in an electronic device or the like or sticking it to a show window.

FIG. 37 shows a state in which a semiconductor device produced using the substrate having flexibility by carrying out the present invention is curved. A pixel portion 602, a scanning line drive circuit 603, and a signal line drive circuit 604 are formed on a substrate 601. A material which can withstand a treatment temperature in a later process is used for the substrate 601. Representatively, it is sufficient to use polyethylene terephthalate (PET), polyethylene sulfite (PES), polycarbonate (PC), or polyethylene naphthalate (PEN). In particular, the PC is excellent in heat resistance and useful.

In the scanning line drive circuit 603 and the signal line drive circuit 604, a thin film transistor having a channel forming region, which uses a first crystalline semiconductor region obtained by carrying out the present invention, is formed in a recessed portion provided between adjacent two insulating films 605 extending in a linear stripe pattern. Further, a longitudinal direction of the insulating film 605 extending in the linear stripe pattern and a longitudinal direction of a bus on a curved surface of the substrate 601 coincide with each other in a direction indicated by an arrow. Consequently, the above-mentioned stress can be dispersed and an influence of the stress exerted on the thin film transistor can be reduced.

Note that this embodiment mode is an example of a semiconductor device and it is possible to freely combine this embodiment mode with the Embodiment modes 1 to 13 and carry it out. In addition, effects of other embodiment modes are not spoiled by the combination, and there is a significant technical meaning in carrying out the present invention on a flexible substrate on which it is difficult to form a semiconductor film with high crystallinity.

Embodiment Mode 15

Various electronic apparatus can be completed using this invention. As for examples, portable information terminals (electronic notebooks, mobile computers, cellular phones, and the like), video cameras, digital cameras, personal computers, TV sets, cellular phones, and the like are mentioned. Those examples are shown in FIGS. 19A–G. In addition, the electronic apparatus shown here is only an example, and is not limited to above.

Figure 19A:
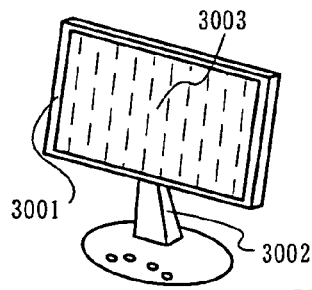
FIGS. 19A to 19G illustrate specific examples of an electronic apparatus of the present invention.

FIG. 19A is an example of a TV set which is completed by applying the present invention, which is constituted by case 3001, support stand 3002, and display portion 3003. Other than the display portion 3003, various integrated circuits such as various logic circuits, a high frequency circuit, a memory, a microprocessor, a media processor, and LSI for graphics can be formed on glass to be incorporated in the transistor of the present invention. The TV set can be completed by this means according to this invention.

Figure 19B:
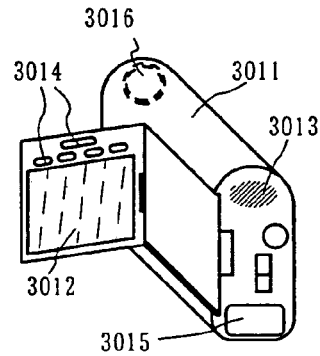

FIG. 19B is an example of a video camera which is completed by applying the present invention, which is constituted by main body 3011, display portion 3012, voice input portion 3013, operation switch 3014, battery 3015, and image receiving portion 3016. Other than the display portion 3012, various integrated circuits such as various logic circuits, a high frequency circuit, a memory, a microprocessor, a media processor, and LSI for graphics can be formed on glass to be incorporated in the transistor of the present invention. The video camera can be completed by this means according to this invention.

Figure 19C:
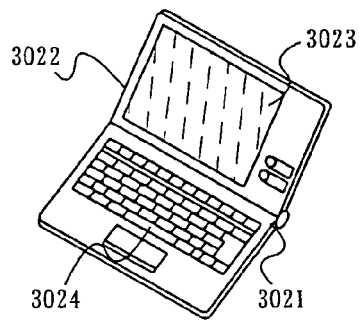

FIG. 19C is an example of a laptop computer which is completed by applying the present invention, which is constituted by main body 3021, case 3022, display portion 3023, and keyboard 3024. Other than the display portion 3023, various integrated circuits such as various logic circuits, a high frequency circuit, a memory, a microprocessor, a media processor, LSI for graphics, and Code LSI for graphics can be formed on glass to be incorporated in the transistor of the present invention. The laptop computer can be completed by this means according to this invention.

Figure 19D:
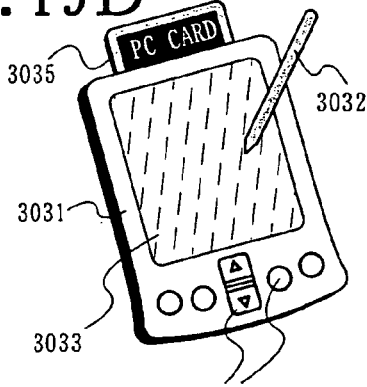

FIG. 19D is an example of PDA (Personal Digital Assistant) which is completed by applying the present invention, which is constituted by main body 3031, stylus 3032, display portion 3033, operation button 3034, and external interface 3035. Other than the display portion 3033, various integrated circuits such as various logic circuits, a high frequency circuit, a memory, a microprocessor, a media processor, LSI for graphics, and Code LSI for graphics can be formed on glass to be incorporated in the transistor of the present invention. The PDA can be completed by this means according to this invention.

Figure 19E:
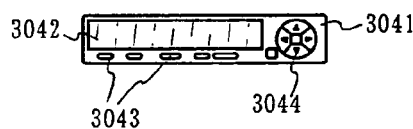

FIG. 19E is an example of a sound reproduction apparatus which is completed by applying the present invention, which is constituted by main body 3041, display portion 3042, operation switches 3043 and 3044. Other than the display portion 3042, various integrated circuits such as various logic circuits, a high frequency circuit, a memory, a microprocessor, a media processor, LSI for graphics, and an amplification circuit for graphics can be formed on glass to be incorporated in the transistor of the present invention. The sound reproduction apparatus can be completed by this means according to this invention.

Figure 19F:
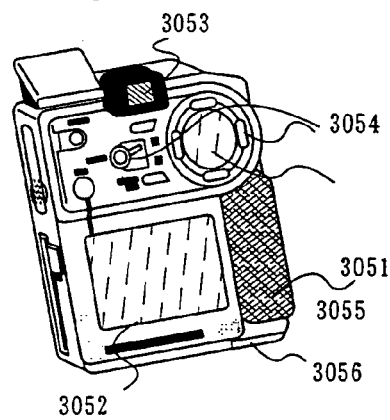

FIG. 19F is an example of a digital camera which is completed by applying the present invention, which is constituted by main body 3051, display portion A 3052, eyepiece portion 3053, operation switch 3054, display part B 3055, and battery 3056. Other than the display portions A 3052, B 3055, various integrated circuits such as various logic circuits, a high frequency circuit, a memory, a microprocessor, a media processor, LSI for graphics, and Code LSI can be formed on glass to be incorporated in the transistor of the present invention. The digital camera can be completed by this means according to this invention.

Figure 19G:
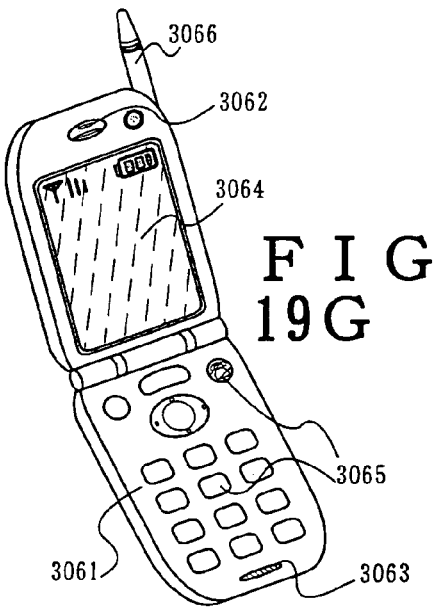

FIG. 19G is an example of a cellular phone which is completed by applying the present invention, and constituted by main portion 3061, voice output portion 3062, voice input portion 3063, display portion 3064, operation switch 3065, and antenna 3066. Other than the display portions 3064, various integrated circuits such as various logic circuits, a high frequency circuit, a memory, a microprocessor, a media processor, LSI for graphics, Code LSI, and LSI for cellular phone can be formed on glass to be incorporated in the transistor of the present invention. The cellular phone can be completed by this means according to this invention.

Embodiment Mode 16

The constitution of a laser irradiation device used in this embodiment mode will be described with reference to FIG. 20. Reference numeral 11 is a laser oscillation device. In addition, although two sets of laser oscillation devices are used in FIG. 21, the laser oscillation device may not be limited to this number of the sets, but three sets or four sets, or more may be used.

Also, the temperature of laser oscillation device 11 may be kept constant by using chiller 12. The chiller 12 is not necessarily formed though, it is possible to prevent to vary the outputted energy of laser beams according to variations in temperature by keeping the temperature of laser oscillation device 11 constant.

Also, reference numeral 14 is an optical system, and can change a light path outputted from laser oscillation device 11, or can condense laser beams by processing the form of the laser beams. Furthermore, the laser beams outputted by the optical system 14 from pluralities of laser oscillation devices 11 is synthesized by partially overlapping mutually in the laser irradiation device of FIG. 20.

In addition, AO modulator 13 which can primarily shield laser beams completely may be formed in a light path between processing substrate 16 and laser oscillation device 11. Moreover, instead of AO modulator, attenuator (light intensity correction filter) may be formed to adjust the energy density of laser beams.

Moreover, measuring means 20 (energy density measurement means) to measure the energy density of laser beams outputted from laser oscillation device 11 may be formed in the light path between the processing substrate 16 and the laser oscillation device 11 in order to supervise the variation per hour of energy density by computer 10. In this case, output from the laser oscillation device 10 may be heightened so that attenuation of the energy density of the laser beams may be compensated.

The synthesized laser beams are irradiated onto substrate 16, which is an object, through slit 15. Slit 15 is capable of interrupting the laser beams and preferably formed out of the material resistant to transformation or damage by the laser beams. And a width of the slit of the slit 15 is variable and the width of the laser beams can be changed according to a width the slit.

In addition, the form of the laser beams in substrate 16 which is oscillated from laser oscillation device 11 in case of not passing through slit 15 is different according to the kind of laser, or can be formed by optical system.

Substrate 16 is laid on stage 17. In FIG. 20, position control means 18 and 19 are equivalent to control means to control the position of laser beams in an object, and the position of stage 17 is controlled by the position control means 18 and 19. In FIG. 20, the position control means 18 performs position control of the position of the stage 17 in the X direction, and the position control means 19 performs position control of the stage 17 in the Y direction.

Figure 20:
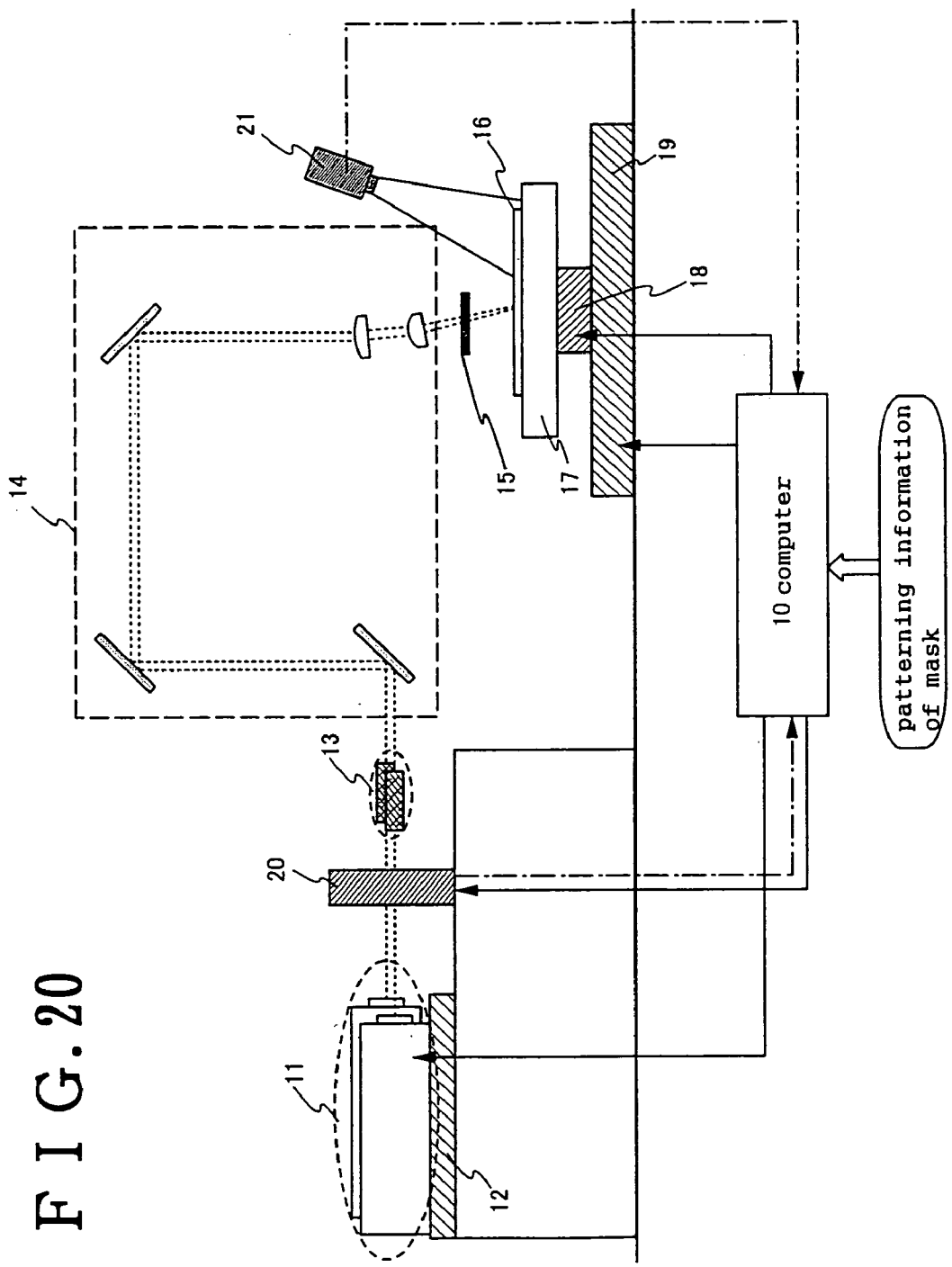
FIG. 20 is a diagram showing a laser irradiation apparatus used in carrying out the present invention.
Figure 22A:
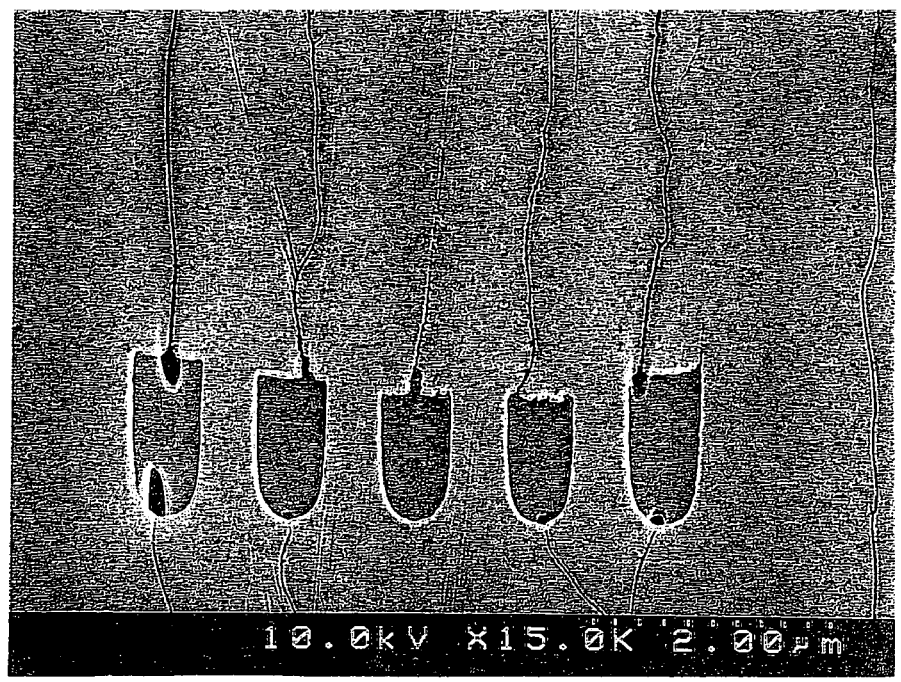
FIG. 22A is a TEM photograph of an observation of an upper surface after secondary etching of a crystalline silicon film obtained by carrying out the present invention.
Figure 22B:
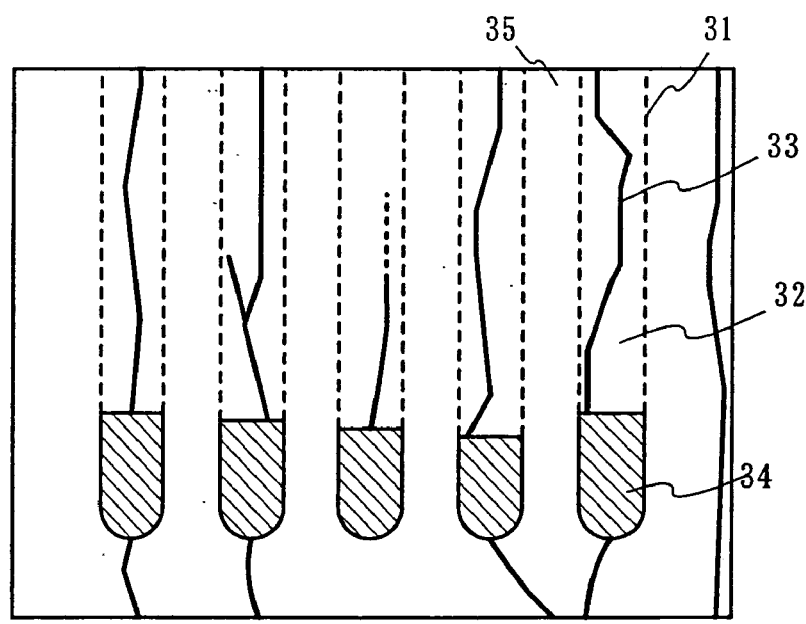
FIG. 22B is a schematic view of the observation of the upper surface after secondary etching of the crystalline silicon film obtained by carrying out the present invention.

Also, a laser irradiation device of FIG. 20 includes computer 10 having memory means such as a memory and central processing units. The computer 10 can control the oscillation of laser oscillation device 151, define the scanning course of laser beams, and further, move the substrate to the predetermined position by controlling control means 18 and 19 to be scanned according to the predetermined scanning course.

In addition, the position of a laser beam is controlled by moving a substrate in FIG. 20, but the movement may be carried out using optical systems, such as galvanometer mirror, or the both of them may be used.

Furthermore, in FIG. 20, the width of slit 15 can be controlled by computer 10, and the width of a laser beam can be changed according to the pattern information on a mask. In addition, the slit is not necessarily formed.

Furthermore, laser irradiation device may be equipped with means of adjusting the temperature of an object. Also, since laser beams has directivity and high energy density, a damper may be formed to prevent reflecting light from irradiating onto an unsuitable area. It is preferable that damper has a function of absorption of reflecting light. In addition, cooling water may be circulated in a damper to prevent the temperature of a bank from rising by absorbing of reflecting light. Moreover, heating means (substrate heating means) for heating a substrate may be formed in stage 157.

In addition, when a marker is formed by laser, a laser oscillation device for markers may be provided. In this case, oscillation of the laser oscillation device for markers may be controlled by computer 10. Furthermore, when the laser oscillation device for markers is provided, the optical system for condensing the laser beams outputted from the laser oscillation device for markers is provided separately. In addition, as for the laser used when the marker is formed, such as YAG laser and $CO_2$ laser are mentioned typically. However, the other lasers can also be used for making a marker, of course.

Moreover, for alignment by use of a marker, one set of CCD camera 21, or several CCD cameras depending as circumstances demand, may be provided. Incidentally, a CCD camera means the camera using CCD (charge coupled device) as an image sensor. Moreover, without establishing a marker, pattern of an insulating film or a semiconductor film is recognized by CCD camera 21 and alignment of the substrate may be performed. In this case, pattern information on an insulating film by the mask inputted into the computer 10 and a semiconductor film and the pattern information on the actual insulating film collected in CCD camera 21 or a semiconductor film can be tested by comparison, and the position information on a substrate can be grasped. In this case, the marker is not necessarily established separately.

In addition, the incident laser beam to the substrate is reflected on the substrate surface, and become so-called a return beam that returns to the same path. The return beam have negative effects such as outputting of laser beam, variation of frequency, and rods destruction. Therefore, an isolator may be installed in order to remove the return light and to stabilize the oscillation of laser.

In addition, the constitution of a laser irradiation device having pluralities of laser oscillation device formed therein is shown in FIG. 20. The constitution described above has merit that the designing of an optical system becomes easy. When an amorphous semiconductor film is melted, it is preferable to use linear laser beams especially from a viewpoint of the improvement in a throughput. However, if the longitudinal direction (X-axis direction in FIG. 3) becomes long, the optical design becomes very precise. Therefore, the burden of an optical design can be mitigated by using pluralities of linear laser beams in an overlapped manner.

For example, one linear laser beam can be formed by optically compounding pluralities of laser beams oscillated from pluralities of laser oscillation devices. FIG. 21A is a view showing the irradiation section of each laser beam. The case where the irradiation region of laser beams serves as ellipse form is mentioned as the example here. However, there is no difference in forms.

The form of laser beams is varied according to the kinds of laser, and can be formed by the optical system also. For example, the form of the laser beams ejected from the XeCl excimer laser L3308, product of Ramda Co. LTD. (wavelength of 308 nm and pulse width of 30 ns) presents the short form of 10 nm×30 nm (half-the-price width in both beam profiles). Also, the form of the laser beam ejected from YAG laser becomes circular if rod is formed in cylinder, and if it is a slab type, it presents short form. The laser beam of a desired size can also be formed by fabricating such a laser beam further by the optical system.

The distribution of the energy density of the laser beam in the longitudinal direction of laser beams (X-axis direction) shown in FIG. 21A is shown in FIG. 21B. The laser beam shown in FIG. 21A is equivalent to the region where $1/e^2$ of energy density of peak value in FIG. 21B is satisfied. The distribution of the energy density of the ellipse-shaped laser beam is increased as becoming closer to the center O of the ellipse. Thus, energy density of the laser beams shown in FIG. 21A in the direction of a main axis follows Gaussian distribution, and the region as judged to be uniform in energy density becomes narrow.

Next, an irradiation section form of the linear laser beam that is constituted by synthesizing two laser beams of FIG. 21A is shown in FIG. 21C. In addition, FIG. 21C shows the case that one linear laser beam is formed by overlapping two laser beams with each other. The number of the laser beam to be overlapped is not limited thereto.

As shown in FIG. 21C, each laser beam is matched in the long axis of each ellipse, and synthesized by being overlapped in part of laser beams, and one linear laser beam 30 can be produced. Hereinafter, the straight line obtained by connecting the center O of each ellipse is set as the main axis of the laser beam 30.

The distribution of the energy density in the main axis y direction of the linear laser beam after synthesis shown in FIG. 21C is shown in FIG. 21D. In addition, the laser beam shown in FIG. 21C is equivalent to the region where $1/e^2$ of energy density of peak value in FIG. 21B is satisfied. Energy density is added in the portion where each laser beam before synthesis is overlapped. For example, if the energy densities L1 and L2 of the energy light of the overlapped laser beams are added as shown in the figure, it becomes almost equal to the peak value L3 of the energy density of each laser beam, and flattening of the energy density is occurred between the centers O of each ellipse.

In addition, it is ideal to become equal to L3 if L1 and L2 are added. However, in practice, it does not necessarily become an equal value. The tolerance level of a gap of the value adding L1 and L2 and the value L3 can be suitably set up by the designer.

If laser light is used independently, since energy density is compliant with Gaussian distribution, it is difficult to irradiate the laser of uniform energy density onto the whole semiconductor film which is in contact with the flat portion of an insulating film. However, as shown in FIG. 21D, by overlapping pluralities of laser beams and compensating a part where energy density is lower, the region with uniform energy density is expanded so as to raise the crystallinity of a semiconductor film efficiently compared with the case where pluralities of laser beams are not used in an overlapping manner, but used independently.

In addition, as for the distribution of energy density, B—B' is smaller than C–C' a little bit. However, B—B' and C–C' can be considered to be almost the same sizes. And the form of the laser beam synthesized in the region with energy density of the $1/e^2$ of the peak value of the laser beam before synthesis can be said as linear.

In addition, the region having low energy density exists in the neighborhood of outer edge of the irradiation region of the synthesized linear laser beam 30. Since crystallinity may be spoiled on the contrary if this region is used, it is preferable not to use the outer edge of the linear laser beam, as FIG. 21 in which slit 15 is used.

The laser irradiation device described in this embodiment mode can be used when laser beam irradiation of this invention is implemented. It can be adapted for either of Embodiment modes 1 to 10. Moreover, even if linear laser beams have advantages, there arises a problem of increasing the cost of the optical system or laser oscillation apparatus. If desired linear laser beam can be obtained in one set of laser oscillation apparatus and optical system, it is not a cause for using such laser irradiation device.

Embodiment 1

A crystalline semiconductor film obtained by implementing this invention is shown in this embodiment. In addition, since the crystallization process was performed according to Embodiment modes 2 and 3, this embodiment mode is described with reference to FIGS. 6A to 8E.

In this embodiment mode, a silicon nitride oxide film with thickness of 50 nm was used as first insulating film 302 in FIGS. 6A–D, and a silicon oxynitride film with thickness of 200 nm was used as second insulating film 303. In this case, since the first insulating film 302 of a base film was subjected to etching when the second insulating film 303 was also subjected to etching, resulting in obtaining the height of 250 nm equivalent to the level difference d shown FIG. 1. Moreover, width of the second insulating film 303 (it is equivalent to W1 in FIG. 1) was set to 0.5 μm, and distance between contiguity (it is equivalent to W2 in FIG. 1) was set to 0.5 μm.

Moreover, after a silicon oxynitride film with thickness of 20 nm is formed as the third insulating film 305 on the second insulating film 303, an amorphous silicon film with thickness of 150 nm was continuously formed as amorphous semiconductor film 306, without releasing in atmosphere. Moreover, the amorphous silicon film was crystallized using the crystallization technology of Embodiment mode 2. Specifically, with 10 ppm acetic acid nickel solution held on the amorphous silicon film, 550° C. heat treatment for 4 hours is conducted to obtain crystallization, before linear laser beams are irradiated. $YVO_4$ laser oscillation apparatus of continuous oscillation mode is used for the linear laser beams, and output 5.5 W of the second harmonics (wavelength of 532 nm) is condensed in an optical system, to be scanned at a rate of room temperature 50 cm/sec.

FIG. 25A is a TEM (transmission type electron microscope) photograph in the state (state shown in FIGS. 8A–E) where the crystalline silicon film 307 is formed, and FIG. 25B is a schematic diagram of the same. Laminates of first insulating film 302 and second insulating film 303 exists in the state where it is buried completely under crystalline silicon film 307.

Figure 26A:
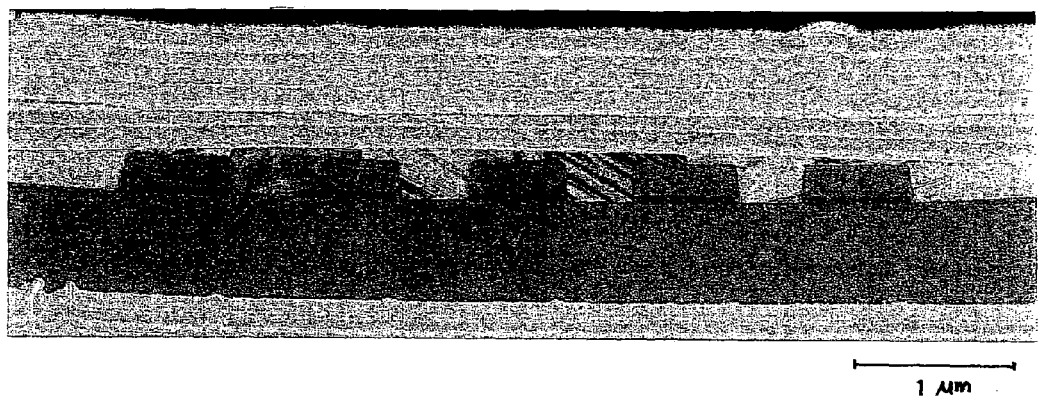
FIG. 26A is a TEM photograph of the observation of a section of a crystalline silicon film obtained by carrying out the present invention.
Figure 26B:
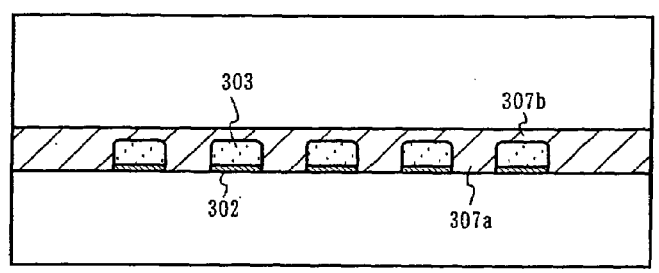
FIG. 26B is a schematic view of the observation of the section of the crystalline silicon film obtained by carrying out the present invention.

FIG. 26A is a cross-sectional TEM photograph observing the section of FIG. 25A, and FIG. 26B is a schematic diagram of the same. On the second insulating film 303 (depressions) formed in stripe pattern, crystalline silicon film 307a is formed so that it may be filled up. And crystalline silicon film 307b is formed on the upper surface part (projections) of the second insulating film 303.

Figure 27A:
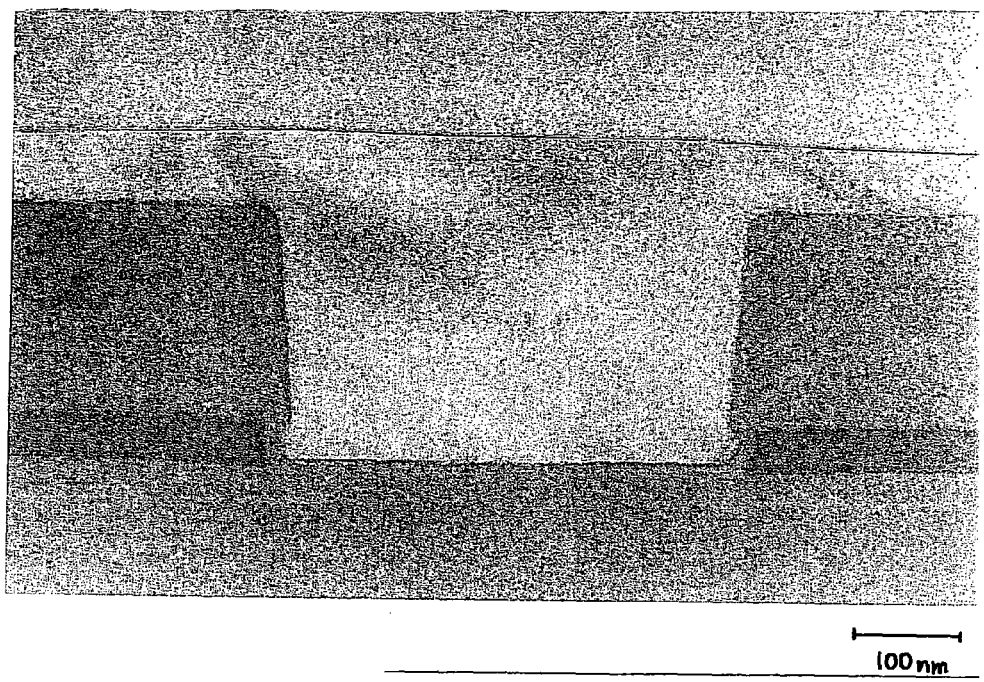
FIG. 27A is a TEM photograph of an observation of a section of a crystalline silicon film obtained by carrying out the present invention.
Figure 27B:
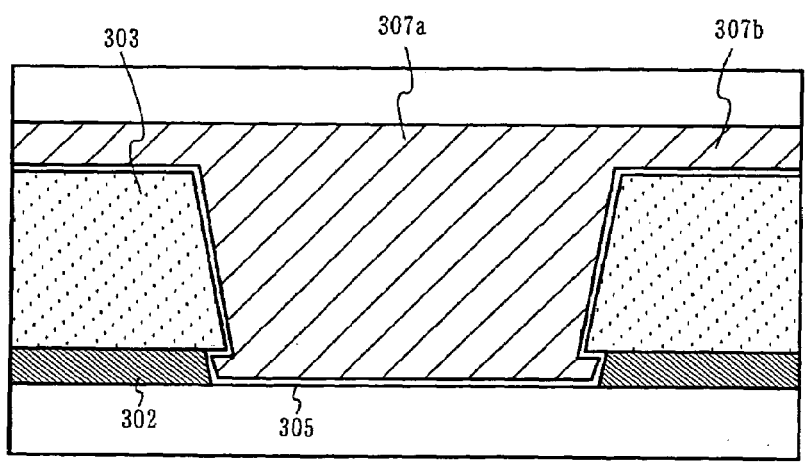
FIG. 27B is a schematic view of the observation of the section of the crystalline silicon film obtained by carrying out the present invention.
Figure 28A:
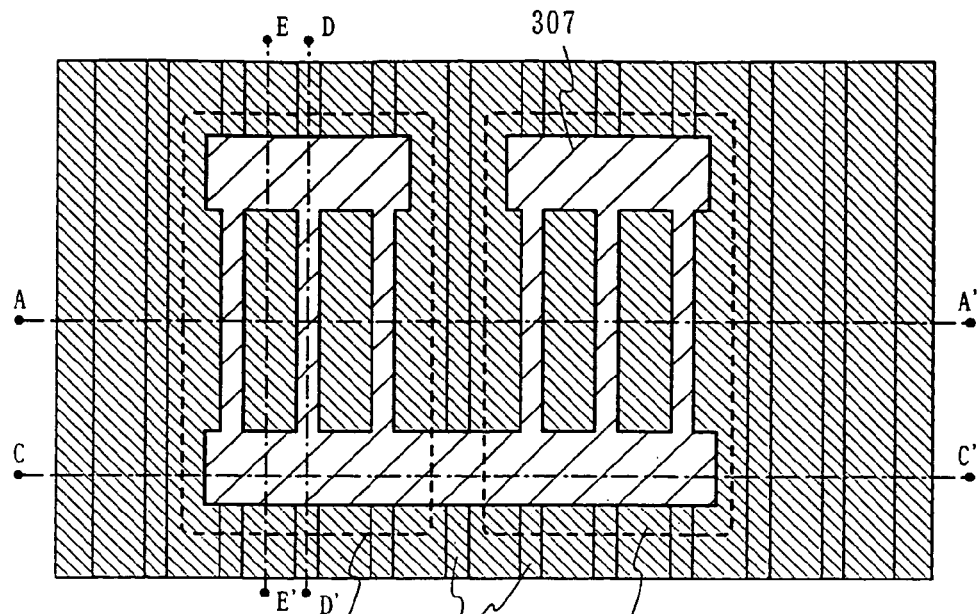
FIG. 28A is a plan view illustrating the producing process of the transistor of the present invention.
Figure 28B:
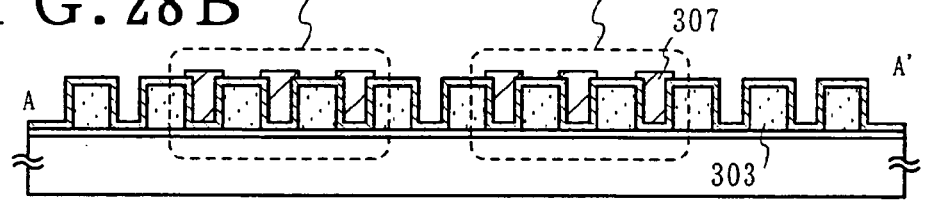
FIGS. 28B to 28E are longitudinal sectional views illustrating the producing process of the transistor of the present invention.
Figure 28C:
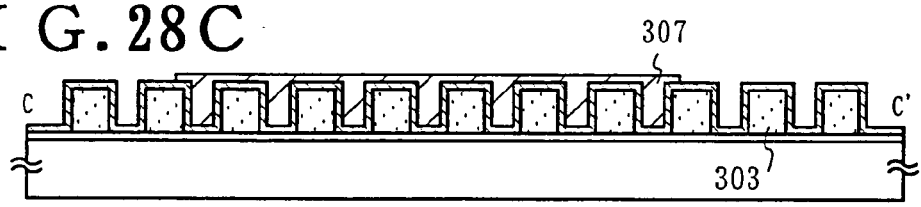
Figure 28D:
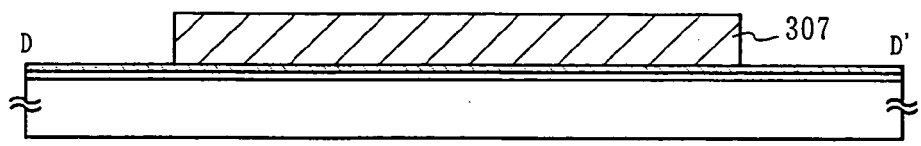
Figure 28E:
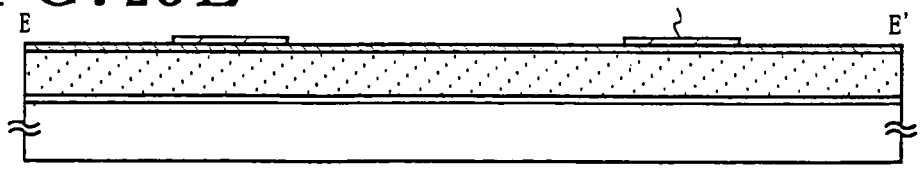

FIG. 27A is a cross-sectional TEM photograph performing maginificating observation of the section of FIG. 26A, and FIG. 27B is a schematic diagram of the same. Third insulating film 305 is observed by this photograph. Neither crystal boundary nor defects-like things can be observed inside crystalline silicon film 307a. This shows a very high crystallinity.

The present invention provides a semiconductor device wherein crystalline silicon film 307a with a good crystallinity is used as a channel formation region, and by using crystalline silicon film 307b with inferior crystallinity positively as an electrode or wiring, high-speed operation is possible, and a thin film transistor with little variations in pluralities of elements or this thin film transistor group can be accumulated at high degree of accumulation.

Embodiment 2

In this embodiment, an example will be described in which, in forming the second insulating films 103 to 105 shown in FIGS. 1A–B, an insulating film equivalent to a first insulating film is formed on the second insulating films 103 to 105 using a glass substrate as an etching stopper.

In FIG. 39, first, second insulating films 853 to 855 are formed of silicon oxide or silicon oxide nitride with a thickness of 10 to 3000 nm, preferably 100 to 2000 nm in a linear stripe pattern on a glass substrate 851. Details are the same as Embodiment mode 1. As a method of etching, etching using buffer fluoric acid or dry etching using $CHF_3$ is adopted. In this embodiment, the dry etching using a $CHF_3$ gas is adopted. In this case, it is sufficient that a gas flow amount is 30 to 40 sccm, a reactive pressure is 2.7 to 4.0 Kpa, an applied power is 500 W, and a substrate temperature is 20° C.

In addition, in the case of this embodiment, as the glass substrate 851, it is preferable to use a material with a high selection ratio between the material and the second insulating film (silicon oxide film) (e.g., 1737 glass substrate manufactured by Corning Corporation). This is because the glass substrate 851 can be used as an etching stopper when the second insulating films 853 to 855 are formed if the selection ratio is high.

Then, when the second insulating films 853 to 855 have been formed, they are covered by a first insulating film 852 including silicon nitride, silicon oxide nitride, silicon nitride oxide, or a laminated film of them, and an amorphous semiconductor film 856 is formed thereon. This state is shown in FIG. 39B. In this embodiment, a silicon nitride oxide film and a silicon oxide nitride film are laminated as a first insulting film on the second insulating films, and the amorphous semiconductor film is formed thereon. Concerning details of the first insulating film 852 and the amorphous semiconductor film 856, it is sufficient to refer to the description of the first embodiment mode. In addition, since processes of FIG. 39B and subsequent figures only have to follow those of Embodiment mode 1, descriptions of the processes will be omitted here.

According to this embodiment, since it is possible to increase a selection ratio between the glass substrate 851 and the second insulating films 853 to 855 sufficiently, a process margin in forming the second insulating films 853 to 855 in a linear stripe pattern is improved. In addition, a problem such as cutting in lower ends of the second insulating films 853 to 855 never occurs and planarity is also improved.

Embodiment 3

In this embodiment, an example will be described in which, in forming the second insulating films 103 to 105 shown in FIGS. 1A–B, the second insulating films 103 to 105 cover a glass substrate and an insulting film equivalent to a first insulating film is formed thereon.

Figure 38A:
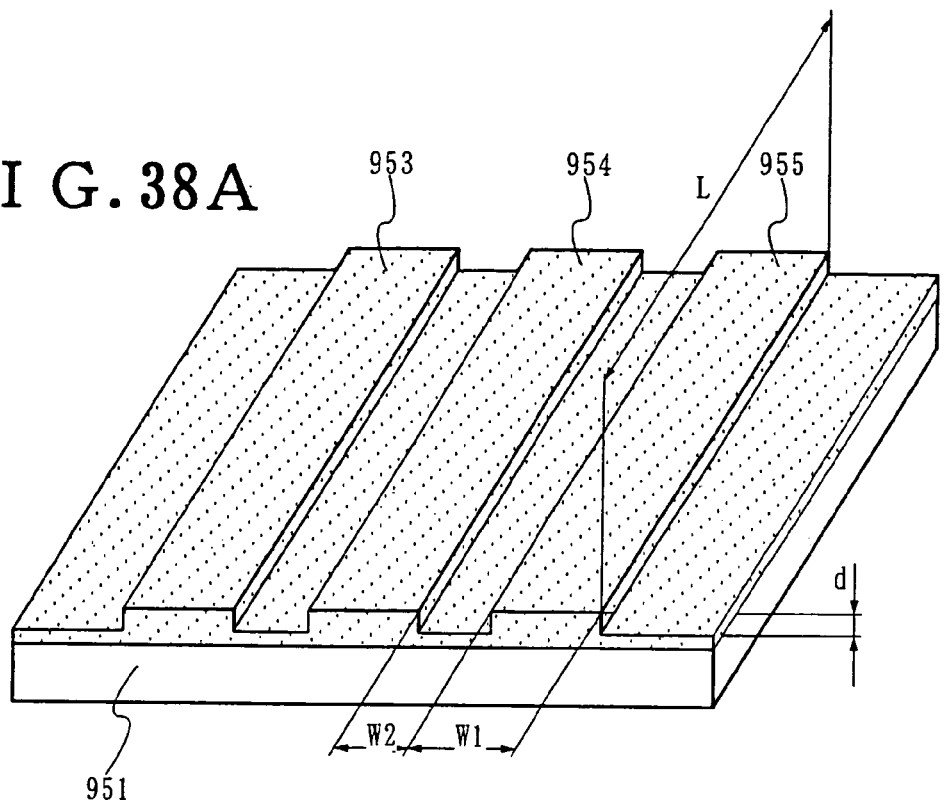
FIGS. 38A and 38B are perspective views illustrating a crystallization method of the present invention.
Figure 38B:
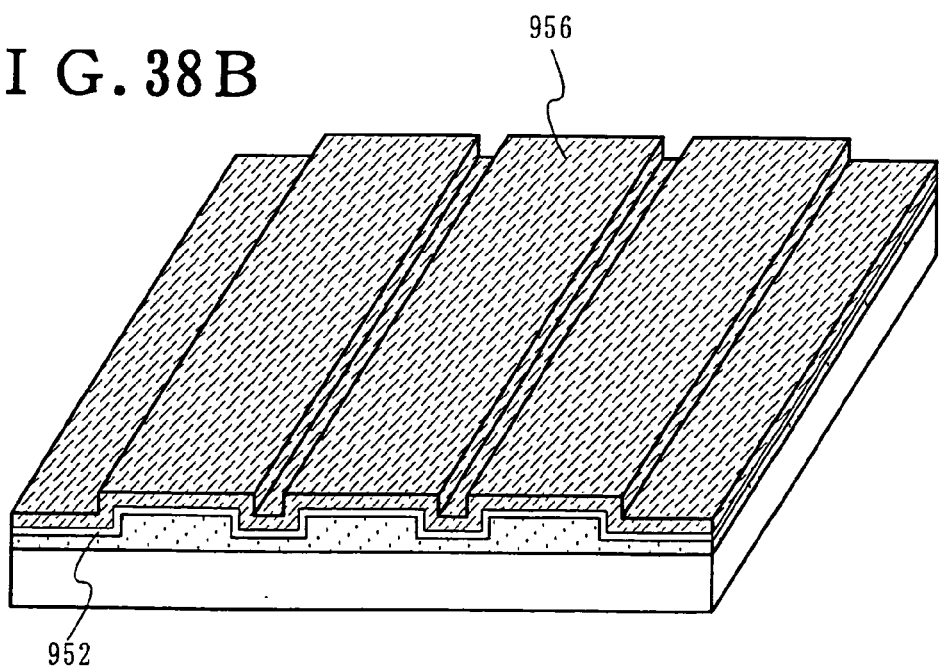

In FIGS. 38A–B, first, second insulating films 953 to 955 are formed of silicon oxide or silicon oxide nitride with a thickness of 10 to 3000 nm, preferably 100 to 2000 nm on a glass substrate 951. Then, the second insulating films are formed in a linear strip pattern on the glass substrate. At this point, the second insulating films are not etched to reach the glass substrate but etched with a certain thickness left on the glass substrate. Details are the same as the embodiment mode 1. As a method of etching, etching using buffer fluoric acid or dry etching using $CHF_3$ is adopted. In this embodiment, the dry etching using a $GHF_3$ gas is adopted. In this case, it is sufficient that a gas flow amount is 30 to 40 sccm, a reactive pressure is 2.7 to 4.0 Kpa, an applied power is 500 W, and a substrate temperature is 20° C.

Then, when the second insulating films 953 to 955 have been formed, they are covered by a first insulating film 952 including silicon nitride, silicon oxide nitride, silicon nitride oxide, or a laminated film of them, and an amorphous semiconductor film 956 is formed thereon. This state is shown in FIG. 38B. In this embodiment, a silicon nitride oxide film and a silicon oxide nitride film are laminated as a first insulting film on the second insulating films, and the amorphous semiconductor film is formed thereon. Concerning details of the first insulating film 952 and the amorphous semiconductor film 956, it is sufficient to refer to the description of Embodiment mode 1. In addition, since processes of FIG. 38B and subsequent figures only have to follow those of Embodiment mode 1, descriptions of the processes will be omitted here.

According to this embodiment, since the glass substrate 951 is covered by the second insulating films 953 to 955, a blocking effect against sodium (Na) can be expected of the second insulating films such as silicon oxide nitride film, which is effective as a countermeasure for contamination due to the glass substrate.

As described above, a linear stripe pattern having an uneven shape is formed with an insulting film, and an amorphous semiconductor film is deposited thereon and crystallized through a fused state by irradiation of a laser beam, whereby a semiconductor is flown into a recessed portion to be solidified. Consequently, distortion or a stress following crystallization can be concentrated in regions other than the recessed portion, and it becomes possible to selectively form a region with poor crystallinity such as a grain boundary.

Further, a crystalline semiconductor film without a grain boundary can be formed designating a place of a semiconductor element such as a transistor, in particular, a channel forming region thereof. Consequently, factors of fluctuation of characteristics due to a grain boundary and a crystal defect to be carelessly intervened can be eliminated, and a transistor or a group of transistor elements with small fluctuation of characteristics can be formed.

As described above, the present invention uses a crystalline semiconductor film with high crystallinity as a channel forming region and uses a crystalline semiconductor film with poor crystallinity as an electrode or wiring actively. Consequently, the present invention can provide a semiconductor device, which is constituted by integrating with high integration density a semiconductor element or a group of semiconductor elements capable of operating at a high speed and high in electric current drive capability and having small fluctuation among plural elements.

Moreover, it is possible to form a semiconductor element capable of operating at a high speed and high in electric current drive capability and having small fluctuation among plural elements and, at the same time, form a storage capacitor having charge holding capability of high density with a small occupied area. Therefore, in a semiconductor device in which it is necessary to use a capacitive element, it is possible to realize effects such as improvement of an integration density in a memory and improvement of an effective display region in a pixel portion.

What is claimed is:

1. A TV set comprising:
a display portion comprising:
first plural insulating linear stripe patterns over a substrate;
second plural insulating linear stripe patterns over said substrate;
a source region provided over and astride said first plural insulating linear stripe patterns;
a drain region provided over and astride said second plural insulating linear stripe patterns; and
plural channel formation regions provided between said source region and said drain region over the substrate,
wherein each of said plural channel formation regions is a first part of plural first crystalline semiconductor regions,
wherein each of said source and said drain regions comprises a second part of said plural first crystalline semiconductor regions and a second crystalline semiconductor region,
wherein said first part of the plural first crystalline semiconductor regions extends in parallel with said first and said second plural insulating linear stripe patterns,
wherein a growth direction of crystal and a channel length direction in each of said plural channel formation regions are matched, and
wherein each of said source and said drain regions has a leveled upper surface.

2. A TV set according to claim 1, wherein each of said first crystalline semiconductor regions includes one crystal orientation.

3. A TV set according to claim 1, wherein each of said first crystalline semiconductor regions does not have a grain boundary practically.

4. A TV set according to claim 1, wherein an insulating film is formed between said first and said second plural insulating linear stripe patterns and the substrate.

5. A TV set according to claim 1, wherein a width of each of said first and said second plural insulating linear stripe patterns is 0.1 to 10 µm, an interval of each of said first and said second plural insulating linear stripe patterns is 0.01 to 2 µm, and a thickness of each of said first and said second plural insulating linear stripe patterns is 0.01 to 3 µm.

6. A digital camera comprising:
a main body;
an operation switch; and
a display portion comprising:
first plural insulating linear stripe patterns over a substrate;
second plural insulating linear stripe patterns over said substrate;
a source region provided over and astride said first plural insulating linear stripe patterns;
a drain region provided over and astride said second plural insulating linear stripe patterns; and
plural channel formation regions provided between said source region and said drain region over the substrate,
wherein each of said plural channel formation regions is a first part of plural first crystalline semiconductor regions,
wherein each of said source and said drain regions comprises a second part of said plural first crystalline semiconductor regions and a second crystalline semiconductor region,
wherein a growth direction of crystal and a channel length direction in each of said plural channel formation regions are matched, and
wherein each of said source and said drain regions has a leveled upper surface.

7. A digital camera according to claim 6, wherein each of said plural first crystalline semiconductor regions includes one crystal orientation.

8. A digital camera according to claim 6, wherein each of said first crystalline semiconductor regions does not have a grain boundary practically.

9. A digital camera according to claim 6, wherein an insulating film is formed between the first and the second plural insulating linear stripe patterns and the substrate.

10. A digital camera according to claim 6, wherein a width of each of said first and said second plural insulating linear stripe patterns is 0.1 to 10 µm, an interval of each of said first and said second plural insulating linear stripe patterns is 0.01 to 2 µm, and a thickness of each of said first and said second plural insulating linear stripe patterns is 0.01 to 3 µm.

11. A semiconductor element comprising:
first plural insulating linear stripe patterns over a substrate;
second plural insulating linear stripe patterns over said substrate;

a source region provided over and astride said first plural insulating linear stripe patterns;

a drain region provided over and astride said second plural insulating linear stripe patterns; and plural channel formation regions provided between said source region and said drain region over the substrate, wherein each of said plural channel formation regions is a first part of plural first crystalline semiconductor regions, wherein each of said source and said drain regions comprises a second part of said plural first crystalline semiconductor regions and a second crystalline semiconductor region, wherein a width of each of said first and said second plural insulating linear stripe patterns is 0.1 to 10 µm, an interval of each of said first and said second plural insulating linear stripe patterns is 0.01 to 2 µm, and a thickness of each of said first and said second plural insulating linear stripe patterns is 0.01 to 3 µm, wherein a growth direction of crystal and a channel length direction in each of said plural channel formation regions are matched, and wherein each of said source and said drain regions has a leveled upper surface.

12. A semiconductor element according to claim 11, wherein each of said plural first crystalline semiconductor regions includes one crystal orientation.

13. A semiconductor element according to claim 11, wherein each of said plural first crystalline semiconductor regions does not have a grain boundary practically.

14. A semiconductor element according to claim 11, wherein an insulating film is formed between said first and said second plural insulating linear stripe patterns and the substrate.

15. An electronic device having the semiconductor element according to claim 11, wherein said electronic device is selected from the group consisting of a TV set, a video camera, a lap-top computer, a personal digital assistant, a sound reproduction apparatus, a digital camera, and a cellular phone.

16. A semiconductor element comprising:

first plural insulating linear stripe patterns over a substrate;

second plural insulating linear stripe patterns over said substrate;

a source region provided over and astride said first plural insulating linear stripe patterns;

a drain region provided over and astride said second plural insulating linear stripe patterns; and plural channel formation regions provided between said source region and said drain region over the substrate, wherein a growth direction of crystal and a channel length direction in each of said plural channel formation regions are matched, and wherein each of said source and said drain regions has a leveled upper surface.

17. A semiconductor element according to claim 16, wherein each of said plural channel formation regions is a first part of plural first crystalline semiconductor regions, and wherein each of said pair of source region and drain region comprises a second part of said plural first crystalline semiconductor regions and a second crystalline semiconductor region.

18. A semiconductor element according to claim 16, wherein each of said plural first crystalline semiconductor regions includes one crystal orientation.

19. A semiconductor element according to claim 16, wherein each of said first crystalline semiconductor regions does not have a grain boundary practically.

20. A semiconductor element according to claim 16, wherein an insulating film is formed between said first and said second plural insulating linear stripe patterns and the substrate.

21. A semiconductor element according to claim 16, wherein a width of each of said first and said second plural insulating linear stripe patterns is 0.1 to 10 µm, an interval of each of said first and said second plural insulating linear stripe patterns is 0.01 to 2 µm, and a thickness of each of said first and said second plural insulating linear stripe patterns is 0.01 to 3 µm.

22. A semiconductor device comprising an integrated circuit, said integrated circuit having the semiconductor element according to claim 16.

23. An electronic device having the semiconductor element according to claim 16, wherein said electronic device is selected from the group consisting of a TV set, a video camera, a lap-top computer, a personal digital assistant, a sound reproduction apparatus, a digital camera, and a cellular phone.

24. A semiconductor element comprising:

first plural insulating linear stripe patterns over a flexible substrate;

second plural insulating linear stripe patterns over said substrate;

a source region provided over and astride said first plural insulating linear stripe patterns;

a drain region provided over and astride said second plural insulating linear stripe patterns; and plural channel formation regions provided between said source region and said drain region over the flexible substrate, wherein a channel length direction of each of said plural channel formation regions coincides with a direction of a crystal growth, and wherein each of said source and said drain regions has a leveled upper surface.

25. A semiconductor element according to claim 24, wherein each of said plural channel formation regions is a first part of plural first crystalline semiconductor regions, and wherein each of said source and said drain regions comprises a second part of said plural first crystalline semiconductor regions and a second crystalline semiconductor region.

26. A semiconductor element according to claim 24, wherein each of said plural first crystalline semiconductor regions includes one crystal orientation.

27. A semiconductor element according to claim 24, wherein each of said first crystalline semiconductor regions does not have a grain boundary practically.

28. A semiconductor element according to claim 24, wherein an insulating film is provided between said first and said second plural insulating linear stripe patterns and the flexible substrate.

29. A semiconductor element according to claim 24, wherein a width of each of said first and said second plural insulating linear stripe patterns is 0.1 to 10 µm, an interval of each of said first and said second plural insulating linear stripe patterns is 0.01 to 2 µm, and a thickness of each of said first and said second plural insulating linear stripe patterns is 0.01 to 3 µm.

30. A semiconductor device comprising an integrated circuit, said integrated circuit having the semiconductor element according to claim 24.

31. An electronic device having the semiconductor element according to claim 24, wherein said electronic device is selected from the group consisting of a TV set, a video camera, a lap-top computer, a personal digital assistant, a sound reproduction apparatus, a digital camera, and a cellular phone.

32. A semiconductor element according to claim 24, wherein a longitudinal direction of each of said first and said second plural insulating linear stripe patterns and the longitudinal direction of a bus on a curved surface of the flexible substrate are equalized.

33. A semiconductor device comprising:
a flexible substrate,
a semiconductor film formed over the flexible substrate and comprising a source region, a drain region, and channel formation regions formed therebetween, each of the channel formation regions is parallel to each other,
a gate electrode formed over the channel formation regions, and
wherein a growth direction of the semiconductor film and a channel length direction in each of the channel formation regions are matched, and
wherein each of the source and the drain regions has a leveled upper surface,
wherein the semiconductor film comprises first crystalline regions and second crystalline regions formed over the first crystalline regions,
wherein each of the first crystalline semiconductor regions comprises one of the channel formation regions, and
wherein one of second crystalline semiconductor regions comprises the source region, and the other of second crystalline semiconductor regions comprises the drain region.

34. A semiconductor device according to claim 33, wherein each of the channel formation regions is connected to the source region and the drain region.

35. A semiconductor device according to claim 33, wherein each of the first crystalline regions is separated by first and second plural insulating linear stripe patterns made with insulating films.

36. A semiconductor device according to claim 35, wherein a longitudinal direction of each of the first and the second plural insulating linear stripe patterns and the longitudinal direction of a bus on a curved surface of the flexible substrate are equalized.

* * * * *